US012717232B2

(12) United States Patent
Mizori

(10) Patent No.: US 12,717,232 B2
(45) Date of Patent: Aug. 25, 2026

(54) UV-CURABLE RESIN COMPOSITIONS SUITABLE FOR REDISTRIBUTION LAYERS

(71) Applicant: Designer Molecules, Inc., San Diego, CA (US)

(72) Inventor: Farhad Mizori, San Diego, CA (US)

(73) Assignee: DESIGNER MOLECULES, INC., San Diego, CA (US)

(*) Notice: Subject to any disclaimer, the term of this patent is extended or adjusted under 35 U.S.C. 154(b) by 870 days.

(21) Appl. No.: 17/795,844

(22) PCT Filed: Jan. 28, 2021

(86) PCT No.: PCT/US2021/015344
§ 371 (c)(1),
(2) Date: Jul. 27, 2022

(87) PCT Pub. No.: WO2021/154898
PCT Pub. Date: Aug. 5, 2021

(65) Prior Publication Data

US 2023/0095931 A1 Mar. 30, 2023

Related U.S. Application Data

(60) Provisional application No. 62/966,197, filed on Jan. 27, 2020.

(51) Int. Cl.
*G03F 7/004* (2006.01)
*G03F 7/038* (2006.01)
(Continued)

(52) U.S. Cl.
CPC .......... *G03F 7/0048* (2013.01); *G03F 7/0382* (2013.01); *H10W 46/00* (2026.01);
(Continued)

(58) Field of Classification Search
CPC ....... H01L 24/20; H01L 21/56; H01L 23/293; H01L 23/3135; H01L 23/544;
(Continued)

(56) References Cited

U.S. PATENT DOCUMENTS 7,157,587 B2 * 1/2007 Mizori ................ C09J 179/085
548/461
8,816,021 B2 8/2014 Mizori et al.
(Continued)

FOREIGN PATENT DOCUMENTS

WO 2018237377 A1 12/2018

*Primary Examiner* — David T Karst
(74) *Attorney, Agent, or Firm* — Victor Repkin

(57) ABSTRACT

Hydrophobic, tough, photoimageable, functionalized polyimide formulations have been discovered that can be UV cured and developed in cyclopentanone. The present invention formulations can be used as passivation and redistribution layers with patterning provided by photolithograph, for the redistribution of I/O pads on fan-out RDL applications. The curable polyimide formulations reduce stress on thin wafers, when compared to conventional polyimide formulations, and provide low modulus, hydrophobic solder mask. These materials can serve as protective layers in any applications in which a thin, flexible, and hydrophobic polymer is required, that also has high tensile strength and high elongation at break.

18 Claims, 4 Drawing Sheets

(51) Int. Cl.

| | |
|---|---|
| ***H10W 46/00*** | (2026.01) |
| ***H10W 70/09*** | (2026.01) |
| ***H10W 70/60*** | (2026.01) |
| ***H10W 70/652*** | (2026.01) |
| ***H10W 72/00*** | (2026.01) |
| ***H10W 72/20*** | (2026.01) |
| ***H10W 74/01*** | (2026.01) |
| ***H10W 74/10*** | (2026.01) |
| ***H10W 74/47*** | (2026.01) |

(52) U.S. Cl.
CPC ........... *H10W 70/09* (2026.01); *H10W 74/01* (2026.01); *H10W 74/121* (2026.01); *H10W 74/47* (2026.01); *H10W 46/103* (2026.01); *H10W 70/60* (2026.01); *H10W 70/6528* (2026.01); *H10W 72/248* (2026.01); *H10W 72/853* (2026.01)

(58) Field of Classification Search
CPC ......... H01L 24/14; H01L 24/19; H01L 24/73; H01L 2223/54406; H01L 2224/14133; H01L 2224/2101; H01L 2224/2105; H01L 2224/211; H01L 2224/214; H01L 2224/215; H01L 2224/73101; H01L 2924/3511; H01L 2924/35121; G03F 7/0048; G03F 7/0382; H10W 46/00; H10W 70/09; H10W 74/01; H10W 74/47; H10W 74/121; H10W 46/103; H10W 70/60; H10W 70/6528; H10W 72/248; H10W 72/853
USPC .......................................................... 528/353
See application file for complete search history.

(56) References Cited

U.S. PATENT DOCUMENTS

2008/0026219 A1 1/2008 Tsushima et al.
2014/0275413 A1* 9/2014 Dershem ................ C09J 135/02 524/706
2018/0237668 A1 8/2018 Mizori

* cited by examiner

I
206
110
10
202
206
200
204
A
II
110
10
202
210
206
204
B
III
110
226
10
220
210
206
204
C
IV
110
226
10
222
212
210
206
220
220
D
V
110
230
10
212
206
210

110
10
206
200
204
202

110
10
206
210
202

110
10
210
206
220
202

110
10
206
222
206
220
212
202

110
10
210
230
206
220
212
202

UV-CURABLE RESIN COMPOSITIONS SUITABLE FOR REDISTRIBUTION LAYERS

RELATED APPLICATIONS

This application is a U.S. National Phase of PCT/US21/015344, filed Jan. 28, 2021 PCT International Publication No. WO/2021/154898, published Aug. 8, 2021); which claims the benefit of priority under 35 USC § 119 of U.S. Provisional Patent Application Ser. No. 62/966,197, filed Jan. 27, 2020, the entire disclosures of which are incorporated herein by reference.

FIELD OF THE INVENTION

The present invention relates to hydrophobic, photoimageable films that can be used for redistribution layers. More specifically, the invention relates to UV-curable, functionalized polyimides in formulations with high $T_g$ acrylic compounds that can UV-cure quickly. The invention relates resin formulations that UV-cure to produce films that have high tensile strength, and high elongation. Furthermore, the films are hydrophobic, have high glass transition, low coefficient of thermal expansion, very low dielectric constant and very low dielectric dissipation factor.

BACKGROUND OF THE INVENTION

As the electronics industry advances, and production of smaller and lighter weight components increases, the development of new materials gives producers increased options for further improving the performance and ease of manufacture of such components. However, the demand for smaller and more powerful electronic components presents certain challenges.

Due to rapid growth in dense electronics packaging, there is a need for passivating materials that can be used as redistribution layers. Existing polyimides are the most widely used polymers for this application, possessing good tensile strength and elongation, very high thermal stability along with toughness and resistance to chemicals and aqueous and high-relative humidity environments. Polyimides also have very low dielectric constants that make them ideal for use in high performance electronics and microelectronics applications. However, conventional polyimides are difficult to process. Conventional polyimides are UV cured in situ as the polyamic acid, followed by development, and final hard bake. The hard bake is needed to close the rings of the polyamic acid to form the polyimide; this process requires high temperature for long duration. For best results, a hard bake of well over 200° C. for several hours is required to ensure full imidization. Incomplete the imidization, in turn, results in a great degree of moisture absorption by the cured polyimide.

Therefore, a need exists for passivating material that retain the tensile strength and elongation of conventional polyimides, but can be processed at lower temperatures without the risk of incomplete ring closure. The material should also possess a relatively high glass transition temperature ($T_g$) with low coefficient of thermal expansion (CTE). The material should also be fast UV curing, easily developable in common organic solvents, hydrophobic, and have low dielectric constant (Dk) and low dielectric dissipation factor (Df).

In the field of photolithography and photoresists, polyimides are used very frequently, and in fact most wafer passivation uses photocurable polyimide film. Polyimide passivation layers are typically 4-6 microns thick and protect the delicate thin films of metals and oxides on chip surfaces from damage during handling and from induced stress after encapsulation in plastic molding compound. Patterning is simple and straightforward. Because of the low defect density and robust plasma etch resistance inherent in polyimide films, a single mask process can be implemented, which permits the polyimide layer to function both as a stress buffer and as a dry etch mask for an underlying silicon nitride layer. In addition, polyimide layers have been readily used for flip-chip bonding applications, including both C-4 and dual-layer bond pad redistribution (BPR) applications. Polyimide layers can be patterned to form the structural components in microelectromechanical systems (MEMS).

Polyimides may also serve as an interlayer dielectric in both semiconductors and thin film multichip modules (MCM-Ds). The low dielectric constant, low stress, high modulus, and inherent ductility of polyimide film make them well-suited for such multiple layer applications. Other uses for polyimides include alignment and/or dielectric layers for displays, and as a structural layer in micro machining applications. In lithium-ion battery technology, polyimide films can be used as protective layers for positive temperature coefficient (PTC) thermistor controllers.

In the fabrication of microelectronic devices, polyimides are typically applied as a solution of the corresponding polyamic acid precursors onto a substrate, and then thermally cured into a smooth, rigid, intractable polymeric film or structural layer. The film can be patterned using a lithographic (photographic) process in conjunction with liquid photoresists. Typically, polyimides are formed in situ through cyclodehydration of the polyamic acid precursors. This imidization step also requires the evaporation of high boiling, polar aprotic solvents, which can be difficult to drive off as the polyimide is formed. This step is sometimes referred to as a "hard bake" because the required temperature is typically >200° C. for several hours. Avoiding the hard bake step is the goal of much of the work in electronics applications of polyimide compounds.

Existing polyimide passivation materials generate a high degree of stress on the wafer, which can lead to delamination of the passivation material. Moreover, thinner silicon wafers can be warped during the hard bake of thermal cure, resulting in concave or convex wafer surfaces. This phenomenon creates a variety of problems for the semiconductor fabrication and packaging industry.

Conventional polyimides have been used as interlayer dielectric materials in microelectronic devices, such as integrated circuits (ICs) due to their advantageous dielectric constant, which is lower than that of silicon dioxide. Polyimide-containing formulations can serve as planarization layers for ICs as they are generally applied in a liquid form, allowed to level, and subsequently cured. Nevertheless, conventional polyimide passivation materials are hydrophilic and usually require tedious, multi-step processes to form vias required for multi-layer electrical interconnection. The tendency to a absorb moisture even after curing, which can lead to result in device failure.

Passivating Material

Materials currently used in passivating and redistribution layers tend to be very hydrophilic, with, very high dielectric constant (epoxies, acrylics). Other materials are available that have very high $T_g$, low CTE, and very good (i.e., low dielectric dielectric constants (benzocyclobutenes); however, these materials tend to be very brittle, expensive, and difficult to apply. Conventional polyimides can be used to exploit their high tensile strength and advantageous properties at both high and low temperature, including the tendency to remail flexible even at very cold temperatures and during repeated high-to-low thermo-cycling.

Accordingly, there is a need for hydrophobic polyimides that are compatible and do not cause warping of very thin silicon wafers for use in passivation layers.

Use in Photoresists

Furthermore, a continuing need exists for polyimide films that can be readily developed in photolithography. Generally, photoresists are classified as either negative or positive tone. A "positive tone resist" or "positive resist" is one in which the portions exposed to light become soluble to a developer solution, while unexposed portions remain insoluble. A "negative tone resist" or "negative resist" is one in which portions exposed to light become insoluble to the photoresist development, while unexposed portions are dissolved.

Negative tone photoresists are far more common in the microelectronics industry because they are lower in cost, have superior adhesion to silico, and have much better chemical resistance. However, development of fine features is far superior with positive resists. Improved polyimides for use in high resolution negative resists that put fine-feature development on par positive resists are needed.

The microelectronics industry continues to require improvements in polyimide technology to meet increasingly stringent demands. Accordingly, there is a need for the development of materials to address the requirements of this rapidly evolving industry.

SUMMARY OF THE INVENTION

The present invention provides passivating formulation that include at least one curable, functionalized polyimide compound where the at least one curable, functionalized polyimide compound is the product of a condensation of a diamine with an anhydride. In certain embodiments, the condensation reaction produces an anhydride-terminated polyimide, which is further reacted (e.g., with maleic anhydride) to produce a functionalized polyimide (e.g., a maleimide-terminated polyimide). In other embodiments the condensation reaction produces amine-terminated polyimide, which is further reacted to produce a functionalized polyimide. Reaction with maleic anhydride the amine-terminated polyimide produces a functionalized, maleimide-terminated polyimide.

According to the invention the diamine can be dimer diamine; TCD-diamine; 1,10-diaminodecane; 1,12-diaminodecane; 1,2-diamino-2-methylpropane; 1,2-diaminocyclohexane; 1,2-diaminopropane; 1,3-diaminopropane; 1,4-diaminobutane, 1,5-diaminopentane; 1,6-diaminohexane; 1,7-diaminoheptane; 1,8-diaminooctane; 1,9-diaminononane; 3,3'-diamino-N-methyldipropylamine; diaminomaleonitrile; 1,3-diaminopentane; 9-10-diaminophenanthrene; 4,4'-diaminooctafluorobiphenyl; 3,5-diaminobenzoic acid; 3,7-diamino-2-methoxyfluorene; 4,4'-diaminobenzophenone; 3,4-diaminobenzophenone; 3,4-diaminotoluene; 2,6-diaminoanthroquinone; 2,6-diaminotoluene; 2,3-diaminotoluene; 1,8-diaminonaphthalene; 2,4-cumenediamine; 1,3-bisaminomethylbenzene; 1,3-bisaminomethylcyclohexane; 2-chloro-1,4-diaminobenzene; 1,4-diamino-2,5-dichlorobenzene; 1,4-diamino-2,5-dimethylbenzene; 4,4'-diamino-2,2'-bistrifluoromethylbisphenyl; bis(amino-3-chlorophenyl)ethane; bis(4-amino-3,5-dimethylphenyl)methane; bis(4-amino-3,5-diethylphenyl)methane; bis(4-amino-3-ethylphenyl)methane; bis(4-amino-3-ethyl)diaminofluorene; diaminobenzoic acid; 2,3-diamononaphtalene; 2,3-diaminophenol; bis(4-amino-3-methylphenyl)methane; bis(4-amino-3-ethylphenyl)methane; 4,4'-diaminophenylsulfone; 4,4'-oxydianiline; 4,4'-diaminodiphenyl sulfide; 3,4'-oxydianiline; 2,2-bis[4-(3-aminophenoxy)phenyl]propane; 2,2'-bis[4-(4-aminophenoxy)phenyl]propane; 1,3-bis(4-aminophenoxy)benzene; 4,4'-bis(aminophenoxy)bisphenyl; 4,4'-diamino-3,3'-dihydroxybiphenyl; 4,4'-diamino-3,3'-dimethylbiphenyl; 4,4'-diamino-3,3'-dimethyoxybiphenyl; Bisaniline M; Bisaniline P; 9,9-bis(4-aminophenyl)fluorine; o-toluidine sulfone; methylene bis(anthranilic acid); 1,3-bis(4-aminophenoxy)-2,2-dimethylpropane; 1,3-bis(4-aminophenoxy)propane; 1,4-bis(aminophenoxy)butane; 1,5-bis(4-aminophenoxy)butane; 2,3,5ζ-tetramethylbenzidine; 4,4'-diaminobenzanilide; 2,2-bis(4-aminophenyl)hexafluoropropane; polyalkylenediamines (e.g. Huntsman's Jeffamine D-230, D-400, D2000, and D-4000 products); 1,3-cyclohexanebis(methylamine); m-xylylenediamine; p-xylylenediamine; bis(4-amino-3-methylcyclohexyl)methane; 1,2-bis(2-aminoethoxy)ethane; 3(4),8(9)-bis(aminomethyl)tricycle(5.2.1.0)decane; 1,3-diamino-2-propanol; 3-amino-1,2-propanediol; ethanolamine; 3-amino-1-propanol or a combinations thereof. In specific embodiments, the diamine is selected from dimer diamine, TCD-diamine and combinations thereof.

According to the invention, the anhydride can be biphenyl tetracarboxylic dianhydride, pyromellitic dianhydride; polybutadiene-graft-maleic anhydride; polyethylene-graft-maleic anhydride; polyethylene-alt-maleic anhydride; polymaleic anhydride-alt-1-octadecene; polypropylene-graft-maleic anhydride; poly(styrene-co-maleic anhydride); 1,2,3,4-cyclobutanetetracarboxylic dianhydride; 1,4,5,8-naphtalenetetracarboxylic dianhydride; 3,4,9,10-perylenetetracraboxylic dianhydride; bicyclo(2.2.2)octene-2,3,5,6-tetracarboxylic dianhydride; diethylenetriaminepentaacetic dianhydride; ethylenediaminetetraacetic dianhydride; 3,3',4,4'-benzophenone tetracarboxylic dianhydride; 3,3',4,4'-biphenyl tetracarboxylic dianhydride; 4,4'-oxydiphthalic dianhydride; 3,3',4,4'-diphenylsulfone tetracarboxylic dianhydride; 2,2'-bis(3,3-dicarboxyphenyl)hexafluoropropane dianhydride; 4,4'-bisphenol A diphthalic dianhydride; 5-(2,5-dioxotetrahydro)-3-methyl-3-cyclohexene-1,2-dicarboxylic anhydride; or a combination thereof. In specific aspects, the anhydride is selected from biphenyl tetracarboxylic dianhydride, pyromellitic dianhydride, and combinations thereof.

In certain embodiments of the invention, the at least one curable, functionalized polyimide has a structure according to Formula I:

Formula I

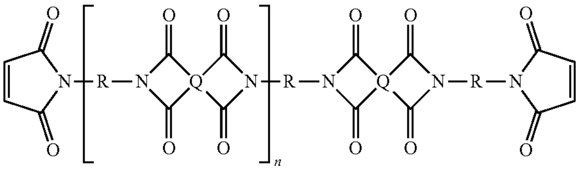

where each R is independently substituted or unsubstituted aliphatic, cycloaliphatic, alkenyl, aromatic, heteroaromatic; each Q is independently substituted or unsubstituted aliphatic, cycloaliphatic, alkenyl, aromatic, heteroaromatic; and n is an integer having the value from 1-100. n can be 1-50, 1-40, 1-30, 1-20, 1-10, 1-9, 1-8, 1-7, 1-6, 1-5, 1-4, 1-3, 1-2 or 1.

R and/or Q can include a $C_{36}$ moiety. In certain aspects at least one R or Q is tricyclodecyl dimethyl, norbornyl dimethyl; cyclohexane dimethyl; cyclohexyl, isophoronyl; methylenebis (cyclohexyl) dimethyl; or methylenebis(2-methylcyclohexyl) dimethyl.
Examples of compounds of the invention include:
Compound 1
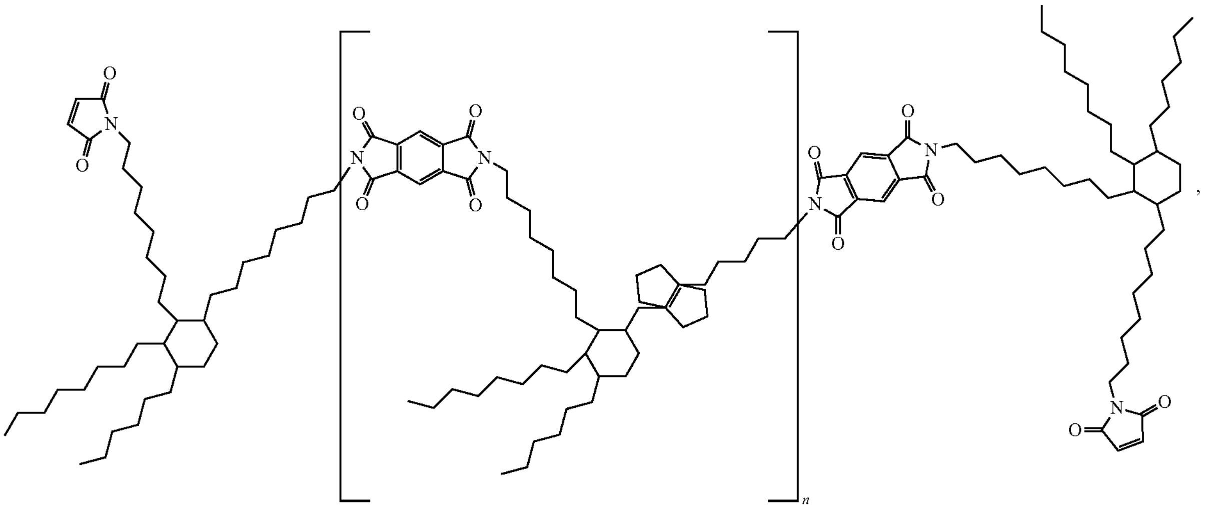
where n is 1-10
Compound 2
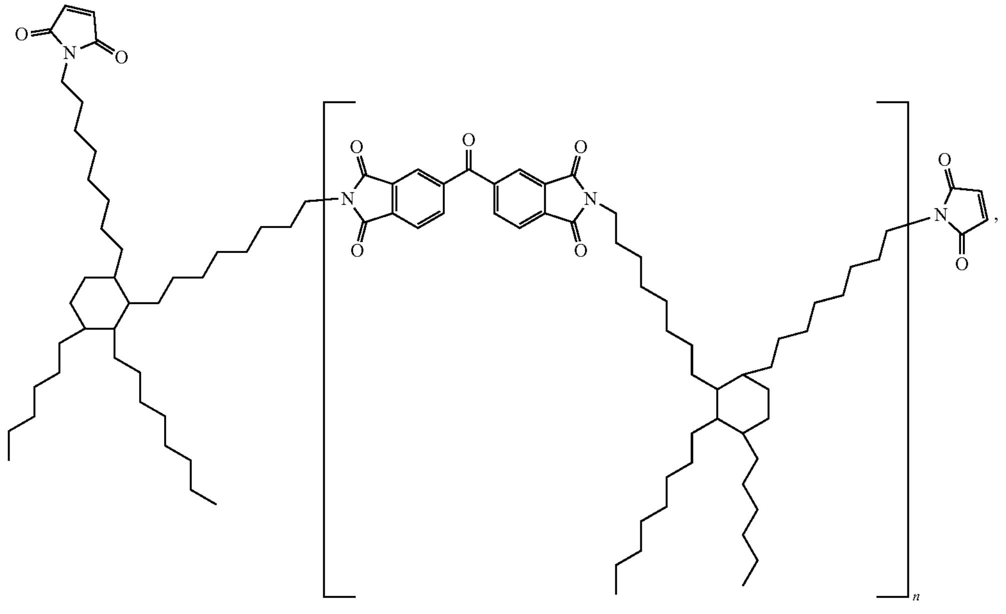
where n is 1-10

-continued
Compound 3
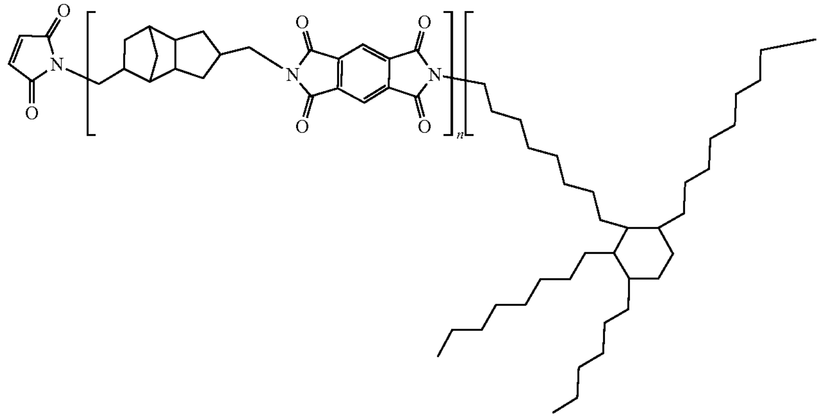
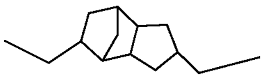
2,5-diethyloctahydro-1H-4,7-methanoindene
where n and m are 1-50 ,
Compound 4
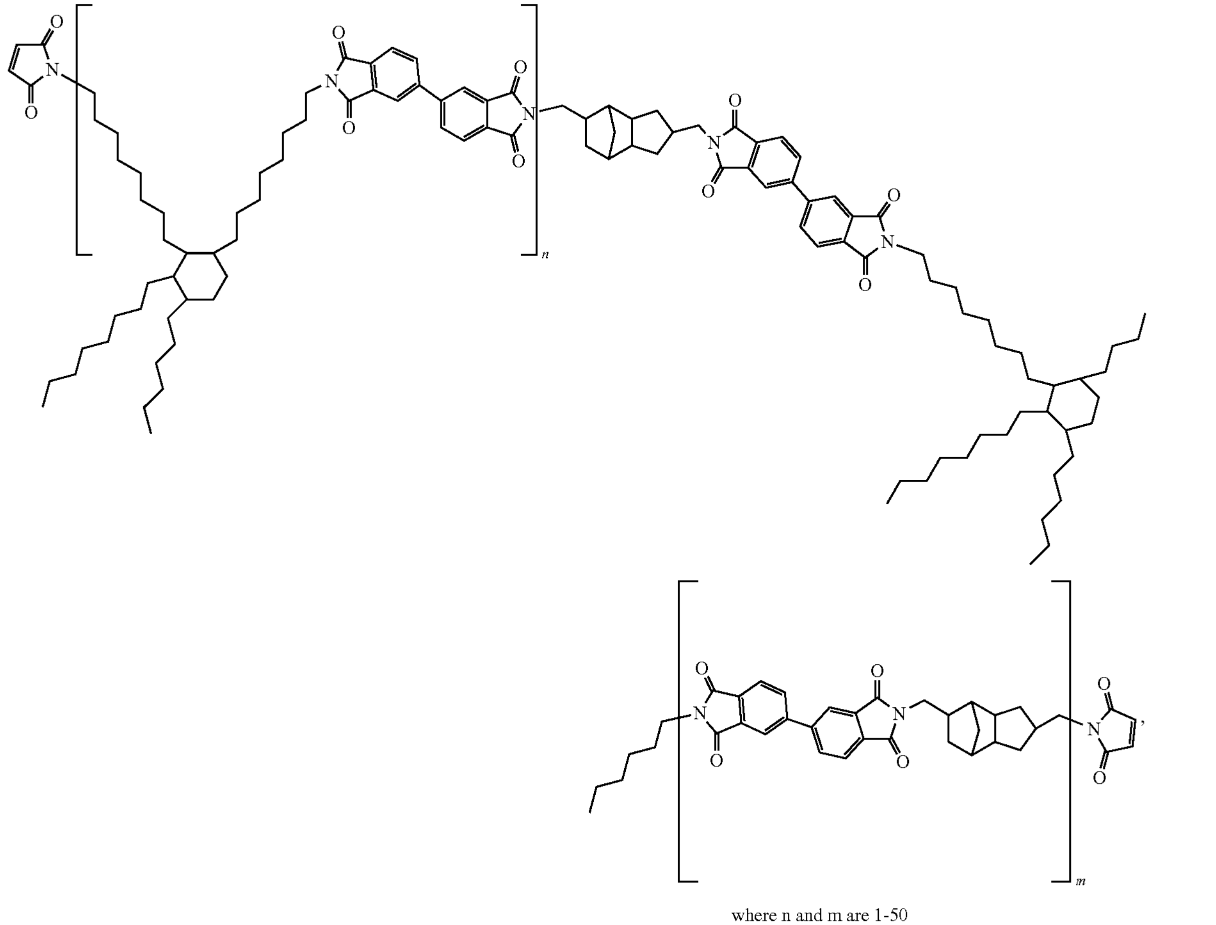
where n and m are 1-50

-continued
Compound 5
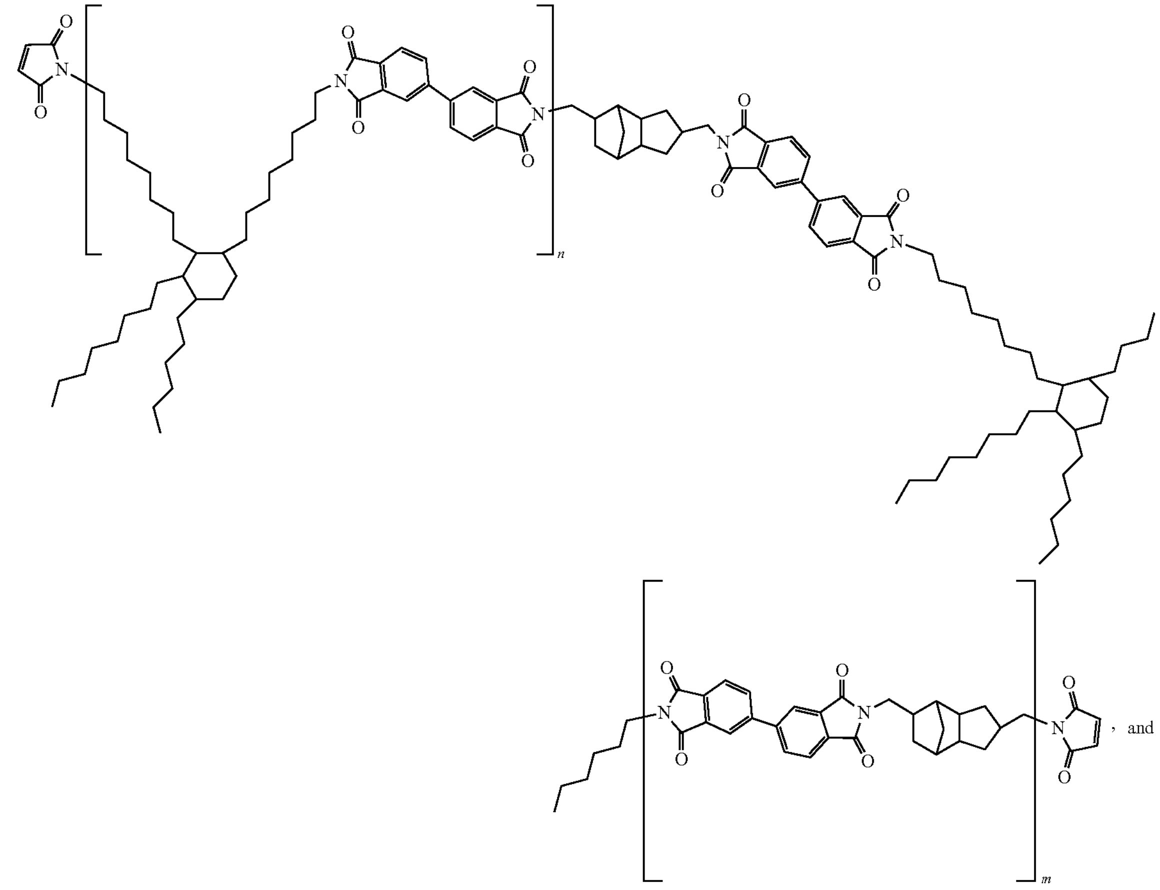
, and
where n and m are 1-50
Compound 6
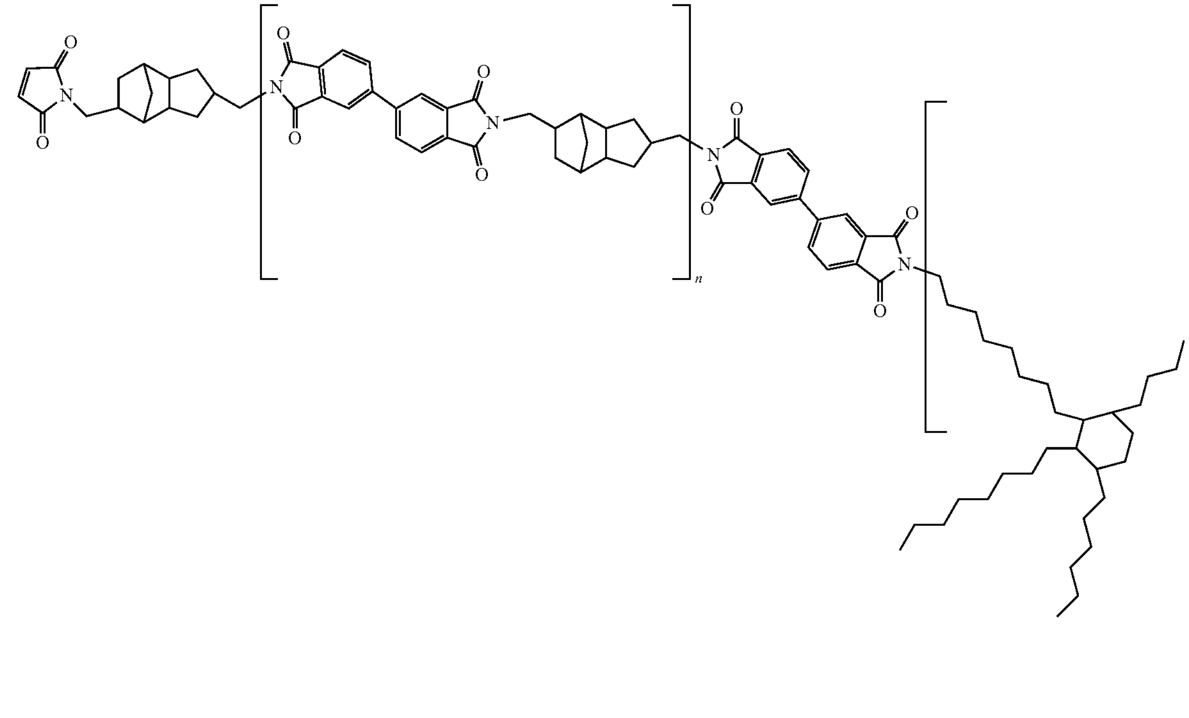

-continued

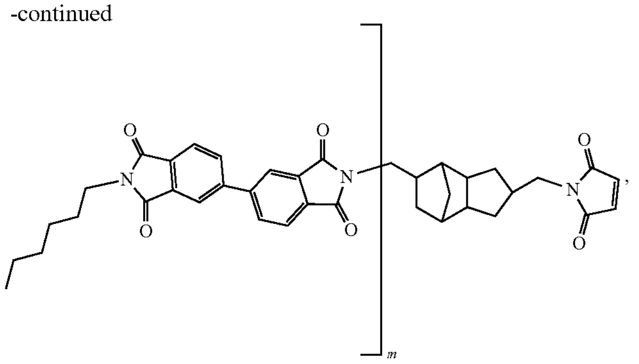

where n and m are 1-50 and combinations thereof.

In certain embodiments, the at least one curable, functionalized polyimide comprises a mixture of curable, functionalized polyimides. For example, the mixture can include a) at least one first curable, functionalized, flexible polyimide having an average molecular weight below 10,000 Da; and b) at least one second curable, functionalized polyimide having an average molecular weight of at least about 10,000 Da.

The at least one first curable, functionalized, flexible polyimide can have a CTE of at least about 100 ppm/° C., at least about 150 ppm/° C., or at least about 200 ppm/° C., and an average molecular weight between about 2,000 Da and about 7,500 Da.

The at least one first curable, functionalized flexible polyimide is typically about 15 wt % to about 80 wt % of the formulation, such as about 15 wt % to about 25 wt % of the formulation.

The at least one second curable, functionalized polyimide can have an average molecular weight of at least about 15.00 Da., at least about 25.00 Da, at least about 40,000 Da, or at least about 50,000 Da, and willy typically be about 45 wt % to about 75 wt %, such as about 45 wt % to about 55 wt %. at least one second curable, functionalized polyimide can have a $T_g$ of at least about 100° C., at least about 120° C., at least about 130° C., at least about 140° C., at least about 150° C. In some aspects, the at least one second curable, functionalized polyimide has a $T_g$ between about 100° C. and about 150° C.

The at least one first curable, functionalized, flexible polyimide can be Compound 1, Compound 2, or a combinations thereof. The at least one second curable, functionalized polyimide is selected from Compound 3, Compound 4, Compound 5, Compound 6, and combinations thereof. For example, the formulation can contain: at least on of Compound 1, Compound 2, or a mixture thereof; and at least one of Compound 3, Compound 4, Compound 5, Compound 6, or a mixture thereof. Combinations contemplated for us in the formulations of the invention include mixtures of Compound 1; plus Compound 4, Compound 5, or a combination thereof.

The passivating formulation typically will contain at least one second curable, functionalized polyimide; and an effective amount of the at least one first curable, functionalized, flexible polyimide, where the effective amount is sufficient to effect UV-curing of the formulation.

A cured aliquot of the passivating formulation of the invention can have a $T_g$ of at least about 90° C., at least about 100° C., at least about 110° C., or at least about 120° C., and typically will have s a percent elongation of at least about 40%, at least about 45%, at least about 50%, or at least about 55%. In one embodiment, a cured aliquot the passivating formulation has a $T_g$ of at least about 100° C. and a percent elongation of at least about 40%.

The passivating formulation also includes: at least one reactive diluent or co-curing agent; or at least one adhesion promoter; or at least one coupling agent; or at least one UV initiator; or at least one solvent, or any combination thereof.

In some embodiments, the passivating formulation comprises:

a) at least one curable, functionalized polyimide compound according to claim 2;
b) at least one reactive diluent;
c) at least one coupling agent, adhesion promoter or a combination thereof; and
d) at least one curing initiator.

The at least one curable, functionalized polyimide compound comprises about 65 wt % to about 80 wt or about 70 wt % to about 80 wt % of the composition.

The curing initiator can include a UV initiator, which ca be 1-[4-(2-Hydroxyethoxy)-phenyl]-2-hydroxy-2-methyl-1-propane-1-one; dicumyl peroxide; and combinations thereof.

The at least one reactive diluent can be selected from acrylates methacrylates, acrylamides, methacrylamides, maleimides, vinyl ethers, vinyl esters, styrenic compounds, allyl functional compounds, epoxies, epoxy curatives, olefins and combinations thereof. In certain aspects it is an acrylic monomer, such as Ethoxylated trimethylolpropane triacrylate, Tricyclodecane dimethanol diacrylate, Tris(2-acryloxyethyl)isocyanurate and combinations thereof, wherein the at least one reactive diluent is selected from the group consisting of Ethoxylated trimethylolpropane triacrylate, Tricyclodecane dimethanol diacrylate, and combinations thereof.

In certain aspects of the invention, the at least one reactive diluent comprises about 10 wt % to about 30 wt % of the formulation or about 12 wt % to about 25 wt % of the formulation, and typically has a viscosity under 200 centipoise and typically has a $T_g$ greater than about 100° C., greater than about 120° C., greater than about 150° C., 180° C. or greater than about 200° C.

The at least one coupling agent generally comprises about 2 wt % of the formulation and typically comprises a silane coupling agent and is selected from epoxy functionalized silane coupling agents, amino functionalized silane coupling agents and combinations thereof. In certain aspects, the coupling agent is selected from the group consisting of 2-(3,4 epoxycyclohexyl) ethyltrimethoxysilane (KBM-303); N-Phenyl-3-aminopropyltrimethoxysilane (KBM-573); and combinations thereof.

Methods for passivating an electronic component (e.g., a chip, device, or package) or any portion thereof are also provided, comprising the steps of: applying a layer of the passivating formulation according to claim 1 to the at least a portion of an electronic element; and curing (e.g., by UV-irradiation) the passivating formulation, thereby passivating the electronic element. Applying can be by spin-coating.

Also provided are passivated electronic components comprising a cured layer of the passivating formulation of claim 1, which can be prepared as described herein.

Also provided are electronic devices such as a semiconductor wafer, chip, wafer-level package, micro-electromechanical system (MEMS), Positive Temperature Coefficient (PTC) protective layer, fan-out redistribution chip or circuit board; and having a redistribution layer or a passivation layer disposed on at least one surface of the electronic device or of any component thereof.

Also provided by the invention are methods for redistributing a I/O pad of a chip, including the steps of: applying to the surface of the chip a first layer of the passivating formulation of claim 1 that covers at least a line from an I/O pad to a new I/O pad location; metallizing the line, thereby forming a metallized line; applying to the surface of the chip a second layer of the passivating formulation of claim 1 that covers at least the metallized line; removing the portion of the first layer covering the metallization of the new I/O pad; and curing the first layer and the second layer of the passivating formulation, thereby redistributing a I/O pad of a chip.

Curing the first layer of the passivating formulation can be before or after metallizing In some embodiments the first layer of the passivating formulation covers the entire surface of the chip. Excess first layer of the passivating formulation can be later removed such as by photolithography.

The redistributed chip can be a fan-out wafer-level package such as where the I/O pad is on the chip and the new I/O pad location is in a fan-out area. Also provided are chip prepared according the method of according to methods for redistributing I/O pads, which can be included in, e.g., devices, packages, and printed circuit boards.

DETAILED DESCRIPTION

Figure 1:
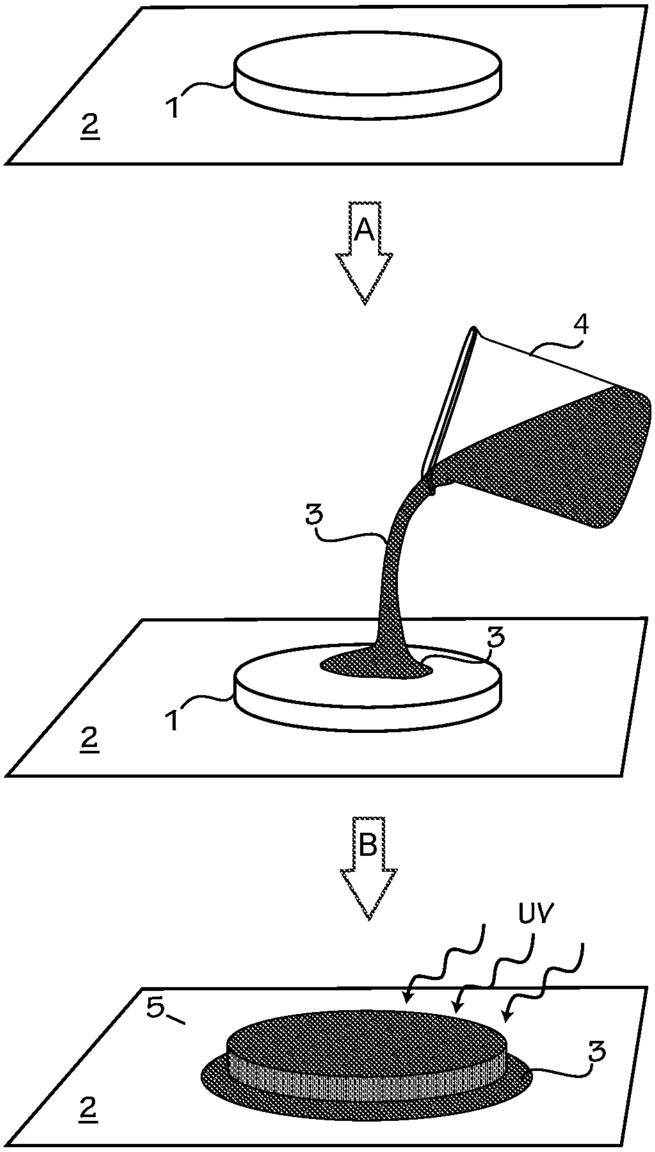
FIG. 1 is a schematic flow diagram illustrating the process of passivating a chip. Arrows A and B indicate steps in the process.

It is to be understood that both the foregoing general description and the following detailed description are exemplary and explanatory only and are not restrictive of the invention claimed. As used herein, the use of the singular includes the plural unless specifically stated otherwise. It is to be understood that as used in the specification and in the claims, "a" or "an" can mean one or more, depending upon the context in which it is used. Thus, reference to "a compound" can mean that at least one compound molecule is used, but typically refers to a plurality of compound molecules, which may be the same or different species. For example, "a compound having a structure according to the following Formula I" can refer to a single molecule or a plurality of molecules encompassed by the formula, as well all or a subset of the species the formula describes. As used herein, "or" means "and/or" unless stated otherwise. Furthermore, use of the term "including" as well as other forms, such as "includes," and "included," is not limiting.

Unless specific definitions are provided, the nomenclatures utilized in connection with, and the laboratory procedures and techniques of analytical chemistry, synthetic organic and inorganic chemistry described herein are those known in the art, such as those set forth in "IUPAC Compendium of Chemical Terminology: IUPAC Recommendations (The Gold Book)" (McNaught ed.; International Union of Pure and Applied Chemistry, $2^{nd}$ Ed., 1997) and "Compendium of Polymer Terminology and Nomenclature: IUPAC Recommendations 2008" (Jones et al., eds; International Union of Pure and Applied Chemistry, 2009). Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

The section headings used herein are for organizational purposes only and are not to be construed as limiting the subject matter described.

A number of specific definitions are listed below. In addition, definitions are provided throughout the specification, where contextually appropriate. The location of definitions within the specification is not to be construed as limiting or differentiating the intent or effect of such definitions.

Definitions

"About" as used herein, means that a number referred to as "about" comprises the recited number plus or minus 1-10% of that recited number. For example, "about" 100 degrees can mean 95-105 degrees or as few as 99-101 degrees depending on the situation. Whenever it appears herein, a numerical range such as "1 to 20" refers to each integer in the given range; e.g., "1 to 20 carbon atoms" means that an alkyl group can contain only 1 carbon atom, 2 carbon atoms, 3 carbon atoms, etc., up to and including 20 carbon atoms (although the term "alkyl" also includes instances where no numerical range of carbon atoms is designated). Where "about" modifies a range expressed in non-integers, it means the recited number plus or minus 1-10% to the same degree of significant figures expressed. For example, about 1.50 to 2.50 mM can mean as little as 1.35 mM or as much as 2.75 mM or any amount in between in increments of 0.01. Where a range described herein includes decimal values, such as "1.2% to 10.5%", the range refers to each decimal value of the smallest increment indicated in the given range; e.g., "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. More specifically, "substantially all" or equivalent expressions, typically refers to at least about 90%, frequently at least about 95%, often at least 99%, and more often at least about 99.9%. "Not substantially" refers to less than about 10%, frequently less than about 5%, and often less than about 1% such as less than 5%, less than 4%, less than 3%, less than 2%, or less than 1%. "Substantially free" or equivalent expressions, typically refers to less than about 10%, frequently less than about 5%, often less than about 1%, and in certain aspects less than about 0.1%.

"Effective amount", as used herein, refers to the amount of a compound or other substance that is sufficient in the presence of the remaining components to effect the desired result, such as reduction in photo-degradation and thermo-oxidative degradation by at least about 50%, usually at least about 70%, typically at least about 90%, frequently at least about 95% and most often, at least about 99%. In other aspects of the invention, an "effective amount" of a compound can refer to that concentration of the compound that is sufficient in the presence of the remaining components to effect the desired result. The effective amount of a compound or other substance is readily determined by one of ordinary skill in the art.

"Adhesive" or "adhesive compound" as used herein, refers to any substance that can adhere or bond two items together. Implicit in the definition of an "adhesive composition" or "adhesive formulation" is the fact that the composition or formulation is a combination or mixture of more than one species, component or compound, which can include adhesive monomers, oligomers, and/or polymers along with other materials, whereas an "adhesive compound" refers to a single species, such as an adhesive polymer or oligomer.

More specifically, adhesive composition refers to uncured mixtures in which the individual components in the mixture retain the chemical and physical characteristics of the original individual components of which the mixture is made. Adhesive compositions are typically malleable and may be liquids, pastes, gels, films or another form that can be applied to an item so that it can be bonded to another item.

"Cured adhesive," "cured adhesive composition" or "cured adhesive compound" refers to adhesive components and mixtures obtained from reactive curable original compounds or mixtures thereof which have undergone a chemical and/or physical changes such that the original compounds or mixtures are transformed into a solid, substantially non-flowing material. A typical curing process may involve crosslinking.

"Curable" means that an original compounds or composition can be transformed into a solid, substantially non-flowing material by means of chemical reaction, crosslinking, radiation crosslinking, or a similar process. Thus, adhesive compounds and compositions of the invention are curable, but unless otherwise specified, the original compounds and compositions are not cured.

As used herein, terms "functionalize", "functionalized" and "functionalization" refer to the addition or inclusion of a moiety ("functional moiety" or "functional group") to a molecule that imparts a specific property, often the ability of the functional group to react with other molecules in a predictable and/or controllable way. In certain embodiments of the invention, functionalization is imparted to a terminus of the molecule through the addition or inclusion of a terminal group, X. In other embodiments, internal and/or pendant functionalization can be included in the polyimides of the invention. In some aspects of the invention, the functional group is a "curable group" or "curable moiety", which is a group or moiety that allows the molecule to undergo a chemical and/or physical change such that the original molecule is transformed into a solid, substantially non-flowing material. "Curable groups" or "curable moieties" may facilitate crosslinking.

"Thermoplastic", as used herein, refers to the ability of a compound, composition or other material (e.g., a plastic) to dissolve in a suitable solvent or to melt to a liquid when heated and to freeze to a solid, often brittle and glassy, state when cooled sufficiently.

"Thermoset", as used herein, refers to the ability of a compound, composition or other material, to irreversibly "cure", resulting in a single three-dimensional network that has greater strength and less solubility compared to the un-cured material. Thermoset materials are typically polymers that may be cured, for example, through heat (e.g., above 200° C.), via a chemical reaction (e.g., epoxy ring-opening, free-radical polymerization) or through irradiation (with e.g., visible light, UV light, electron beam radiation, ion-beam radiation, or X-ray irradiation).

Thermoset materials, such as thermoset polymers are resins, are typically liquid or malleable forms prior to curing, and therefore may be molded or shaped into their final form, and/or used as adhesives. Curing transforms the thermoset resin into a rigid, infusible and insoluble solid or rubber by a cross-linking process. Energy and/or catalysts are typically added to the uncured thermoset that cause the thermoset molecules to react at chemically active sites (e.g., unsaturated or epoxy sites), thereby linking the thermoset molecules into a rigid, 3-dimensional structure. The cross-linking process forms molecules with higher molecular weight and resulting higher melting point. During the reaction, when the molecular weight of the polymer has increased to a point such that the melting point is higher than the surrounding ambient temperature, the polymer becomes a solid material.

"Cross-linking," as used herein, refers to the attachment of two or more oligomer or longer polymer chains by bridges of an element, a molecular group, a compound, or another oligomer or polymer. Crosslinking may take place upon heating or exposure to light; some crosslinking processes may also occur at room temperature or a lower temperature. As cross-linking density is increased, the properties of a material can be changed from thermoplastic to thermosetting.

The term "monomer" refers to a molecule that can undergo polymerization or copolymerization thereby contributing constitutional units to the essential structure of a macromolecule (i.e., a polymer).

The term "pre-polymer" refers to a monomer or combination of monomers that have been reacted to a molecular mass state intermediate between that of the monomer and higher molecular weight polymers. Pre-polymers are capable of further polymerization via reactive groups they contain, to a fully cured high molecular weight state. Mixtures of reactive polymers with un-reacted monomers may also be referred to a "resin". The term "resin", as used herein, refers to a substance containing pre-polymers, typically with reactive groups. In general, resins are pre-polymers of a single type or class, such as epoxy resins and bismaleimide resins.

"Polymer" and "polymer compound" are used interchangeably herein, to refer generally to the combined products of a single chemical polymerization reaction. Polymers are produced by combining monomer subunits into a covalently bonded chain Polymers that contain only a single type of monomer are known as "homopolymers," while polymers containing a mixture of two or more different monomers are known as "copolymers".

The term "copolymers" includes products that are obtained by copolymerization of two monomer species, those obtained from three monomers species (terpolymers), those obtained from four monomers species (quaterpolymers), and those obtained from five or more monomer species. It is well known in the art that copolymers synthesized by chemical methods include, but are not limited to, molecules with the following types of monomer arrangements:

- alternating copolymers, which contain regularly alternating monomer residues;
- periodic copolymers, which have monomer residue types arranged in a repeating sequence;
- random copolymers, which have a random sequence of monomer residue types;
- statistical copolymers, which have monomer residues arranged according to a known statistical rule;
- block copolymers, which have two or more homopolymer subunits linked by covalent bonds. The blocks of homopolymer within block copolymers, for example, can be of any length and can be blocks of uniform or variable length. Block copolymers with two or three distinct blocks are called diblock copolymers and triblock copolymers, respectively; and
- star copolymers, which have chains of monomer residues having different constitutional or configurational features that are linked through a central moiety.

The skilled artisan will appreciate that a single copolymer molecule may have different regions along its length that can be characterized as an alternating, periodic, random, etc. A copolymer product of a chemical polymerization reaction may contain individual polymeric molecules and fragments that each differ in the arrangement of monomer units. The skilled artisan will further be knowledgeable in methods for synthesizing each of these types of copolymers, and for varying reaction conditions to favor one type over another.

Furthermore, the length of a polymer chain according to the present invention will typically vary over a range or average size produced by a particular reaction. The skilled artisan will be aware, for example, of methods for controlling the average length of a polymer chain produced in a given reaction and also of methods for size-selecting polymers after they have been synthesized.

Unless a more restrictive term is used, "polymer" is intended to encompass homopolymers, and copolymers having any arrangement of monomer subunits as well as copolymers containing individual molecules having more than one arrangement. With respect to length, unless otherwise indicated, any length limitations recited for the polymers described herein are to be considered averages of the lengths of the individual molecules in polymer.

As used herein, "oligomer" or "oligomeric" refers to a polymer having a finite and moderate number of repeating monomers structural units. Oligomers of the invention typically have 2 to about 100 repeating monomer units; frequently 2 to about 30 repeating monomer units; and often 2 to about 10 repeating monomer units; and usually have a molecular weight up to about 3,000.

The skilled artisan will appreciate that oligomers and polymers may, depending on the availability of polymerizable groups or side chains, subsequently be incorporated as monomers in further polymerization or crosslinking reactions.

The term "solvent," as used herein, refers to a liquid that dissolves a solid, liquid, or gaseous solute, resulting in a solution. "Co-solvent" refers to a second, third, etc. solvent used with a primary solvent.

As used herein, "aliphatic" refers to any alkyl, alkenyl, cycloalkyl, or cycloalkenyl moiety.

"Aromatic hydrocarbon" or "aromatic" as used herein, refers to compounds having one or more benzene rings.

"Alkane," as used herein, refers to saturated straight chain, branched or cyclic hydrocarbons having only single bonds Alkanes have general formula $C_nH_{2n+2}$.

"Cycloalkane," refers to an alkane having one or more rings in its structure.

As used herein, "alkyl" refers to straight or branched chain hydrocarbyl groups having from 1 up to about 500 carbon atoms. "Lower alkyl" refers generally to alkyl groups having 1 to 6 carbon atoms. The terms "alkyl" and "substituted alkyl" include, respectively, substituted and unsubstituted $C_1$-$C_{500}$ straight chain saturated aliphatic hydrocarbon groups, substituted and unsubstituted $C_2$-$C_{200}$ straight chain unsaturated aliphatic hydrocarbon groups, substituted and unsubstituted $C_4$-$C_{100}$ branched saturated aliphatic hydrocarbon groups, substituted and unsubstituted $C_1$-$C_{500}$ branched unsaturated aliphatic hydrocarbon groups.

For example, the definition of "alkyl" includes but is not limited to: methyl (Me), ethyl (Et), propyl (Pr), butyl (Bu), pentyl, hexyl, heptyl, octyl, nonyl, decyl, undecyl, ethenyl, propenyl, butenyl, pentenyl, hexenyl, heptenyl, octenyl, nonenyl, decenyl, undecenyl, isopropyl (i-Pr), isobutyl (i-Bu), tert-butyl (t-Bu), sec-butyl (s-Bu), isopentyl, neopentyl, cyclopropyl, cyclobutyl, cyclopentyl, cyclohexyl, cycloheptyl, cyclooctyl, cyclopentenyl, cyclohexenyl, cycloheptenyl, cyclooctenyl, methylcyclopropyl, ethylcyclohexenyl, butenylcyclopentyl, tricyclodecyl, adamantyl, and norbornyl.

"Substituted" refers to compounds and moieties bearing substituents that include but are not limited to alkyl (e.g., $C_{1-10}$ alkyl), alkenyl, alkynyl, hydroxy, oxo, alkoxy, mercapto, cycloalkyl, substituted cycloalkyl, heterocyclic, substituted heterocyclic, aryl, substituted aryl (e.g., aryl $C_{1-10}$ alkyl or aryl $C_{1-10}$ alkyloxy), heteroaryl, substituted heteroaryl (e.g., heteroaryl$C_{1-10}$ alkyl), aryloxy, $C_{1-10}$ alkyloxy $C_{1-10}$ alkyl, aryl $C_{1-10}$ alkyloxy$C_{1-10}$ alkyl, $C_{1-10}$ alkylthio$C_{1-10}$ alkyl, aryl $C_{1-10}$ alkylthio $C_{1-10}$ alkyl, $C_{1-10}$ alkylamino $C_{1-10}$ alkyl, aryl $C_{1-10}$ alkylamino $C_{1-10}$ alkyl, N-aryl-N—$C_{1-10}$ alkylamino $C_{1-10}$ alkyl, $C_{1-10}$ alkylcarbonyl $C_{1-10}$ alkyl, aryl $C_{1-10}$ alkylcarbonyl $C_{1-10}$ alkyl, $C_{1-10}$ alkylcarboxy $C_{1-10}$ alkyl, aryl $C_{1-10}$ alkylcarboxy $C_{1-10}$ alkyl, $C_{1-10}$ alkylcarbonylamino $C_{1-10}$ alkyl, and aryl $C_{1-10}$ alkylcarbonylamino $C_{1-10}$ alkyl, substituted aryloxy, halo, haloalkyl (e.g., trihalomethyl), cyano, nitro, nitrone, amino, amido, carbamoyl, =O, =CH—, —C(O)H, —C(O)O—, —C(O)—, —S—, —$S(O)_2$, —OC(O)—O—, —NR—C(O), —NR—C(O)—NR, —OC(O)—NR, where R is H or lower alkyl, acyl, oxyacyl, carboxyl, carbamate, sulfonyl, sulfonamide, sulfuryl, $C_{1-10}$ alkylthio, aryl $C_{1-10}$ alkylthio, $C_{1-10}$ alkylamino, aryl $C_{1-10}$ alkylamino, N-aryl-N—$C_{1-10}$ alkylamino, $C_{1-10}$ alkyl carbonyl, aryl $C_{1-10}$ alkylcarbonyl, $C_{1-10}$ alkylcarboxy, aryl $C_{1-10}$ alkylcarboxy, $C_{1-10}$ alkyl carbonylamino, aryl $C_{1-10}$ alkylcarbonylamino, tetrahydrofuryl, morpholinyl, piperazinyl, and hydroxypyronyl.

In addition, as used herein "$C_{36}$" and "$C_{36}$ moiety" refer to all possible structural isomers of a 36-carbon aliphatic moiety, including branched isomers and cyclic isomers with up to three carbon-carbon double bonds in the backbone. One non-limiting example of a $C_{36}$ moiety is the moiety comprising a cyclohexane-based core and four long "arms" attached to the core, as illustrated below:

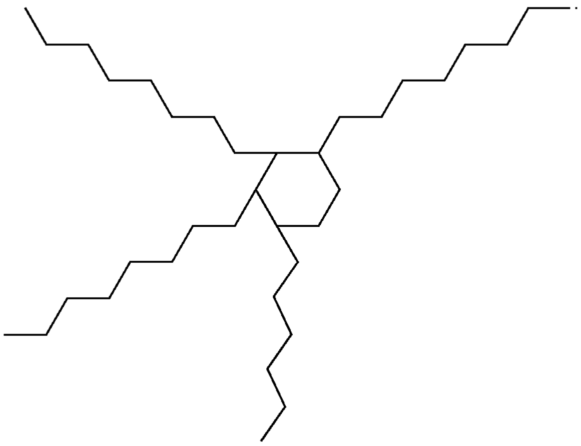

$C_{36}$

As used herein, "cycloalkyl" refers to cyclic ring-containing groups containing about 3 to about 20 carbon atoms, typically 3 to about 15 carbon atoms. In certain embodiments, cycloalkyl groups have about 4 to about 12 carbon atoms, and in yet further embodiments, cycloalkyl groups have about 5 to about 8 carbon atoms. "Substituted cycloalkyl" refers to cycloalkyl groups further bearing one or more substituents as set forth above.

As used herein, the term "aryl" refers to an unsubstituted, mono-, di- or trisubstituted monocyclic, polycyclic, biaryl aromatic groups covalently attached at any ring position capable of forming a stable covalent bond, certain preferred points of attachment being apparent to those skilled in the art (e.g., 3-phenyl, 4-naphtyl and the like). "Substituted aryl" refers to aryl groups further bearing one or more substituents as set forth above.

Specific examples of moieties encompassed by the definition of "aryl" include, but are not limited to, phenyl, biphenyl, naphthyl, dihydronaphthyl, tetrahydronaphthyl, indenyl, indanyl, azulenyl, anthryl, phenanthryl, fluorenyl, and pyrenyl.

As used herein, "arylene" refers to a divalent aryl moiety. "Substituted arylene" refers to arylene moieties bearing one or more substituents as set forth above.

As used herein, "alkylaryl" refers to alkyl-substituted aryl groups and "substituted alkylaryl" refers to alkylaryl groups further bearing one or more substituents as set forth above.

As used herein, "arylalkyl" refers to aryl-substituted alkyl groups and "substituted arylalkyl" refers to arylalkyl groups further bearing one or more substituents as set forth below. Examples include, but are not limited to, (4-hydroxyphenyl) ethyl and (2-aminonaphthyl) hexenyl.

As used herein, "arylalkenyl" refers to aryl-substituted alkenyl groups and "substituted arylalkenyl" refers to arylalkenyl groups further bearing one or more substituents as set forth above.

As used herein, "arylalkynyl" refers to aryl-substituted alkynyl groups and "substituted arylalkynyl" refers to arylalkynyl groups further bearing one or more substituents as set forth above.

As used herein, "aroyl" refers to aryl-carbonyl species such as benzoyl and "substituted aroyl" refers to aroyl groups further bearing one or more substituents as set forth above.

As used herein, "hetero" refers to groups or moieties containing one or more non-carbon heteroatoms, such as N, O, Si and S. Thus, for example "heterocyclic" refers to cyclic (i.e., ring-containing) groups having e.g., N, O, Si or S as part of the ring structure, and having 3 to 14 carbon atoms. "Heteroaryl" and "heteroalkyl" moieties are aryl and alkyl groups, respectively, containing e.g., N, O, Si or S as part of their structure. The terms "heteroaryl", "heterocycle" or "heterocyclic" refer to a monovalent unsaturated group having a single ring or multiple condensed rings, from 1 to 8 carbon atoms and from 1 to 4 hetero atoms selected from nitrogen, sulfur or oxygen within the ring.

The definition of heteroaryl includes but is not limited to thienyl, benzothienyl, isobenzothienyl, 2,3-dihydrobenzothienyl, furyl, pyranyl, benzofuranyl, isobenzofuranyl, 2,3-dihydrobenzofuranyl, pyrrolyl, pyrrolyl-2,5-dione, 3-pyrrolinyl, indolyl, isoindolyl, 3H-indolyl, indolinyl, indolizinyl, indazolyl, phthalimidyl (or isoindoly-1,3-dione), imidazolyl. 2H-imidazolinyl, benzimidazolyl, pyridyl, pyrazinyl, pyradazinyl, pyrimidinyl, triazinyl, quinolyl, isoquinolyl, 4H-quinolizinyl, cinnolinyl, phthalazinyl, quinazolinyl, quinoxalinyl, 1,8-naphthyridinyl, pteridinyl, carbazolyl, acridinyl, phenazinyl, phenothiazinyl, phenoxazinyl, chromanyl, benzodioxolyl, piperonyl, purinyl, pyrazolyl, triazolyl, tetrazolyl, thiazolyl, isothiazolyl, benzthiazolyl, oxazolyl, isoxazolyl, benzoxazolyl, oxadiazolyl, thiadiazolyl, pyrrolidinyl-2,5-dione, imidazolidinyl-2,4-dione, 2-thioxo-imidazolidinyl-4-one, imidazolidinyl-2,4-dithione, thiazolidinyl-2,4-dione, 4-thioxo-thiazolidinyl-2-one, piperazinyl-2,5-dione, tetrahydro-pyridazinyl-3,6-dione, 1,2-dihydro-[1,2,4,5]tetrazinyl-3,6-dione, [1,2,4,5] tetrazinanyl-3,6-dione, dihydro-pyrimidinyl-2,4-dione, pyrimidinyl-2,4,6-trione, 1H-pyrimidinyl-2,4-dione, 5-iodo-1H-pyrimidinyl-2,4-dione, 5-chloro-1H-pyrimidinyl-2,4-dione, 5-methyl-1H-pyrimidinyl-2,4-dione, 5-isopropyl-1H-pyrimidinyl-2,4-dione, 5-propynyl-1H-pyrimidinyl-2,4-dione, 5-trifluoromethyl-1H-pyrimidinyl-2,4-dione, 6-amino-9H-purinyl, 2-amino-9H-purinyl, 4-amino-1H-pyrimidinyl-2-one, 4-amino-5-fluoro-1H-pyrimidinyl-2-one, 4-amino-5-methyl-1H-pyrimidinyl-2-one, 2-amino-1,9-dihydro-purinyl-6-one, 1,9-dihydro-purinyl-6-one, 1H-[1,2,4] triazolyl-3-carboxylic acid amide, 2,6-diamino-$N_6$-cyclopropyl-9H-purinyl, 2-amino-6-(4-methoxyphenylsulfanyl)-9H-purinyl, 5,6-dichloro-1H-benzoimidazolyl, 2-isopropylamino-5,6-dichloro-1H-benzoimidazolyl, 2-bromo-5,6-dichloro-1H-benzoimidazolyl, and the like. Furthermore, the term "saturated heterocyclic" refers to an unsubstituted, mono-, di- or trisubstituted monocyclic, polycyclic saturated heterocyclic group covalently attached at any ring position capable of forming a stable covalent bond, certain preferred points of attachment being apparent to those skilled in the art (e.g., 1-piperidinyl, 4-piperazinyl and the like).

Hetero-containing groups may also be substituted. For example, "substituted heterocyclic" refers to a ring-containing group having 3 to 14 carbon atoms that contains one or more heteroatoms and also bears one or more substituents, as set forth above.

As used herein, the term "phenol" includes compounds having one or more phenolic functions per molecule, as illustrated below:

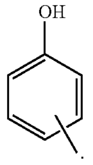

The terms aliphatic, cycloaliphatic and aromatic, when used to describe phenols, refers to phenols to which aliphatic, cycloaliphatic and aromatic residues or combinations of these backbones are attached by direct bonding or ring fusion.

As used herein, "alkenyl," "alkene" or "olefin" refers to straight or branched chain unsaturated hydrocarbyl groups having at least one carbon-carbon double bond and having about 2 to 500 carbon atoms. In certain embodiments, alkenyl groups have about 5 to about 250 carbon atoms, 5 to about 100 carbon atoms, 5 to about 50 carbon atoms or 5 to about 25 carbon atoms. In other embodiments, alkenyl groups have about 6 to about 500 carbon atoms, 8 to about 500 carbon atoms, 10 to about 500 carbon atoms or 20 to about 500 carbon atoms or 50 to about 500 carbon atoms. In yet further embodiments, alkenyl groups have about 6 to about 100 carbon atoms, 10 to about 100 carbon atoms, 20 to about 100 carbon atoms or 50 to about 100 carbon atoms, while in other embodiments, alkenyl groups have about 6 to about 50 carbon atoms, 6 to about 25 carbon atoms, 10 to about 50 carbon atoms, or 10 to about 25 carbon atoms. "Substituted alkenyl" refers to alkenyl groups further bearing one or more substituents as set forth above.

As used herein, "alkylene" refers to a divalent alkyl moiety, and "oxyalkylene" refers to an alkylene moiety containing at least one oxygen atom instead of a methylene ($CH_2$) unit. "Substituted alkylene" and "substituted oxyalkylene" refer to alkylene and oxyalkylene groups further bearing one or more substituents as set forth above.

As used herein, "alkynyl" refers to straight or branched chain hydrocarbyl groups having at least one carbon-carbon triple bond and having 2 to about 100 carbon atoms, typically about 4 to about 50 carbon atoms, and frequently about 8 to about 25 carbon atoms. "Substituted alkynyl" refers to alkynyl groups further bearing one or more substituents as set forth above.

As used herein, "acyl" refers to alkyl-carbonyl species.

As used herein, the term "oxetane" refers to a compound bearing at least one moiety having the structure:

"Allyl" as used herein, refers to refers to a compound bearing at least one moiety having the structure:

As used herein, "vinyl ether" refers to a compound bearing at least one moiety having the structure:

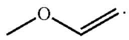

As used herein, the term "vinyl ester" refers to a compound bearing at least one moiety having the structure:

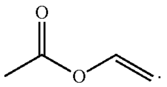

As used herein, "styrene" and "styrenic" refer to a compound bearing at least one moiety having the structure:

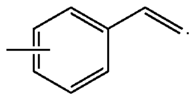

"Fumarate" as used herein, refers to a compound bearing at least one moiety having the structure:

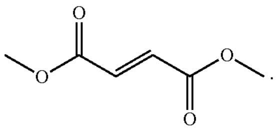

"Propargyl" as used herein, refers to a compound bearing at least one moiety having the structure:

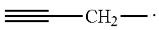

"Cyanate" as used herein, refers to a compound bearing at least one moiety having the structure:

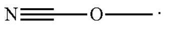

"Cyanate ester" as used herein, refers to a compound bearing at least one moiety having the structure:

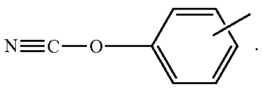

As used herein, "norbornyl" refers to a compound bearing at least one moiety having the structure:

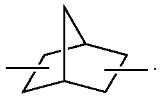

"Imide" as used herein, refers to a functional group having two carbonyl groups bound to a primary amine or ammonia. The general formula of an imide of the invention is:

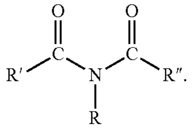

"Polyimides" are polymers of imide-containing monomers. Polyimides are typically linear or cyclic. Non-limiting examples of linear and cyclic (e.g., an aromatic heterocyclic polyimide) polyimides are shown below for illustrative purposes.

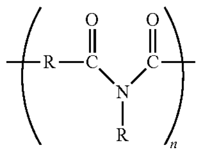

Linear Polyimide

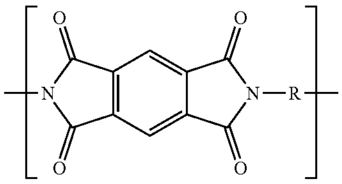

Aromatic Heterocyclic Polyimide .

"Maleimide," as used herein, refers to an N-substituted maleimide having the formula as shown below:

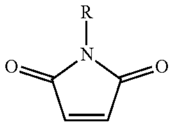

where R is an aromatic, heteroaromatic, aliphatic, or polymeric moiety.

"Bismaleimide" or "BMI", as used herein, refers to compound in which two imide moieties are linked by a bridge, i.e., a compound a polyimide having the general structure shown below:

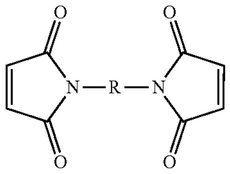

where R is an aromatic, heteroaromatic, aliphatic, or polymeric moiety.

BMIs can cure through an addition rather than a condensation reaction, thus avoiding problems resulting from the formation of volatiles. BMIs can be cured by a vinyl-type polymerization of a pre-polymer terminated with two maleimide groups.

As used herein, the term "acrylate" refers to a compound bearing at least one moiety having the structure:

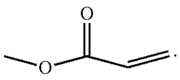

As used herein, the term "acrylamide" refers to a compound bearing at least one moiety having the structure:

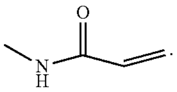

As used herein, the term "methacrylate" refers to a compound bearing at least one moiety having the structure:

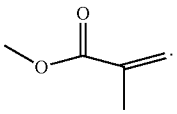

As used herein, the term "methacrylamide" refers to a compound bearing at least one moiety having the structure:

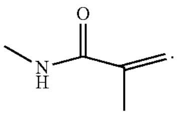

As used herein, "maleate" refers to a compound bearing at least one moiety having the structure:

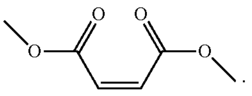

As used herein, the terms "citraconimide" and "citraconate" refer to a compound bearing at least one moiety having the structure:

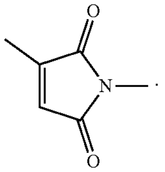

"Itaconimide" and "itaconate", as used herein, refer to a compound bearing at least one moiety having the structure:

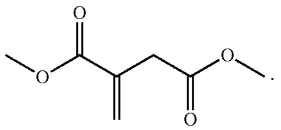

"Oxazoline" as used herein, refers to a compound bearing at least one moiety having the structure

As used herein, "benzoxazine" refers to moieties including the following bicyclic structure:

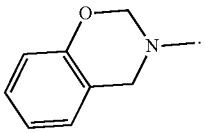

As used herein, the term "acyloxy benzoate" or "phenyl ester" refers to a compound bearing at least one moiety having the structure:

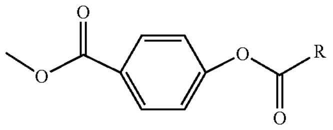

where R is H, lower alkyl, or aryl.

As used herein, "siloxane" refers to any compound containing a Si—O moiety. Siloxanes may be either linear or cyclic. In certain embodiments, siloxanes of the invention include 2 or more repeating units of Si—O. Exemplary cyclic siloxanes include hexamethylcyclotrisiloxane, octamethylcyclotetrasiloxane, decamethylcyclopentasiloxane, dodecamethylcyclohexasiloxane and the like.

As used herein, the terms "halogen," "halide," or "halo" include fluorine, chlorine, bromine, and iodine.

As used herein, "oxiranylene" or "epoxy" refer to divalent moieties having the structure:

The term "epoxy" also refers to thermosetting epoxide polymers that cure by polymerization and crosslinking when mixed with a catalyzing agent or "hardener," also referred to as a "curing agent" or "curative." Epoxies of the present invention include, but are not limited to aliphatic, cycloaliphatic, glycidyl ether, glycidyl ester, glycidyl amine epoxies, and the like, and combinations thereof.

As used herein, the term "free radical initiator" refers to any chemical species that, upon exposure to sufficient energy (e.g., light or heat), decomposes into parts, which are uncharged, but every one of such part possesses at least one unpaired electron.

"Photoinitiation" as used herein, refers to polymerization initiated by light. In most cases, photoinduced polymerization, utilizes initiators to generate radicals, which can be one of two types: "Type I Photoinitiators" (unimolecular photoinitiators), which undergo homolytic bond cleavage upon absorption of light; and "Type II Photoinitiators" (bimolecular photoinitiators), consisting of a photoinitiator such as benzophenone or thioxanthone and a coinitiator such as alcohol or amine.

As used herein, the "coupling agent" refers to chemical species that are capable of bonding dissimilar materials together; particularly, for bonding a material to a mineral surface and which also contain polymerizably reactive functional group(s) to enable interaction with an adhesive polymer composition. Coupling agents are typically bifunctional molecules, where one functionality is able to react a mineral surface and the other with a polymer, thus coupling the two together. Coupling agents thus facilitate linkage of a passivation layer to the substrate to which it is applied.

"Diamine," as used herein, refers generally to a compound or mixture of compounds, where each species has 2 amine groups.

"Anhydride" as used herein, refers to a compound bearing at least one moiety having the structure:

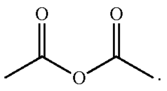

"Dianhydride," as used herein, refers generally to a compound or mixture of compounds, where each species has 2 anhydride groups.

"Glass transition temperature" or "$T_g$", is used herein to refer to the temperature at which an amorphous solid, such as a polymer, becomes brittle on cooling, or soft on heating. More specifically, it defines a pseudo second order phase transition in which a supercooled melt yields, on cooling, a glassy structure and properties similar to those of crystalline materials e.g., of an isotropic solid material.

"Low glass transition temperature" or "Low $T_g$" as used herein, refers to a $T_g$ at or below about 50° C. "High glass transition temperature" or "High $T_g$" as used herein, refers to a $T_g$ of at least about 60° C., at least about 70° C., at least about 80° C., at least about 100° C. "Very high glass transition temperature" and "very high $T_g$" as used herein, refers to a $T_g$ of at least about 150° C., at least about 175° C., at least about 200° C., at least about 220° C. or higher.

High glass transition temperature compounds and compositions of the invention typically have a $T_g$ in the range of about 70° C. to about 300° C.

"Modulus" or "Young's Modulus" as used herein, is a measure of the stiffness of a material. Within the limits of elasticity, modulus is the ratio of the linear stress to the linear strain, which can be determined from the slope of a stress-strain curve created during tensile testing.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$" refers to the CTE before the $T_g$, while "$\alpha_2$ CTE" refers to the CTE after the $T_g$.

"Low Coefficient of Thermal Expansion" or "Low CTE" as used herein, refers to an CTE of less than about 50 ppm/° C., typically less than about 30 ppm/° C. or less than about 10 ppm/° C.

"High Coefficient of Thermal Expansion" or "High CTE" as used herein, refers to an CTE of greater than about 100 ppm/° C., typically greater than about 150 ppm/° C., or greater than about 200 ppm/° C.

"Thermogravimetric analysis" or "TGA" refers to a method of testing and analyzing a material to determine changes in weight of a sample that is being heated in relation to change in temperature.

"Decomposition onset" or "Td" refers to a temperature when the loss of weight in response to the increase of the temperature indicates that the sample is beginning to degrade. "Td (5%)" is the temperature at which 5% of sample has degraded. When measured in an air environment "air" is typically noted in the Td (5%) abbreviation such as "Td (5%), air".

"Breakdown voltage", as used herein, refers to the minimum voltage that causes a portion of an insulator to become electrically conductive. "High breakdown voltage" is at least about 100 V to at least about 900 V, such as 200V, 300V, 400V, 500V, 600V, 700V, 800V, 900V, 1,000V or higher.

"Electric power" is the rate, per unit time, at which electrical energy is transferred by an electric circuit. It is the rate of doing work. In electric circuits, power is measured in Watts (W) and is a function of both voltage and current:

$$P = IE$$

where P=power (in watts); I=current (in amperes) and E=voltage (in volts). Since Electric power generally generates heat "high power" is often used to refer to devices and applications that generate heat in excess of 100° C.

"High frequency" or "HF", as used herein, refers to the range of radio frequency electromagnetic waves between 3 and 30 megahertz (MHz).

"Dielectric", as used herein, refers to an insulating material that has the property of transmitting electric force without conduction. When a dielectric material is placed in an electric field, electric charges do not flow through the material as they do in an electrical conductor but only slightly shift from their average equilibrium positions causing dielectric polarization. Because of dielectric polarization, positive charges are displaced in the direction of the field and negative charges shift in the direction opposite to the field. This creates an electric field that reduces the overall field within the dielectric itself.

As used herein the terms "dielectric constant", "relative permittivity", and abbreviation "Dk", refers to the ratio of the permittivity (a measure of electrical resistance) of a substance to the permittivity of free space (which is given a value of 1). In simple terms, the lower the Dk of a material, the better it will act as an insulator. As used herein, "low dielectric constant" refers to materials with a Dk less than that of silicon dioxide, which has Dk of 3.9. Thus, "low dielectric constant refers" to a Dk of less than 3.9, typically, less than about 3.5, and most often less than about 3.0. "Ultra-low dielectric constants", well below 3.0, such as less than about 2.7, less than about 2.6, or less than about 2.5, may be required for the most demanding, cutting edge electronics application.

As used herein the term "dissipation dielectric factor", "dissipation dielectric constant", and abbreviation "Df" are used herein to refer to a measure of loss-rate of energy in a thermodynamically open, dissipative system. In simple terms, Df is a measure of how inefficient the insulating material of a capacitor is. It typically measures the heat that is lost when an insulator such as a dielectric is exposed to an alternating field of electricity. The lower the Df of a material, the better its efficiency. "Low dissipation dielectric factor" typically refers to a Df of less than about 0.01 at 1 GHz frequency, frequently less than about 0.005 at 1 GHz frequency, and often 0.001 or lower at 1 GHz frequency.

"Low-loss" and "ultra-low loss" PCBs are those that require dielectric materials with Df value of less than 0.0025. All printed circuit board (PCB) materials exhibit both conduction and dielectric loss. "Low-loss" and "ultra-low loss" PCBs minimize both of these types of losses and typically can only be obtained with dielectric materials with Df value of less than 0.0025. The conduction losses are primarily resistive losses in the conduction layers and leakage of charge through the dielectric. The dielectric losses result from the varying field produced from the alternating electric field causing movement of the material's molecular structure generating heat. Dielectrics are materials that are poor conductors of electric current. They are insulators because they have few free electrons available to carry current. However, when subjected to an electric field, polarization occurs whereby positive and negative charges are displaced relative to the electric field. This polarization reduces the electric field in the dielectric thus causing part of the applied field to be lost. The effect of the polarization or dipole moment in a dielectric is quantified as "loss tangent" and describes the dielectric's inherent dissipation of an applied electric field. The loss tangent derives from the tangent of the phase angle between the resistive and reactive components of a system of complex permittivity. The property is dimensionless and is often referred to a "Loss Factor" "Dissipation Factor" and "Dielectric Loss".

In electronics, "leakage" is the gradual transfer of electrical energy across a boundary normally viewed as insulating, such as the spontaneous discharge of a charged capacitor, magnetic coupling of a transformer with other components, or flow of current across a transistor in the "off" state or a reverse-polarized diode. Another type of leakage can occur when current leaks out of the intended circuit, instead flowing through some alternate path. This sort of leakage is undesirable because the current flowing through the alternate path can cause damage, fires, RF noise, or electrocution.

"Leakage current" as used herein, refers to the gradual loss of energy from a charged capacitor, primarily caused by electronic devices attached to the capacitor, such as transistors or diodes, which conduct a small amount of current even when they are turned off "Leakage current" also refers any current that flows when the ideal current is zero. Such is the case in electronic assemblies when they are in standby, disabled, or "sleep" mode (standby power). These devices can draw one or two microamperes while in their quiescent state compared to hundreds or thousands of milliamperes while in full operation. These leakage currents are becoming a significant factor to portable device manufacturers because of their undesirable effect on battery run time for the consumer.

"Photoimageable", as used herein, refers to the ability of a compound or composition to be selectively cured only in areas exposed to light. The exposed areas of the compound or composition are thereby rendered cured and insoluble, while the unexposed (e.g., masked) areas of the compound or composition remain un-cured and therefore soluble in a "developer" solvent in which the uncured compound or composition is soluble. Typically, this operation is conducted using ultraviolet light as the light source and a photomask as the means to define where the exposure occurs. The selective patterning of dielectric layers on a silicon wafer can be carried out in accordance with various photolithographic techniques known in the art. In one method, a photosensitive polymer film ("photoresist film") is applied over a desired substrate surface and dried. A "photomask" (e.g., an opaque plate with holes or transparencies that allow light to shine through in a defined pattern; see, for example, FIG. 7A) containing the desired patterning information is then placed in close proximity to the photoresist film. The photoresist is irradiated through the overlying photomask by one of several types of imaging radiation including UV light, e-beam electrons, x-rays, or ion beam. Upon exposure to the radiation, the polymer film undergoes a chemical change (cross-links) with concomitant changes in solubility. After irradiation, the film-coated substrate is soaked in developer solution that selectively removes the non-crosslinked or unexposed areas of the film. "Photolithography" is the term used to describe this general process (and variations thereof) for providing selective, patterned access to an underlying substrate.

"Passivation" as used herein, refer to the process of making a material "passive" in relation to another material or condition. "Passivation layers" refers to layers that are commonly used to encapsulate semiconductor devices, such as semiconductor wafers, to isolate the device from its immediate environment and, thereby, to protect the device from oxygen, water, etc., as well airborne or space-borne contaminants, particulates, humidity or any contaminant that could affect the integrity of the underlying passivated layer. Passivation layers are typically formed from inert materials that are used to coat the device. This encapsulation process also passivates semiconductor devices by terminating dangling bonds created during manufacturing processes and by adjusting the surface potential to either reduce or increase the surface leakage current associated with these devices.

In certain embodiments of the invention, "passivation layers" (PLs) contain dielectric material that is disposed over a microelectronic device. Such PLs are typically patterned to form openings therein that provide for making electrical contact to the microelectronic device. Often a passivation layer is the last dielectric material disposed over a device and serves as a protective layer.

The terms "Interlayer Dielectric Layer" and "ILD" refer to a layer of dielectric material disposed over a first pattern of conductive traces, separating it from a second pattern of conductive traces, which can be stacked on top of the first. Such ILD layer is typically patterned or drilled to provide openings (referred to as "vias", short for "vertical interconnect access" channels) allowing electrical contact between the first and second patterns of conductive traces in specific regions or in layers of a multilayer printed circuit board. Other regions of such ILD layers are devoid of vias to strategically prevent electrical contact between the conductive traces of first and second patterns or layers in such other regions.

"Redistribution layer" or "RDL" as used herein, refers to an extra conductive element (e.g., metal layers or metallization lines) added onto a chip that makes the "I/O" (input-output) pads of an integrated circuit ("IC") available in other locations. The extra conductive elements are isolated by layers of passivating material, as described below.

"Fan-out package" as used herein, refers to a I/O circuit package in which a silicon chip is extended by molding the chip in a dielectric material (e.g., an epoxy resin) to extend the size of the chip. I/O pads of the silicon chip can be made available to the fan-out region using RDL.

As used herein, "B-stageable" refers to the properties of an adhesive having a first solid phase followed by a tacky rubbery stage at elevated temperature, followed by yet another solid phase at an even higher temperature. The transition from the tacky rubbery stage to the second solid phase is thermosetting. However, prior to thermosetting, the material behaves similarly to a thermoplastic material. Thus, such adhesives allow for low lamination temperatures while providing high thermal stability.

A "die" or "semiconductor die" as used herein, refers to a small block of semiconducting material, on which a functional circuit is fabricated.

A "flip-chip" semiconductor device is one in which a semiconductor die is directly mounted to a wiring substrate, such as a ceramic or an organic printed circuit board. Conductive terminals on the semiconductor die, usually in the form of solder bumps, are directly physically and electrically connected to the wiring pattern on the substrate without use of wire bonds, tape-automated bonding (TAB), or the like. Because the conductive solder bumps making connections to the substrate are on the active surface of the die or chip, the die is mounted in a face-down manner, thus the name "flip-chip."

"Hard blocks" or "hard segments" as used herein refer to a block of a copolymer (typically a thermoplastic elastomer) that is hard at room temperature by virtue of a of high melting point (Tm) or $T_g$. By contrast, "soft blocks" or "soft segments" have a $T_g$ below room temperature.

The present invention is based on the applicant's decades-long work on polyimides for use in a myriad of applications in the electronics industry. Simultaneously, the industry has advanced the limits of electronics performance and complexity exponentially. Increasing miniaturization of components and devices have accentuated the need for increasingly high-performance passivating polymers, formulations and layers to isolate and protect tightly-packed functionalities.

The invention is also based on recognition that polyimides developed by the applicant possess many properties necessary to meet these increased demands compared to industry-standard, conventional polyimides, synthesized through a polyamic acid intermediate. Specifically, the chain-propagated polyimides polymers of the invention have flexible, aliphatic backbones in place of the aromatic-ether backbones found in conventional polyimide polymers. Due to their imide linkages, polyimide polymers described herein have the same high-temperature resistance as conventional polyimides, yet exhibit lower shrinkage, and thereby reduce stress placed on wafers and silicon-based components in comparison to conventional polyimides. Thus, polyimides of the invention reduce the potential for delamination and warpage of semiconductor interconnection layers in applications where tolerance of these deficiencies leaves little room for error. Passivating formulations of the invention incorporating the high-performance, chain-propagated polyimides described herein are less subject to stress effects than conventional polyimides, and thus, are more suitable for use with very thin silicon wafers. Moreover, polyimides of the invention absorb substantially less moisture than conventional polyimides used in coatings, and therefore provide better protection from and less change due to frequently encountered environmental conditions.

Conveniently, uncured polyimides of the invention are fully imidized and are soluble in common organic solvents (e.g., aromatics and ketones) used in passivating applications, such as redistribution layer. Furthermore, once cured, the polyimide-containing formulations of the invention are insoluble in and thus photolithographically developable by, common solvents such as cyclopentanone, cyclohexanone, propylene glycol monomethyl ether acetate (PGMEA), propylene glycol dimethyl ether, as well as combinations of these solvents and alcohols, ethers, esters and ketones. These and other properties make invention polyimides photoimageable, thereby allowing patterning of passivation and redistribution layers.

The present invention thus provides passivating formulations that are useful as protective and insulating coatings, and for isolating conductive traces and lines on a chip, printed circuit boards, multilayer wiring boards, package, devices and the like. Exemplary layers include passivation layers, interlayer dielectric layer, and redistribution layers (RDL) including fan-out RDLs.

The passivating invention formulations provided by the present invention include at least one curable, functionalized polyimide having a structure according to Formula I:

Formula I

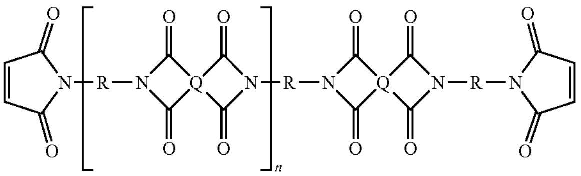

where R is substituted or unsubstituted aliphatic, cycloaliphatic, alkenyl, aromatic, heteroaromatic; Q is substituted or unsubstituted aliphatic, cycloaliphatic, alkenyl, aromatic, heteroaromatic; and n is an integer having the value from 1-100.

In some embodiments, n is 1-50, 1-25, 1-10, 1-9, 1-8, 1-7, 1-6, 1-5, 1-4, 1-3, 1-2 or as low as 1.

In certain embodiments, at least one R or Q comprises a $C_{36}$ moiety is tricyclodecyl dimethyl, norbornyl dimethyl; cyclohexane dimethyl; cyclohexyl, isophoronyl; methylenebis (cyclohexyl) dimethyl; or methylenebis(2-methylcyclohexyl) dimethyl.

Exemplary polyimides suitable for use in formulations of the invention include:

Compound 1

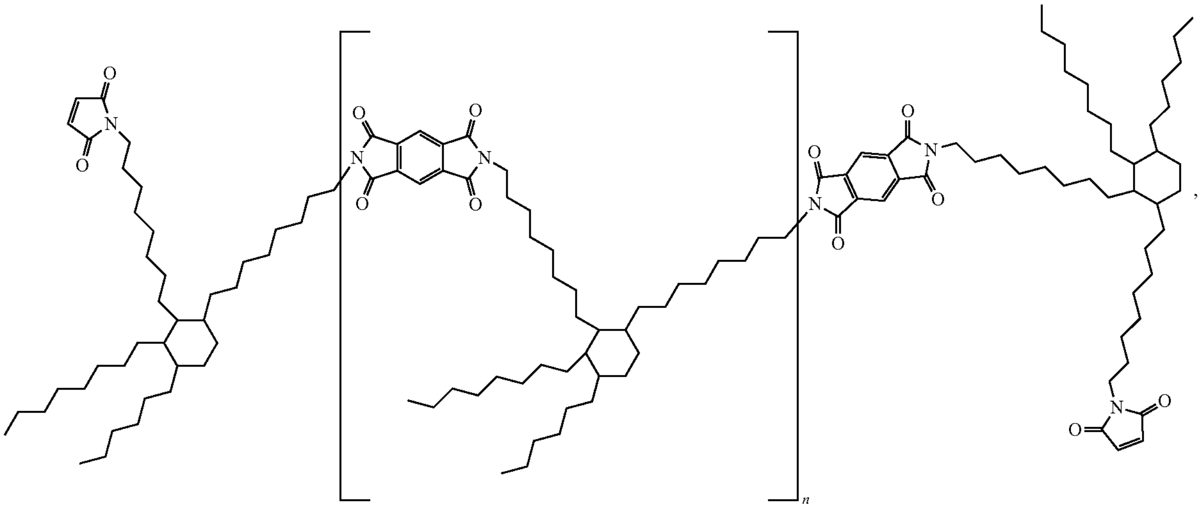

,

-continued
Compound 2
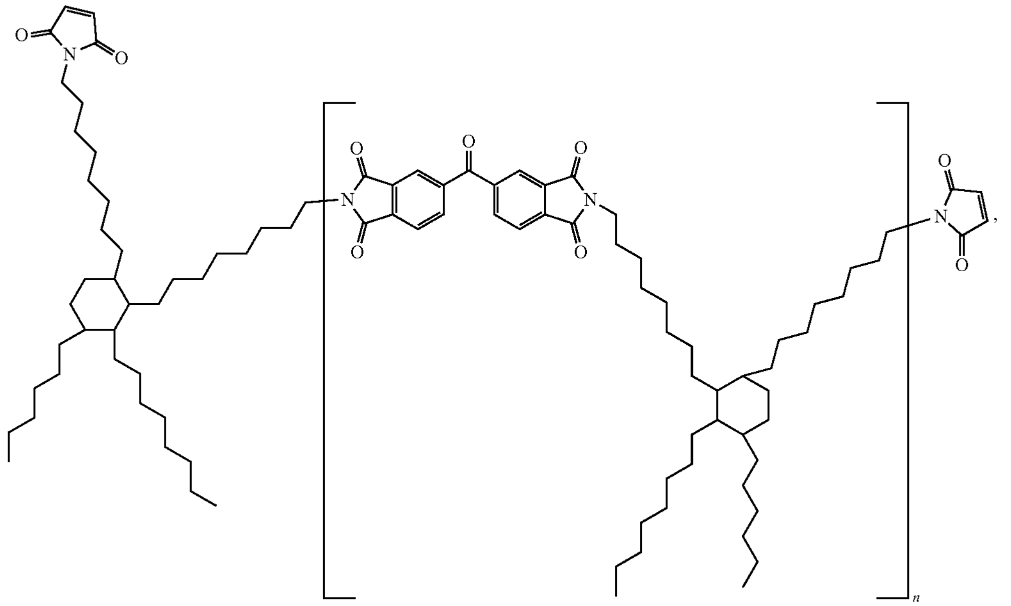
Compound 3
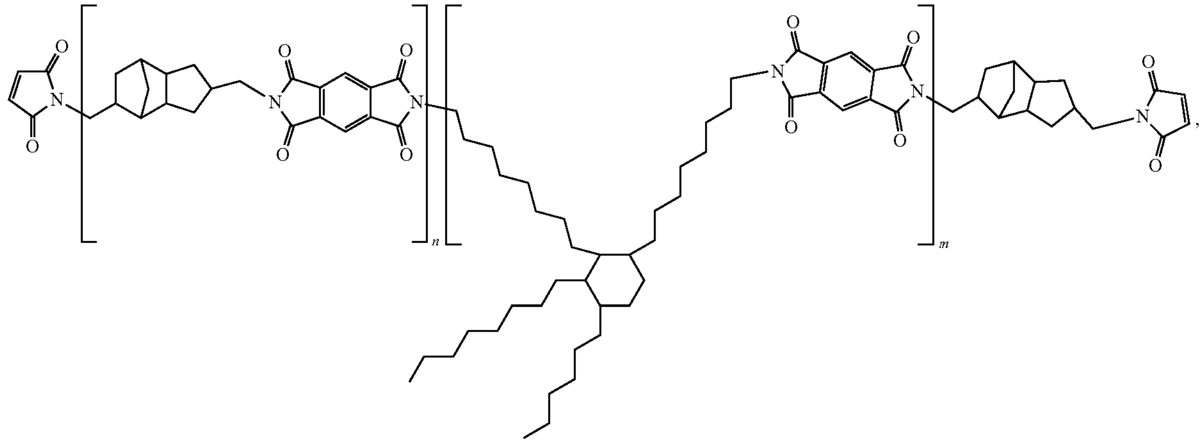
Compound 4
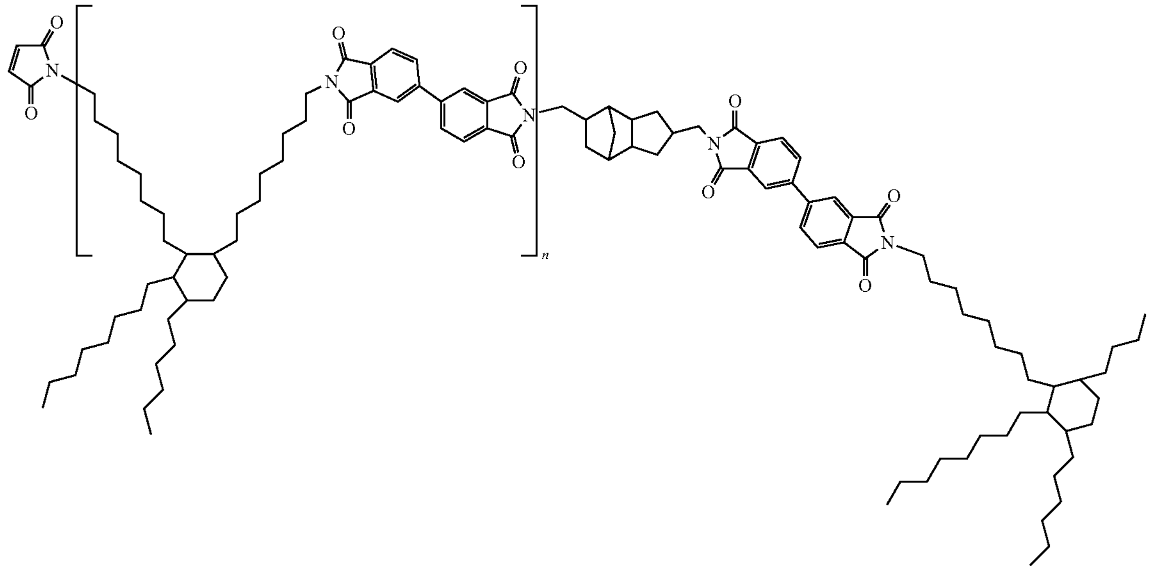

-continued
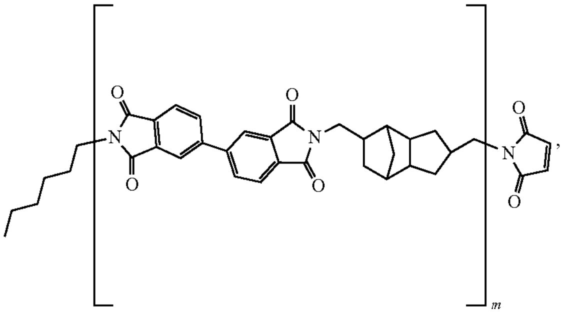
,
Compound 5
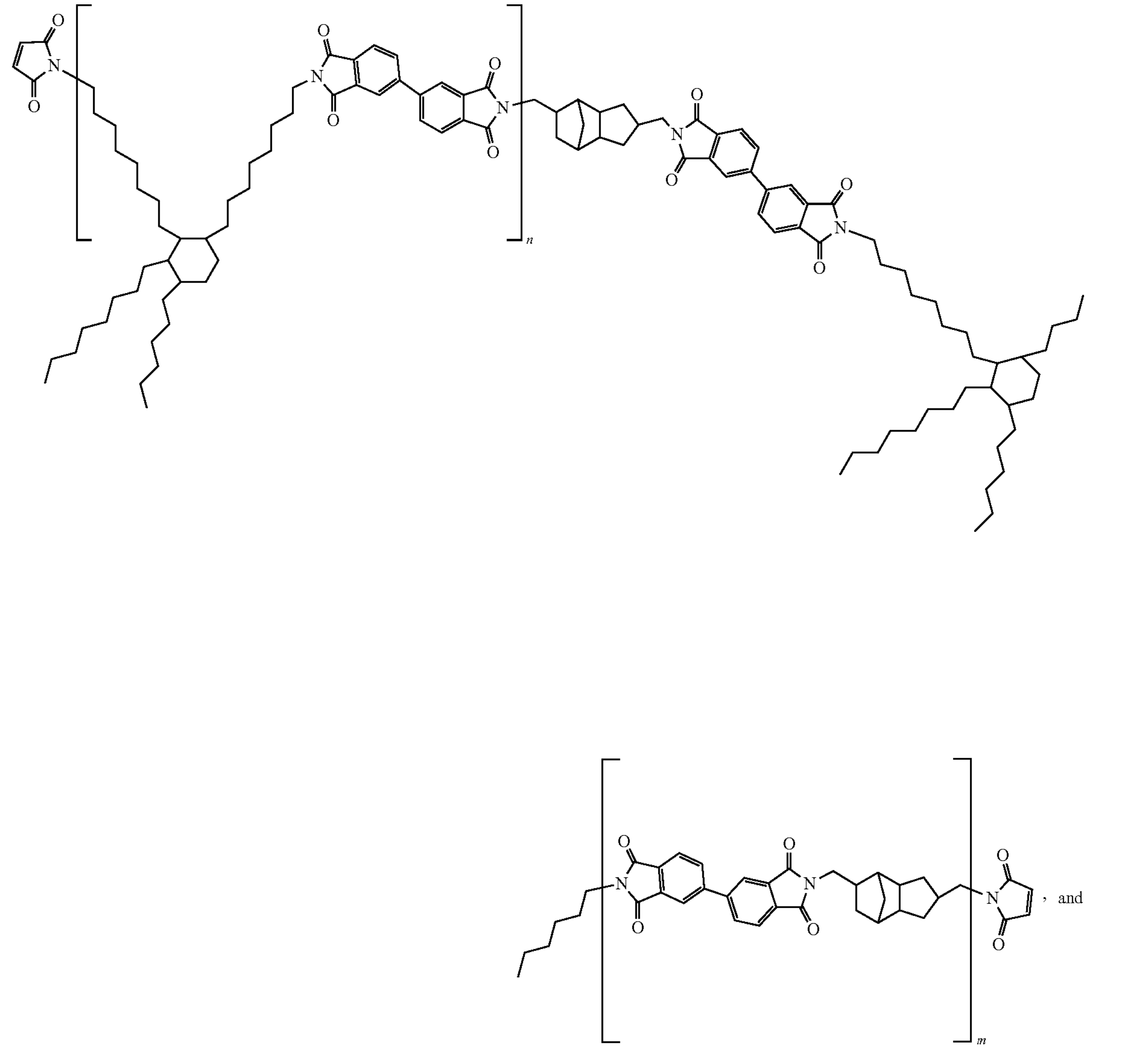
, and

-continued

Compound 6

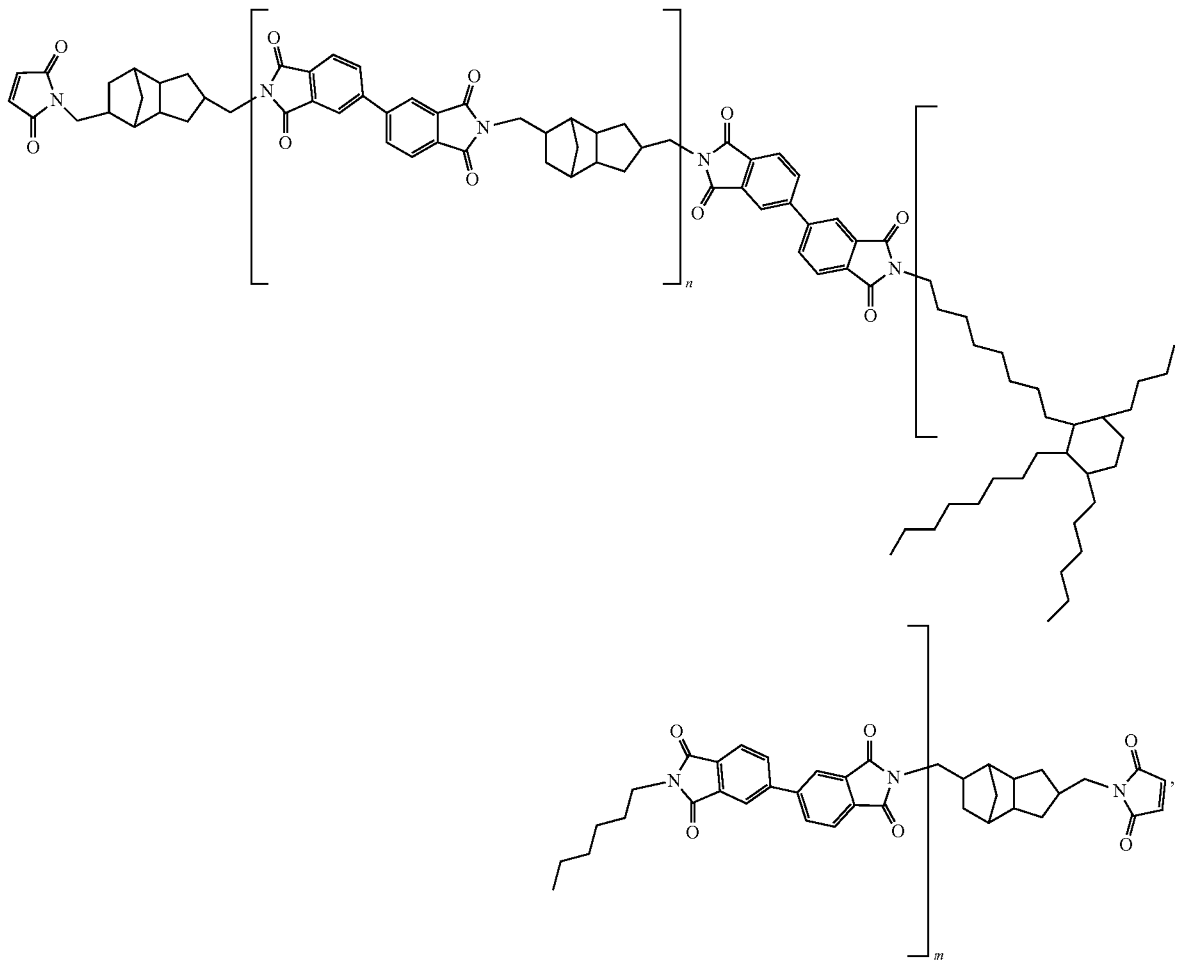

where each n and m is an integer having the value from 1-50.

The polyimides may be used independently as the monomer in a polymeric composition, such as a passivation layer or redistribution layer formulation, or may be combined with other materials and reagents to prepare wafer redistribution layer compositions. In certain aspects, the polyimides is used as the sole photoimageable thermoset/monomer of a redistribution layer composition of the invention.

In other embodiments, the curable functionalized polyimides may be combined with other curable functionalized polyimides, and other monomers, such as thermoset monomers, reactive diluents, to make fully formulated redistribution layer compositions.

In yet another embodiment of the invention two or more of the curable functionalized polyimides may be used in combination as a redistribution layer.

In certain aspects of the invention, combining two or more curable, functionalized polyimides according to Formula I imparts properties to the formulation that are not found in compositions with only a single polyimide. For example, certain higher molecular weight polyimides (e.g., ≥10,000 Daltons) failed to adequately UV-cure under short duration, low temperature (e.g., room temperature) conditions. While such formulations can be cured by including a higher temperature (<200° C.), oven cure for a short duration of a few minutes, this additional step may not be desirable in certain circumstances. Combining a lower molecular weight (e.g., <10,000 Daltons) vastly increased curing under these conditions (see EXAMPLE 7, below).

Thus, in certain aspects, the invention provides passivating formulations that include a mixture of two or more curable, functionalized polyimides: a lower molecular weight first polyimide (e.g., <10,000 Da) such as Compounds 1 and 2; and a higher molecular weight second polyimide or polyimides (e.g., ≥10,000 Da) such as Compounds 3-6.

The lower molecular weight, first polyimide can have an average molecular weight below about 10,000 Da, which may be between about 2,000 Da and about 7,500 Da, such as between about 9,500 Da and about 1,500 Da; between about 8,500 Da and about 2,500 Da; between about 7,500 Da and about 2,000 Da; or, about 9,000 Da, about 8,000 Da, about 7,000 Da, about 6,000 Da, about 5,000 Da, about 4,000 Da, about 3,000 Da about 2,000 Da or about 1,000 Da.

The higher molecular weight second polyimide or polyimides generally has a molecular weight above 10,000 Da, above 15,000 Da, above 20,000 Da, above 25,000 Da, above 30,000 Da, above 40,000 Da, or above 50,000 Da, such as between about 11,000 Da and 100,000 Da, between about 15,000 Da and 75,000 Da, between about 17,000 Da and 60,000 Da.

The first curable, functionalized, flexible polyimide is generally flexible and has a CTE of at least about 100 ppm/° C., at least about 150 ppm/° C., or at least about 200 ppm/° C. The T The second curable, functionalized, polyimide can be much less flexible, with a CTE below about 100 ppm/° C., below about 70 ppm/° C., below about 50 ppm/° C., or even below about 40 ppm/° C. In certain embodiments, second curable, functionalized, polyimide has a CTE between about 40 ppm/° C. and about 80 ppm/° C., or between about 45 ppm/° C. and about 75 ppm/° C. In certain embodiment e second curable, functionalized polyimide can have a $T_g$ of at least about 100° C., at least about 120° C., at least about 130° C., at least about 140° C., at least about 150° C.

The passivating formulation of claim 16, wherein the at least one second curable, functionalized polyimide has a $T_g$ between about 100° C. and about 150° C.

The curable, functionalized polyimide(s) is generally the predominant components on a weight basis in the passivating formulations provided herein. The total amount of curable, functionalized polyimide(s) in the formulations is amount about 50 wt % to about 98 wt %, based on the total weight of the composition minus the solvent. In certain embodiments of the invention, the curable functionalized polyimide is present in a composition, such as a redistribution layer composition, in an amount that is about 60 wt % to about 90 wt %, frequently about 65 wt % to about 80 wt %, and most often about 70 wt % to about 80 wt %, based on weight of the composition excluding any solvents present.

The at least one first curable, functionalized flexible polyimide can be about 15 wt % to about 80 wt % of the formulation, such as about 15 wt %, about 25 wt %, about 25 wt %; about 35 wt %, about 45 wt %, about 55 wt %, about 65 wt %, or about 75 wt %. In certain embodiments, the first polyimide comprises about 15 wt % to about 25 wt % of the formulation.

The at least one second curable, functionalized polyimide generally comprises about 45 wt % to about 75 wt %, such as about 45 wt %, about 40 wt %, about 50 wt %; about 55 wt %, about 60 wt %, about 65 wt %, about 70 wt %, or about 75 wt %.

The at least one first curable, functionalized, flexible polyimide can be, for example, Compound 1, Compound 2, and combinations thereof. The at least one second curable, functionalized polyimide can be Compound 3, Compound 4, Compound 5, Compound 6, and mixtures thereof.

Passivating Formulations

The invention provides passivating formulations that include:

a) at least one curable, functionalized polyimide compound or mixture of compounds as described herein; and
b) at one reactive diluent and/or co-curing compound; or
c) at least one adhesion promoter; or
d) at least one coupling agent; or
e) at least one UV initiator; or
f) at least one solvent, or
g) any combination thereof.

In other embodiments, the passivating formulations of the invention include:

a) at least one curable, functionalized polyimide compound or mixture of compounds as described herein; and
b) at least one reactive diluent, co-curing compound, or a combination thereof;

c) at least one coupling agent, adhesion promoter or a combination thereof; and
d) at least one curing initiator.

Curable, Functionalized Polyimide Compound Mixtures

In certain embodiments, the passivating formulation include a mixture of Compound 1 and/or Compound 2 plus and combination of one of more of: Compound 3, Compound 4, Compound 5, and Compound 6. For example, the passivating formulation includes a mixture of Compound 1 and Compound 4, or a mixture of Compound 1 and Compound 5.

In yet other embodiments, the passivating formulation includes a mixture of any of Compound 3, Compound 4, Compound 5, and/or Compound 6 and an effective amount of Compound 1 and/or Compound 2 to cure the formulation upon UV irradiation.

Reactive Diluents and Co-Reactants

The curable polyimides may require the addition of thermally-stable co-reactants or reactive diluents to UV cure fully. These additional compounds include but are not limited to liquid $C_{36}$ bismaleimide of dimer diamine, the divinyl ether of dimer diamine, the diacrylate of dimer diamine; acrylics and vinyl ether resins.

In certain aspects, the passivating formulations of the include at least one "co-reactant", which is a monomer, oligomer or polymer that can co-cure with the curable, functionalized polyimide compound(s).

Co-reactants include, for example, epoxies (e.g., epoxies based on glycidyl ethers of alcohols, phenols, bisphenols, oligomeric phenolics, phenolic novolacs, cresolic novolacs, acrylates, methacrylates, maleimides, poly-phenol compounds (e.g., poly(4-hydroxystyrene)), anhydrides, dianhydrides, polyanhydrides such as styrene-maleic anhydride co-polymers, imides, carboxylic acids, dithiols, polythiols, phenol functional mono-maleimides, bismaleimides, polymaleimides, mono-itaconates, mono-maleates, mono-fumarates, acrylic acid, methacrylic acid, cyanate esters, vinyl ethers, vinyl esters, or phenol functional esters, ureas, amides, polyolefins (e.g., amine, carboxylic acid, hydroxy, and epoxy functional) siloxanes (e.g., epoxy, phenolic, carboxylic acid, or thiol functional), cyanoacrylates, allyl functional compounds and styrenic, as well as combinations thereof.

Co-monomer co-reactants suitable for use in the polyimide containing composition include but are not limited to, acrylates methacrylates, acrylamides, methacrylamides, maleimides, vinyl ethers, vinyl esters, styrenic compounds, allyl functional compounds, epoxies, epoxy curatives, and olefins.

"Reactive diluents" according to the present invention, are materials that reduce the viscosity of processing and become part of the cured passivation layer during its curing via copolymerization.

"Diluents" as used herein, are added to formulations to reduce their viscosity by adjusting rheology. In addition, they can facilitate interactions between components in the formulation by softening and solvating reactants in film formulations, thereby promoting curing.

The curable polyimides may require the addition of thermally-stable co-reactants or reactive diluents to UV cure fully. These additional compounds include but are not limited to liquid $C_{36}$ bismaleimide of dimer diamine, the divinyl ether of dimer diamine, the diacrylate of dimer diamine; acrylics and vinyl ether resins.

The following acrylates are non-limiting examples of suitable reactive diluents used in the practice of the invention.

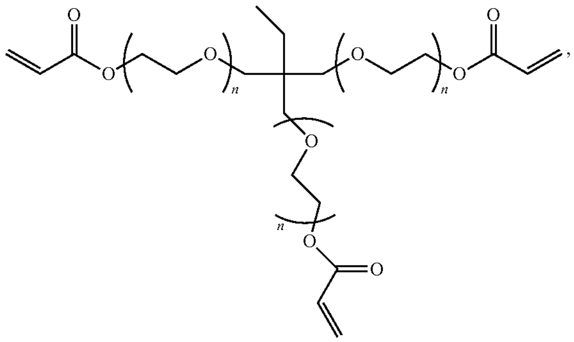

,

SR-454 Ethoxylated Trimethylolpropane Triacrylate

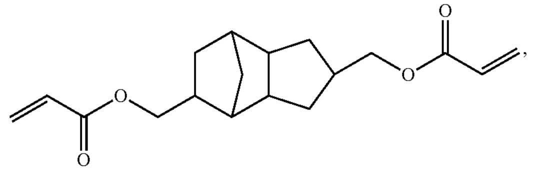

, and

SR-833S Tricyclodecane Dimethanol Diacrylate

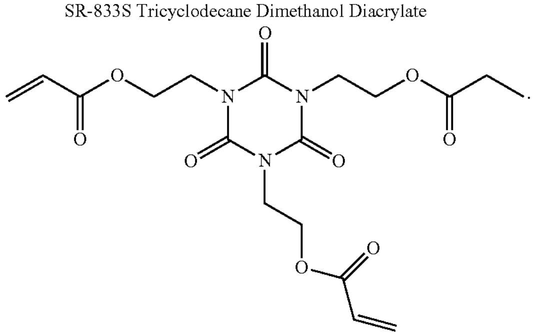

.

Tris(2-Acryloxyethyl)isocyanurate

Co-reactants and reactive diluents are typically present in amount from 10 wt % to about 40 wt %. In such aspects, the composition will typically contain an amount of the co-curing compound and/or reactive diluent equal to at least about 10 wt %, at least about 20 wt %, at least about 30 wt %, or at least about 40 wt % of the formulation.

Coupling Agents and Adhesion Promoters

As used herein, the term "coupling agent" refers to chemical species that are capable of bonding dissimilar materials, such as an inorganic material and an organic material, and are particularly useful for bonding to mineral surfaces. Coupling agents are frequently bifunctional molecules, where one functionality is able to react with a mineral surface and the other with a polymer, thus coupling the two together. Coupling agents thus facilitate linkage of a passivation layer to the substrate to which it is applied.

Coupling agents are typically silanes, titanates or zirconates that form covalent bonds with a substrate. For example, Si—OH groups on the surface of silicon wafers react with the silane coupling agents to form Si—O—Si covalent linkages, typically at temperatures of over 100° C.

Exemplary coupling agents contemplated for use in the practice of the present invention include silicate esters, metal acrylate salts (e.g., aluminum methacrylate), titanates (e.g., titanium methacryloxyethyl acetoacetate triisopropoxide), zirconates, or compounds that contain a co-polymerizable group and a chelating ligand (e.g., phosphine, mercaptan, acetoacetate, and the like). In some embodiments, the coupling agent contains both a co-polymerizable function (e.g., vinyl, acrylate, methacrylate, epoxy, thiol, anhydride, isocyanate, and phenol moieties) and a silicate ester function. The silicate ester portion of the coupling agent is capable of condensing with metal hydroxides present on the mineral surface of substrate, while the co-polymerizable function is capable of co-polymerizing with the other reactive components of invention wafer passivation compositions. In certain embodiments coupling agents contemplated for use in the practice of the invention are oligomeric silicate coupling agents such as poly (methoxyvinyl siloxane). Coupling agents that may be used in the practice of the present invention also include the epoxy-based coupling agent, 2-(3,4 epoxycyclohexyl) ethyltrimethoxysilane, and an amine-based coupling agent, N-Phenyl-3-aminopropyltrimethoxysilane. Both of these coupling agents are simultaneously considered to be adhesion promoters.

In yet another embodiment of the invention the addition of amino-functionalized silanes is contemplated for use in the practice of the invention. Not wishing to be bound by any one theory, the amino-functionalized coupling agents have been shown to adhere to the copper surface and prevent copper oxide migration into the resin, which is a great concern due to delamination that occurs without the surface treatment.

The amino-functionalized coupling agents contemplated for use in the practice of the invention include, but are not limited to: 3-aminopropyltrimethoxysilane; 3-aminopropyltriethoxysilane; N-phenyl-3-aminopropyltrimethoxysilane; N-2-(aminoethyl)-3-aminopropylmethyldimethoxysilane; an N (aminoethyl)-3-aminopropyltrimethoxysilane.

In yet another embodiment of the invention two or more coupling agent may be used in combination to obtain the ultimate adhesion to a copper surface.

"Adhesion promoters" are bi-functional materials that increase adhesive strength between a coating and a substrate. Adhesion promoters increase adhesion by incorporating functional additives that can chemically bond to compounds in the formulation and/or the substrate, which can include bi-functional, surface active agents and other molecules with short organic chains used in low concentrations.

Adhesion promoters are similar to coupling agents, but generally do not form covalent bonds to substrates or to polymer formulations. Adhesion promoters, nevertheless, have an affinity for both substrates and polymer formulations, which may be ionic interactions, and other non-covalent types bonding.

Adhesion promoters are particularly useful when bonding to silicon wafers that include copper plating, such as in RDL applications. Certain adhesion promoters have affinity for both silicon and for copper. Adhesive promoters contemplated for use in these situations include carboxylic acids, anhydrides and amines Specific examples include polybutadiene with grafted maleic anhydride groups, and 4-META (4-methacryloyloxyethyl trimellitate anhydride). Adhesion promoters can also be used in combinations, to increase adhesion to copper. 3-(Triethoxysilyl)propyl-succinic anhydride is useful in combinations to improve adhesion to copper surfaces, particularly under hot and humid conditions.

In RDL applications, copper oxide on the surface of a wafter has been observed to migrate from a copper-plated surfaces into the resin matrix of an applied coating (such as a passivating or RDLs), thereby causing delamination. Combinations of coupling agents (especially N-phenyl-3-aminopropyltrimethoxysilane) helps to keep copper oxide in place and promotes better adhesion surface in RDL application.

Certain other adhesion promoters may be added to the formula to aid in the adhesion to silicon and/or copper, non-limiting examples of suitable adhesion promoters include, but are not limited to, maleated RICON® (maleated polybutadiene), maleimido-carboxylic acids, and 4-META (shown below).

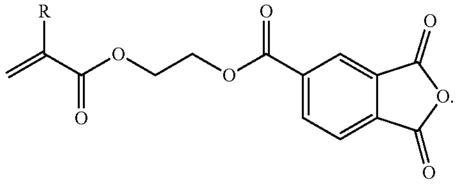

4-Methacryloxyethyl Trimellitate Anhydride
(4-META)

Solvents

In certain embodiments, a solvent may be employed in the practice of the invention. For example, when a passivation formulation in and RDL application is spin-coated onto a circular wafer, it is desirable to have an even coating over the entire wafer, i.e., the solvent or solvent system must have the ability to deliver the same amount of material to each point on the wafer, from the center of the wafer to the edges. Ideally, the solution of the redistribution layer compound is "Newtonian", with a thixotropic slope of 1.0. In certain embodiments, the solutions used to dispense the redistribution layer compound have slopes ranging from 1.0 to about 1.2.

In some embodiments, the solvent or solvent system has a boiling point ranging from about 100° C. up to about 220° C. In particular embodiments, the solvent is anisole.

The polyimides may be used independently as the monomer in a polymeric composition, such as a redistribution layer composition, or may be combined with other materials and reagents to prepare wafer redistribution layer compositions. The polyimides may be used as the sole photoimageable thermoset/monomer of a redistribution layer composition of the invention.

In other embodiments, the curable functionalized polyimides may be combined with other monomers, such as thermoset monomers, reactive diluents, to make fully formulated redistribution layer compositions.

In yet another embodiment of the invention two or more of the curable functionalized polyimides may be used in combination as a redistribution layer.

Synthesis of Photoimageable Polyimides

A fundamental difference between the passivating formulations of the invention (which include at least one curable, functionalized polyimide compound of Formula I) and formulations that include conventional polyimides, is the method by which they are synthesized. As described above, conventional polyimides used in passivating layers are synthesized in situ from a polyamic acid solution, which is then UV cured, followed by high-temperature curing at >200° C. Several hours of such "hard bake" cure is prerequisite to ring closing and full imidization. If full imidization and ring closure are not achieved due to insufficient time or temperature of the hard bake, or to the limitations of performing a reaction when the reactants are immobilized on a substrate, the remaining polyamic acid and incomplete reaction products impart undesirable properties on the "polyimide" product, and downstream reactions thereof.

The general process for synthesizing conventional polyimides is summarized below in Scheme 1, below. Although polyimides are synthesized with sufficient hard bake cure, it is not uncommon to see incomplete ring closure, as shown in in Scheme 1.

Furthermore, the bonds of conventional polyimides are inherently more labile than the equivalent bonds in the polyimides according to the invention, which are generated by a condensation reaction of a diamine with a dianhydride, as illustrated in Scheme 2, below. Scheme 2 illustrates the synthesis and functionalization of polyimides of according to methods the invention. This Scheme 2 shows the generation of an amine-terminated polyimide and subsequent reaction with maleic anhydride to form a bismaleimide. The skilled artisan will appreciate that judicious selection of starting amines and dianhydrides can produce polyimides with a wide range of terminal and pendant reactive, functional groups, while variations in diamine and anhydride ratios can yield compounds with a wide range of molecular weights. By definition, the reactive terminal and pendant functional groups can subsequently be reacted to produce virtually limitless variety of curable moieties.

Scheme 1
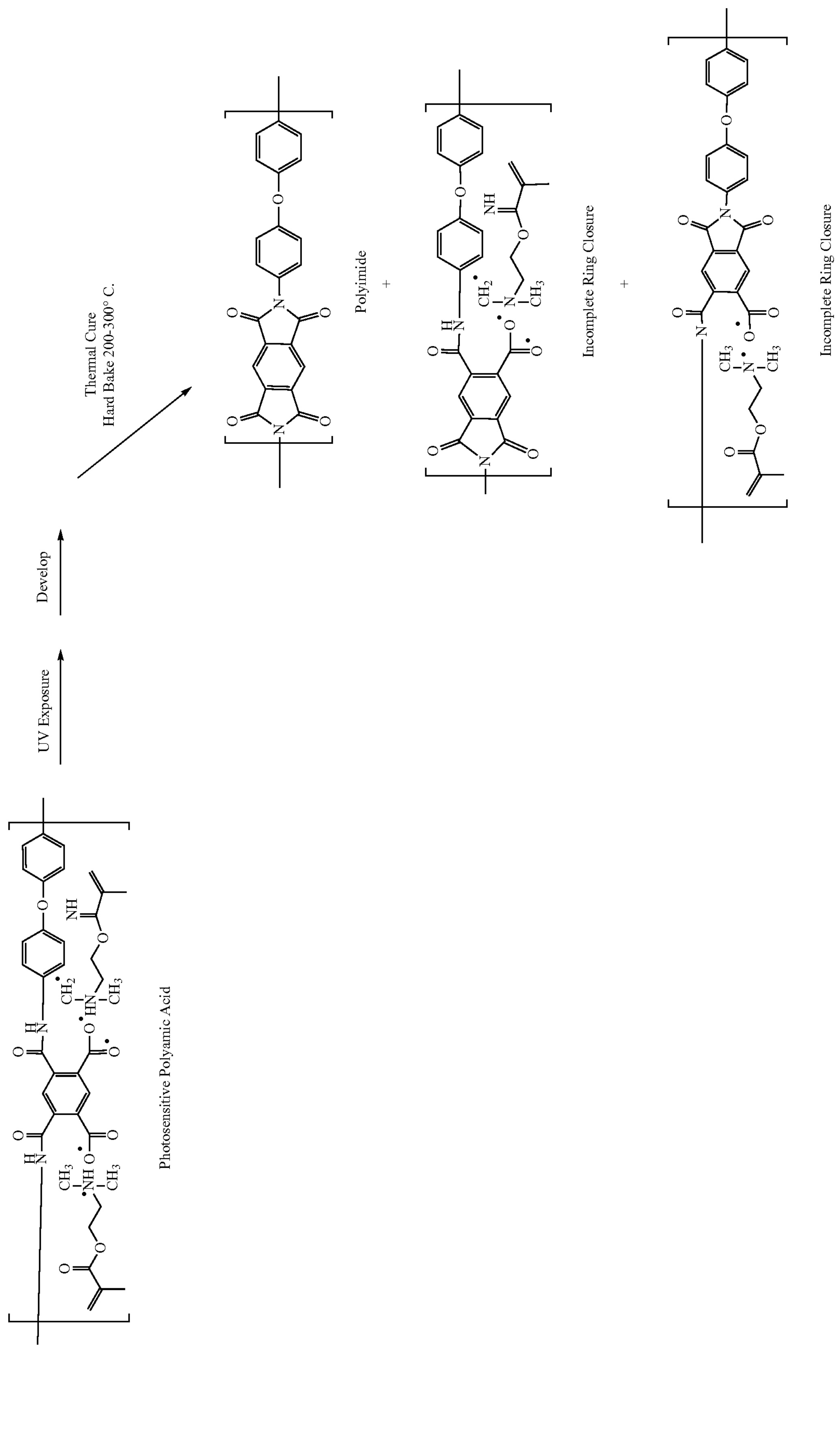
Photosensitive Polyamic Acid
Polyimide
+
Incomplete Ring Closure
+
Incomplete Ring Closure Scheme 2
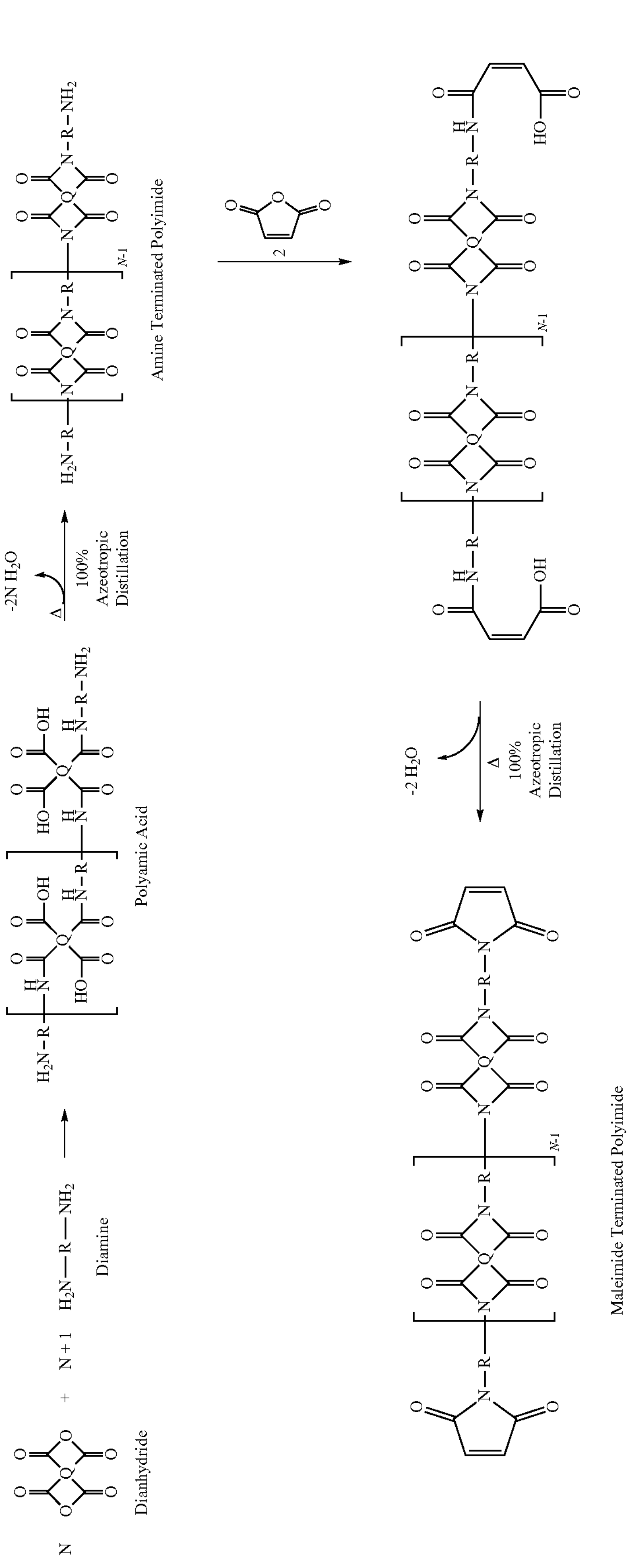

The present invention thus provides passivating formulations comprising at least one curable, functionalized polyimide compound synthesized by condensation of a diamine with an anhydride or dianhydride, and subsequent terminal and/or pendant functionalization. The EXAMPLES describe condensation reactions resulting in amine-terminated polyimides (EXAMPLE 1) and (anhydride-terminated polyimides (EXAMPLES 2-6) while both polyimides can be converted to maleimides. The present invention contemplates functionalization with other reactive groups.

A wide variety of diamines are contemplated for use in the practice of the invention. Examples of diamines suitable for preparing the at least one curable, functionalized polyimide compound include, but are not limited to: dimer diamine; TCD-diamine; 1,10-dimainodecane; 1,12-diaminodecane; 1,2-diamino-2-methylpropane; 1,2-diaminocyclohexane; 1,2-diaminopropane; 1,3-diaminopropane; 1,4-diaminobutane, 1,5-diaminopentane; 1,6-diaminohexane; 1,7-diaminoheptane; 1,8-diaminooctane; 1,9-diaminononane; 3,3'-diamino-N-methyldipropylamine; diaminomaleonitrile; 1,3-diaminopentane; 9-10-diaminophenanthrene; 4,4'-diaminooctafluorobiphenyl; 3,5-diaminobenzoic acid; 3,7-diamino-2-methoxyfluorene; 4,4'-diaminobenzophenone; 3,4-diaminobenzophenone; 3,4-diaminotoluene; 2,6-diaminoanthroquinone; 2,6-diaminotoluene; 2,3-diaminotoluene; 1,8-diaminonaphthalene; 2,4-cumenediamine; 1,3-bisaminomethylbenzene; 1,3-bisaminomethylcyclohexane; 2-chloro-1,4-diaminobenzene; 1,4-diamino-2,5-dichlorobenzene; 1,4-diamino-2,5-dimethylbenzene; 4,4'-diamino-2,2'-bistrifluoromethylbisphenyl; bis(amino-3-chlorophenyl)ethane; bis(4-amino-3,5-dimethylphenyl)methane; bis(4-amino-3,5-diethylphenyl)methane; bis(4-amino-3-ethylphenyl)methane; bis(4-amino-3-ethyl)diaminofluorene; diaminobenzoic acid; 2,3-diamononaphtalene; 2,3-diaminophenol; bis(4-amino-3-methylphenyl)methane; bis(4-amino-3-ethylphenyl)methane; 4,4'-diaminophenylsulfone; 4,4'-oxydianiline; 4,4'-diaminodiphenyl sulfide; 3,4'-oxydianiline; 2,2-bis[4-(3-aminophenoxy)phenyl]propane; 2,2'-bis[4-(4-aminophenoxy)phenyl]propane; 1,3-bis(4-aminophenoxy)benzene; 4,4'-bis(aminophenoxy)bisphenyl; 4,4'-diamino-3,3'-dihydroxybiphenyl; 4,4'-diamino-3,3'-dimethylbiphenyl; 4,4'-diamino-3,3'-dimethyoxybiphenyl; Bisaniline M; Bisaniline P; 9,9-bis(4-aminophenyl)fluorine; o-toluidine sulfone; methylene bis(anthranilic acid); 1,3-bis(4-aminophenoxy)-2,2-dimethylpropane; 1,3-bis(4-aminophenoxy)propane; 1,4-bis(aminophenoxy)butane; 1,5-bis(4-aminophenoxy)butane; 2,3,5'-tetramethylbenzidine; 4,4'-diaminobenzanilide; 2,2-bis(4-aminophenyl) hexafluoropropane; polyalkylenediamines (e.g. Huntsman's Jeffamine D-230, D-400, D2000, and D-4000 products); 1,3-cyclohexanebis(methylamine); m-xylylenediamine; p-xylylenediamine; bis(4-amino-3-methylcyclohexyl)methane; 1,2-bis(2-aminoethoxy)ethane; 3(4),8(9)-bis(aminomethyl)tricycle(5.2.1.0)decane; 1,3-diamino-2-propanol; 3-amino-1,2-propanediol; ethanolamine; and 3-amino-1-propanol.

In specific embodiments of the invention the diamine is selected from the group consisting of: dimer diamine, TCD-diamine and combinations thereof.

A wide variety of anhydrides are contemplated for use in the synthesis of the least one curable, functionalized polyimide compound, include, but are not limited to: biphenyl tetracarboxylic dianhydride; pyromellitic dianhydride; polybutadiene-graft-maleic anhydride; polyethylene-graft-maleic anhydride; polyethylene-alt-maleic anhydride; polymaleic anhydride-alt-1-octadecene; polypropylene-graft-maleic anhydride; poly(styrene-co-maleic anhydride); 1,2,3,4-cyclobutanetetracarboxylic dianhydride; 1,4,5,8-naphtalenetetracarboxylic dianhydride; 3,4,9,10-perylenetetracraboxylic dianhydride; bicyclo(2.2.2)octene-2,3,5,6-tetracarboxylic dianhydride; diethylenetriaminepentaacetic dianhydride; ethylenediaminetetraacetic dianhydride; 3,3',4,4'-benzophenone tetracarboxylic dianhydride; 3,3',4,4'-biphenyl tetracarboxylic dianhydride; 4,4'-oxydiphthalic dianhydride; 3,3',4,4'-diphenylsulfone tetracarboxylic dianhydride; 2,2'-bis(3,3-dicarboxyphenyl)hexafluoropropane dianhydride; 4,4'-bisphenol A diphthalic dianhydride; 5-(2,5-dioxytetrahydro)-3-methyl-3-cyclohexene-1,2-dicarboxylic anhydride; and combinations thereof.

In specific embodiments of the invention, the anhydride is selected from the group consisting of: biphenyl tetracarboxylic dianhydride, pyromellitic dianhydride, and combinations thereof.

Passivating Polyimide Formulations

The present invention provides passivating formulations containing at least one fully-imidized, functionalized polyimide polymer suitable for spin coating onto a wafer comprising multiple microelectronic devices. photoimageable polyimide according to formula I, as described above.

An individual photoimageable polyimide of Formula I may be used independently as the primary monomer in a passivating formulation or may be combined with other photoimageable polyimides of Formula I, other materials and reagents to prepare a passivating formulation.

Advantageously, cured aliquots of the passivating formulations described herein have a $T_g$ of at least about 90° C., at least about 100° C., at least about 110° C., or at least about 120° C., and have a percent elongation of at least about 40%, at least about 45%, at least about 50%, or at least about 55%. In certain aspects, the cured aliquot of the passivating formulation has a has a $T_g$ of at least about 100° C. and a percent elongation of at least about 40%.

The passivating formulations are suitable for use in any application requiring separation between elements or functionalities, particularly conductive metallization, such as lines, traces and contact pads. The present invention thus provides passivating formulations suitable for use as passivation layers, RDL, and IDL and methods for using the same. Also provided are passivated chips, devices, packages and the like, or any portion thereof having a cured layer of a passivating formulation described herein. FIG. 1 is a schematic flow diagram illustrating the general process for passivating an electronic component, such as a chip, device or package. The top view shows a chip 1 adhered to a substrate 2 (such as a printed circuit board). The first step (step A of FIG. 1) is to apply a layer of a passivating formulation according to the invention, to the component or portion thereof. The middle view of FIG. 1 shows the formulation being poured from a beaker 4 onto the chip which is intended to generically represent all forms of application. The skilled artisan will appreciate that various methods are encompassed by the invention, which can be used to apply the formulation, including but not limited to, painting, brushing, spraying, doctor blading, dipping, spin-coating, and molding as well as pouring. The formulation can be applied to the entire surface of the component including the top, bottom and all sides, or it a can be applied to only a portion of the component. FIG. 1 shows applying the formulation 3 to chip 1 when it is adhered to substrate 2, thereby applying to only the top and side portions of the chip. In this representation, the formulation flows over chip 1 and onto an adjacent portion of substrate 2. In other embodiments of the invention, the entire surface of the component (e.g., chip 1) is covered; excess formulation 3 can be subsequently removed by any method known in the art. For example, excess applied formulation can be scraped off the substrate. In other aspects, removal can be performed by photolithography to remove excess formulation from undesired portions of chip 1, such as those portions covering contact points or vias.

The bottom view (Step B) of FIG. 1 illustrates curing the formulation applied to chip 1 using UV irradiation, to form passivated chip 5. Once cured, (e.g., UV-cured) the polyimide-containing passivating formulations of the invention are developable in common solvents such as cyclopentanone and cyclohexanone.

Figure 2:
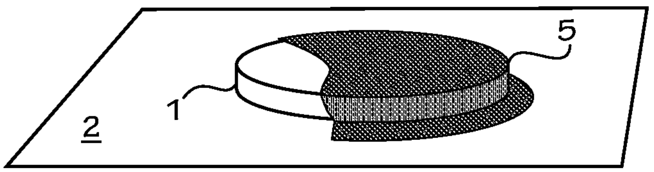
FIG. 2 is a cut-away view of a passivated chip prepared by the process shown in FIG. 1.

A cut-away view of passivated chip 5 is shown in FIG. 2, having a cured layer 4 of passivating formulation over the underlying chip 1.

Redistribution Layers

Redistribution layers are a type of passivation-metallization structure that provide a way to make bond pads in one location on a chip available in other locations on the chip, or beyond (e.g., in the case of fan-out packages, described below). Using RDL, bond pads (metallized pads for connecting wires, traces, lines of metallization, and the like), can be functionally moved around the face of the die, (e.g., for flip-chip applications), which can separate narrowly spaced or high-density sites for solder balls, and thereby distribute the stress of mounting. In stacked die packages, RDL layers allow unique positions for address lines using identical, generic chips. Furthermore, bond pads can be moved to more convenient locations based on the overall geometry of the chip and surrounding packages and connections.

RDL Formulations. Formulations developed for passivation layers are used with minor modification.

In general, the redistribution layer compositions of the invention can be photoimaged under the exposure to UV light at or near room temperature. All non-developed portions of the film can then be removed via soaking in, or application of a jet spray of, an appropriate solvent or combination of solvents. The remaining photo-cured polyimide film can then be fully cured via a post-bake at 125-175° C. for approximately fifteen minutes to one hour.

Inhibitors for free-radical cure may also be added to the compositions described herein to extend the useful shelf life. Examples of free-radical inhibitors include hindered phenols such as 2,6-di-tert-butyl4-methylphenol; 2,6-di-tert-butyl-4-methoxyphenol; tert-butyl hydroquinone; tetrakis (methylene (3,5-di-tert-butyl-4-hydroxyhydrocinnamate)) benzene; 2,2'-methylenebis(6-tertbutyl-p-cresol); and 1,3,5-trimethyl-2,4,6-tris(3',5'-di-tertbutyl-4-hydroxybenzyl) benzene. Other useful hydrogen donating antioxidants such as derivatives of p-phenylenediamine and diphenylamine. It is also well known in the art that hydrogen-donating antioxidants may be synergistically combined with quinones and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl) hydrazine; oxalyl bis (benzylidene hydrazide); and N-phenyl-N'-(4-toluenesulfonyl)-p-phenylenediamine amine.

Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

Figure 3:
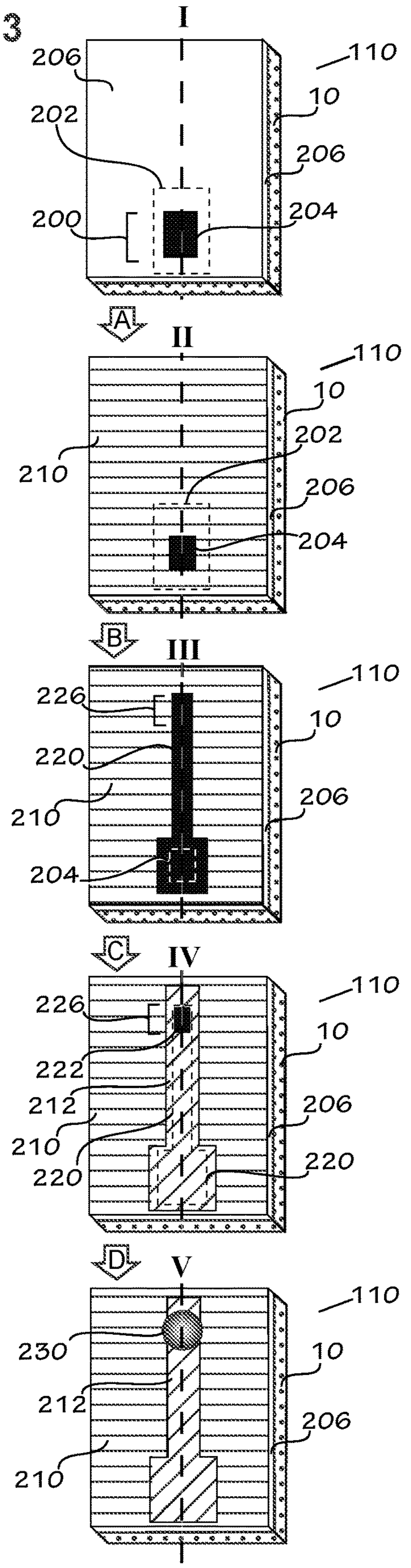
FIG. 3 is a schematic flow diagram illustrating the process of redistributing an I/O pad using a Redistribution Layer (RDL) according to an embodiment of the invention. Arrows A-D indicate steps in the process.
Figure 4A:
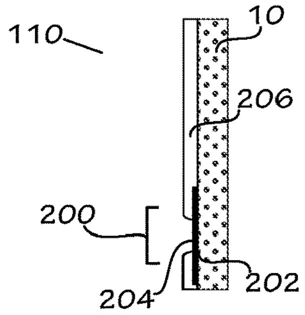
FIG. 4A is a cross-sectional view through the structures at plane I of FIG. 3.

RDL Process. FIGS. 3 and 4A-2E (cross-sectional views) illustrate the process used to create RDLs. A simplified chip 110, having a single bond pad 200 (also referred to as an "I/O pad") is shown. The chip 110 is fabricated from wafer material 10 (e.g., silicon) with a conductive area of metallization 202, and a passivating layer 206 partially covering the metallization except for a contact region 204. The black dashed-line rectangle in FIG. 3 indicates the extent of metallization 202 below the surface of passivation layer 206, only a portion of which (contact region 204) is exposed on the surface of chip 110. Redistribution of the pad involves establishing a conductive connection between the existing bond pad 200 and a new bond pad 226 with a line of surface metallization 220 between the two points.

Figure 4B:
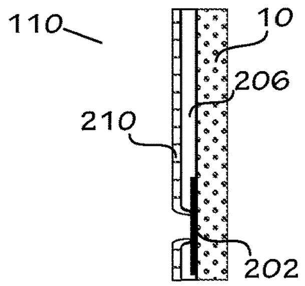
FIG. 4B is a cross-sectional view through the structures at plane II of FIG. 3.

The redistribution line 220 can be fabricated directly on the primary passivation 206 (not illustrated) or can be routed over a new layer of polymer passivation material 210 to ensure adequate protection of the metallization on all sides as shown in FIGS. 3 and 4B. In these illustrations, the surface of chip 110 is coated with a first passivation layer 206, excluding the contact 204 of the existing, original I/O pad 200 (step A). In other aspects, this first polymer layer can be disposed over only the area that will receive metallization. In either case, the polymer passivation layer can either be selectively applied, or can be applied to the entire surface of the chip (e.g., by spin-coating) and photolithography can be used to remove excess polymer extending beyond desired areas.

Figure 4C:
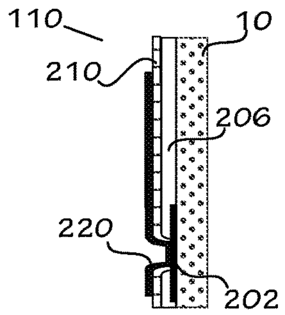
FIG. 4C is a cross-sectional view through the structures at plane III of FIG. 3.
Figure 4D:
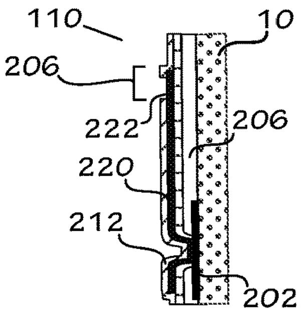
FIG. 4D is a cross-sectional view through the structures at plane IV of FIG. 3.
Figure 4E:
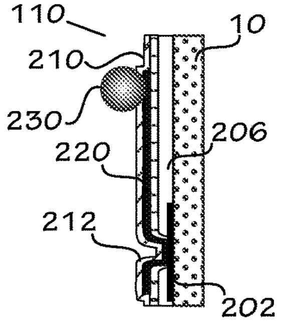
FIG. 4E is a cross-sectional view through the structures at plane V of FIG. 3.

Metallization (e.g., copper foil, electroplating) is then applied to contact 204 (indicated by dashed white rectangular line), the surrounding area, and along a continuous line 220 to the new pad 226 using methods known in the art, thereby conductively connecting the original pad 200 with the new pad 226 (FIG. 3, step B and FIG. 4C).

In step C of FIG. 3, a second redistribution layer 212 is formed over the metallization 220, completely covering the existing, original pad 200 and exposing only the contact 222 of new pad 226. In this illustration, the second redistribution layer 212 is shown limited to the path of the metallization. However, the second redistribution layer 212 can cover the entire chip surface provided it doesn't interfere with any other functions of the chip.

Finally (step D), a solder bump 230 can be disposed over the new, redistributed pad 226 for wire bonding or other connections.

Advantageously, polyimides of the present invention are photoimageable, thereby allowing patterning of the redistribution layer. For example, a passivating redistribution formulation of the invention can be applied to the surface of an IC chip and/or fan-out package, and then photoimaged to remove areas designated for via holes or for UBM (Under Bump Metallization) sites, to allow subsequently sputtered and plated metallization to make contact with the bottom metallization layer to facilitate high density connections.

Fan-Out RDL

Redistribution layers have traditionally been used on the surface of individual chips. However, the emerging technology of "fan-out" wafer level packaging (FOWLP) has significantly expanded the need and therefore the use of RDL. FOWLP (which is distinguished from "fan-in" WLP, in which packaging is performed at the wafer-level prior to dicing, thereby yielding packages that are die-sized instead of larger-than-die-sized), expands IC chip surface area by embedding a singulated chip in a molded package that is fabricated post-singulation. Multiple chips can be molded into the same package and the original I/O pads can then be redistributed to the fan-out regions of package. Redistribution layers make relatively inexpensive, low CTE polymer (e.g., epoxy) molds suitable for carrying the delicate metallization lines from a silicon chip to a fan-out region, thereby redistributing the I/O pads across a substantially increased surface area.

Figure 5:
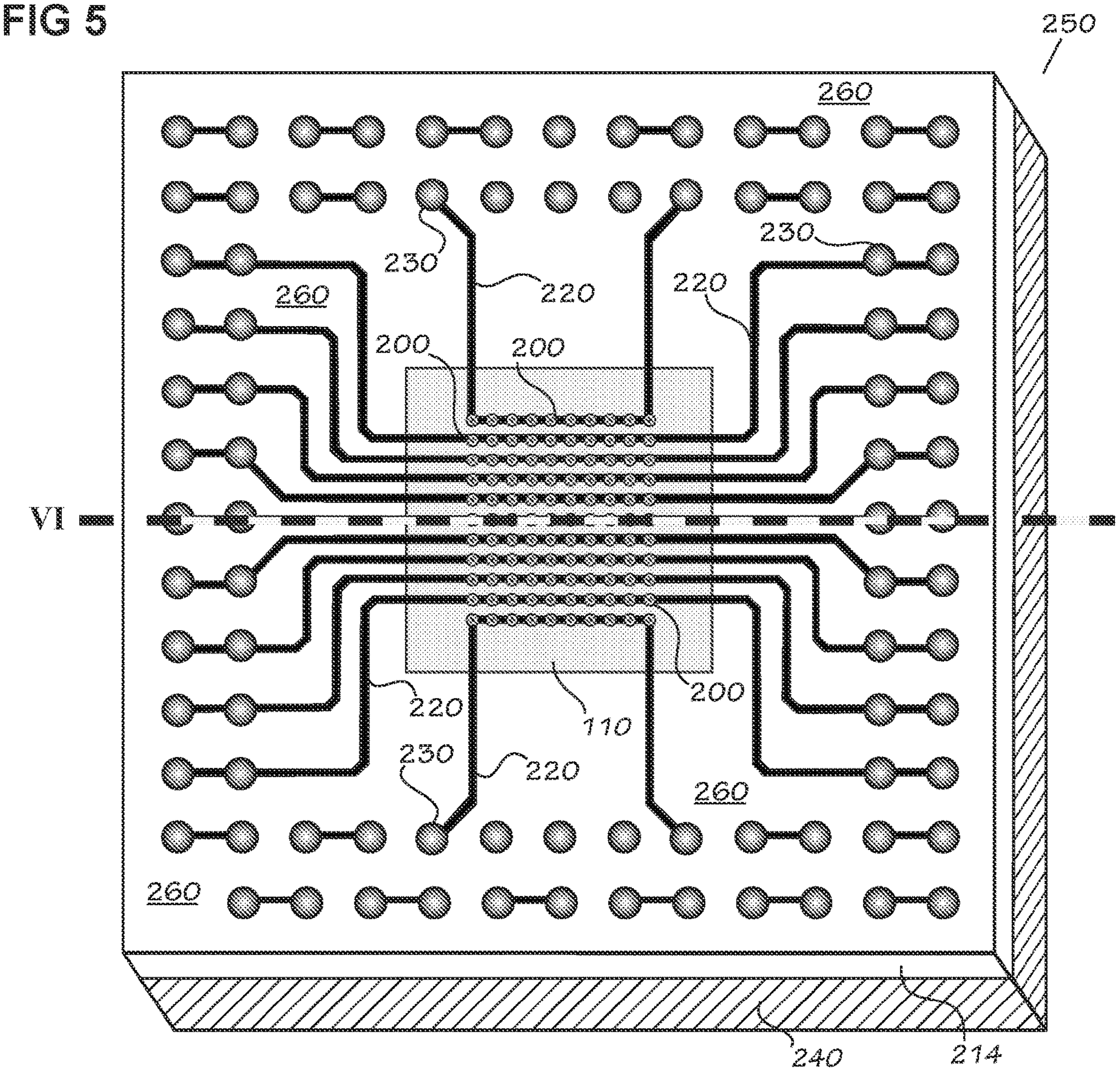
FIG. 5 is a perspective view of fan-out IC package that includes RDL, according to one embodiment of the invention.
Figure 6:
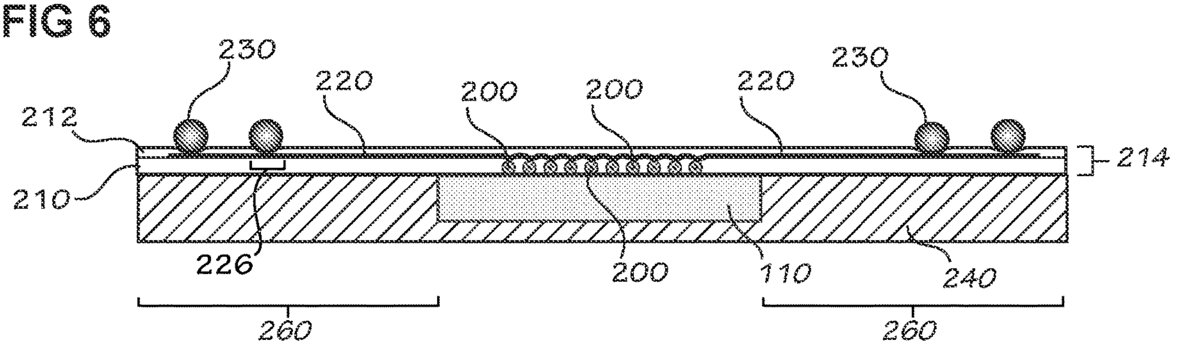
FIG. 6 is a cross-sectional view through the structures at plane VI of FIG. 5.

FIG. 5 is a top perspective view of a fan out package and FIG. 6 is a cross-sectional view through the center of the package at plane VI. For clarity, only a few of the repeated structures 200 (original I/O pads), 220 (redistribution metallization lines) and 230 (solder balls) are numbered in the drawing. The original chip 110 (grey box in center) is located in the center of the package 250, surrounded by a molded polymer composition 240, thus forming a "fan-out" area 260. High density original I/O pads 200 on chip 110 are redistributed to the periphery of the "fan-out" area 260 using the process illustrated for a single redistributed pad in FIGS. 5 and 6A-E: a first layer 210 of passivating redistribution material is applied, followed by conductive metallization lines 220 from original pad 200 to new pad 226 (obscured by solder balls 230 in FIG. 5; see FIG. 6) which are then covered with a second passivation layer 212. Layers 210, 220 and 212 collectively form an overall redistribution layer 214. Thick black lines represent the metallization lines 220 that follow a path from the original pads 200 to the redistributed pad 226 upon which a solder ball 230 is disposed.

Another desirable feature of the passivation formulations of the invention is that once cured, they have much lower moisture uptake than traditional polyimide passivation formulations. Therefore, there is little risk that the RDL formulations will subject delicate metallization to corrosive conditions.

The following non-limiting acrylates are suitable reactive diluents for use in the practice of the invention:

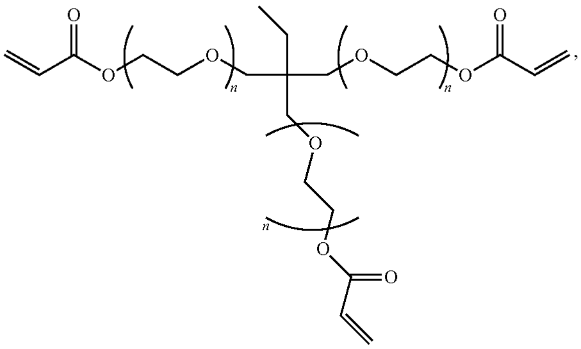
,

Ethoxylated Trimethylolpropane Triacrylate (SR-454)

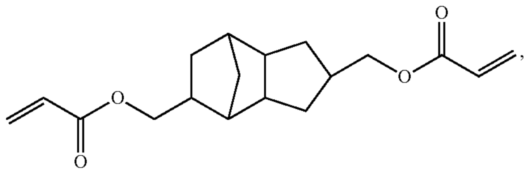
, and

Ethoxylated Trimethylolpropane Triacrylate (SR-454)

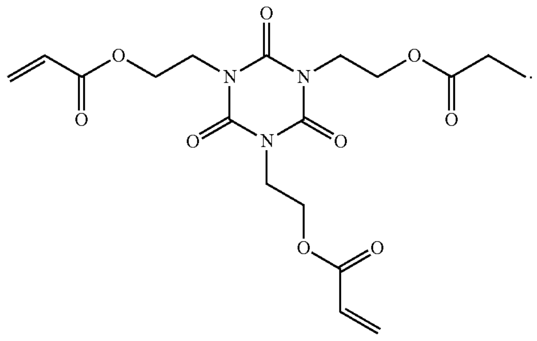
.

Tris(2-Acryloxyethyl)isocyanurate

Curing Initiators. The present invention provides passivating formulation including at least one compound of Formula I and at least one curing initiator. The curing initiator is typically present in passivating formulations of the invention at an amount from 0.1 wt % to about 5 wt %, based on total weight of the formulation. In some embodiments, the curing initiator is present at least about 0.5 wt %, often at least about 1 wt %, frequently at least about 2 wt %, at in some embodiments at least about 3 wt %, based on total weight of the composition.

Free-radical initiators. In certain embodiments of the invention, the curing initiator includes a free-radical initiator. Free-radical initiators contemplated for use in the practice of the present invention typically decompose (i.e., have a half-life in the range of about 10 hours) at temperatures in the range of about 70° C. up to 180° C. Exemplary free radical initiators contemplated for use in the practice of the present invention include, but are not limited to, peroxides (e.g., dicumyl peroxide, dibenzoyl peroxide, 2-butanone peroxide, tert-butyl peroxybenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methyl-propanenitrile), 2,2'-azobis(2-methylbutanenitrile), and 1,1'-azobis(cyclohexanecarbonitrile)). Other free-radical initiators that will be well-known in the art may also be suitable for use in the compositions of the present invention.

Photoinitiators. Free radical initiators also include photoinitiators. For invention formulations that contain a photoinitiator, the curing process can be initiated, for example, by UV radiation. In one aspect of the invention, the photoinitiator is present at a concentration of 0.1 wt % to 10 wt %, based on the total weight of the composition (excluding any solvent).

In one embodiment, the photoinitiator comprises 0.5 wt % to 3.0 wt %, based on the total weight of the organic compounds in the composition. In other embodiments, the photoinitiator is present at least about 0.5 wt %, often at least about 1 wt %, frequently at least about 2 wt %, and in some embodiments at least about 3 wt %, based on the total weight of the organic compounds in the composition. Photoinitiators include benzoin derivatives, benzilketals, α,α-dialkoxyacetophenones, α-hydroxyalkylphenones, α-aminoalkylphenones, acylphosphine oxides, titanocene compounds, combinations of benzophenones and amines or Michler's ketone, and similar photoinitiators that will be recognized by the skilled artisan.

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive compositions of the invention.

In some embodiments, both photoinitiation and thermal initiation may be desirable. For example, curing of a photoinitiator-containing passivation formulation can be started by UV irradiation, and, in a later processing step, curing can be completed by the application of heat to accomplish a free-radical cure. Both UV and thermal initiators may therefore be added to the adhesive compositions of the invention.

In yet another embodiment of the invention the addition of amino-functionalized silanes is contemplated for use in the practice of the invention. Not wishing to be bound by any one theory, the amino-functionalized coupling agents have been shown to adhere to the copper surface and prevent copper oxide migration into the resin, which is a great concern due to delamination that occurs without the surface treatment.

Amino-functionalized coupling agents contemplated for use in the practice of the invention include, but are not limited to the following compounds; 3-aminopropyltrimethoxysilane; 3-aminopropyltriethoxysilane; N-phenyl-3-aminopropyltrimethoxysilane; N-2-(aminoethyl)-3-aminopropylmethyldimethoxysilane; N-2-(aminoethyl)-3-aminopropyltrimethoxysilane; and the like.

In yet another embodiment of the invention, two or more coupling agents may be used in combination to obtain ultimate adhesion to the copper surface.

Additional Co-Curing Compounds. In certain aspects, the compositions, such as adhesive compositions of the invention include at least one additional compound that can co-cure with the [compound of formula I]. The additional compound is typically present in an adhesive composition from about 10 wt % to about 90 wt % based on total weight of the composition. In such aspects, the composition will typically contain an amount of the co-curing compound equal to at least about 20 wt %, often at least about 30 wt %, frequently at least about 40 wt %, and in some embodiments at least about 50 wt % based on the total weight of the composition.

Assemblies

According to embodiments of the present invention, devices comprising a semiconductor wafer or other substrate and a redistribution layer disposed on the surface of the wafer, or substrate. The redistribution layer is comprised of a pre-imidized or partially imidized backbone with a photopolymerizable functional group, according to the following structures.

Formula I

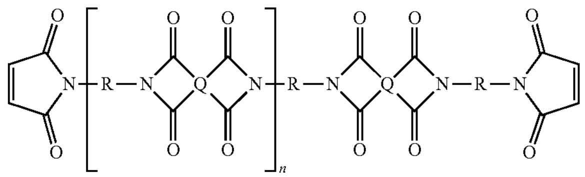

where R is substituted or unsubstituted aliphatic, cycloaliphatic, alkenyl, aromatic, heteroaromatic; Q is substituted or unsubstituted aliphatic, cycloaliphatic, alkenyl, aromatic, heteroaromatic; and n is an integer having the value from 1-100.

In another embodiment of the invention, the passivating, photoimageable polyimide formulations are applied and after the photolithography step a pattern is developed followed by the excess removal or development stage. The excess polyimide can be developed using organic solvents such as cyclopentanone, cyclohexanone, PGMEA, propylene glycol dimethyl ether and combinations thereof with other common solvents such as alcohols, esters, and ketones.

The invention also provides passivated electronic component such as passivated chips, passivated devices, and passivated packages, passivated semiconductor wafers, passivated wafer-level packages, passivated Positive Temperature Coefficient (PTC) protective layer, passivated fan-out redistributed chip passivated and passivated circuit boards comprising a cured layer of a passivating formulation described herein on at least a portion of the component. In yet another embodiment of the invention the compounds of the invention are used in the patterning and etching of a number of substrates, including, but not limited to printed circuit boards, specialty photonics materials, microelectromechanical systems (MEMS), glass, and other micropatterning tasks.

The invention will now be further described with reference to by the following illustrative, non-limiting examples.

SYNTHETIC EXAMPLES

Example 1: Synthesis of Compound 1

Compound 1

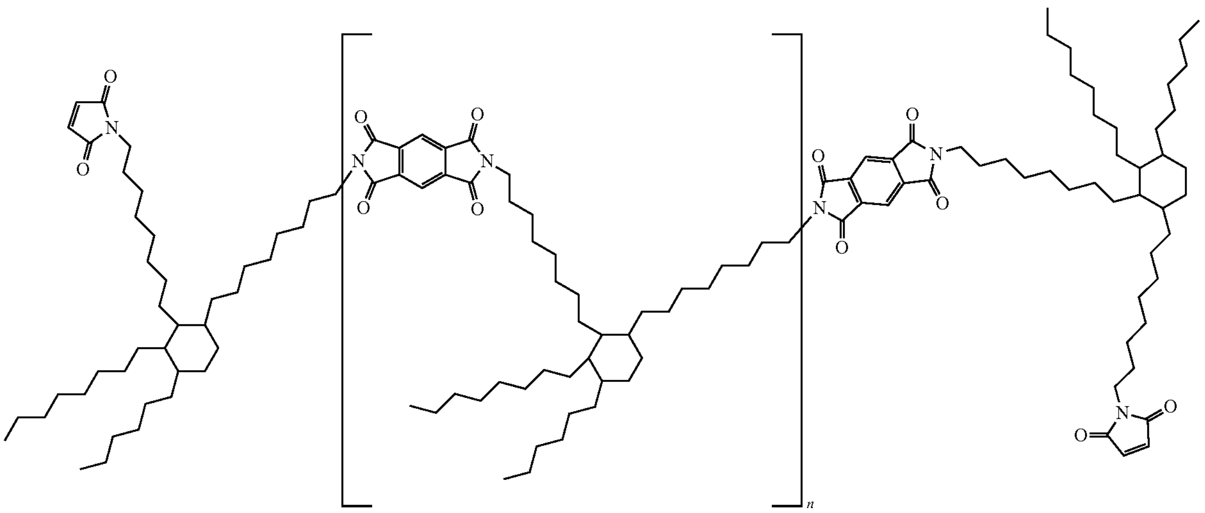

where n is 1-10

A 1 L reactor was charged with 164.7 g (300 mmol) of PRIAMINE™ 1075, followed by the addition of 300 g of NMP, 300 g of toluene and 30 g of methanesulfonic acid. The solution was stirred, followed by the addition of 52.3 g (240 mmol) pyromellitic dianhydride. The mixture was stirred and heated to 115° C. and maintained for 2 hours to complete the amine-terminated polyimide synthesis with the azeotropic removal of about 9 mL of water. To the room temperature solution was added 14.1 grams (144 mmol) of maleic anhydride. The solution was stirred for 8 hours at 115° C. to complete the conversion to the maleimide-terminated polyimide with the azeotropic removal of about 2.2 mL of water. The hot solution was placed in a separatory funnel and washed three times with 300 g of 10% aqueous ethanol. To aid in the separation of the layers, the separatory funnel was kept in an oven at 75° C. After the three washes, the organic layer was then slowly added to stirred acetone (4 L) to precipitate the product. The product was vacuum-filtered using a Buchner funnel, and dried in a recirculating oven at 35° C. overnight. After drying, Compound 1 (structure shown above) was obtained at approximately 70% yield as a yellow powder.

Characterization of Product: FTIR $v_{max}$ 2922, 1713, 1602, 1508, 1388, 1348, 1246, 1175, 828, 726, 695. 1H NMR (CDCl3) d 8.25 (s, 1H), 7.92 (s, 1H), 3.96 (t, 1H), 3.55 (t, 1H), 1.63 (m, 5H), 1.26 (m, 58H), 0.89 (m, 2H). 13C NMR (CDCl3) d 171.2, 168.2, 135.8, 133.7, 125.2, 45.6, 44.8, 42.3, 39.7, 39.6, 31.6, 31.2, 29.7, 29.6, 23.8, 22.2, 21.8, 14.7.

Various physical properties of Compound 1 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 1.

TABLE 1

Properties of Compound 1

| Property | Value |
| --- | --- |
| Average Molecular Weight | ~7,000 Da |
| Glass Transition Temperature ($T_g$) | 50° C. |
| Coefficient of Thermal Expansion (CTE) | 220 ppm/° C. |
| Dielectric Constant (Dk) @20 GHz | 2.20 |
| Dissipation Factor (Df) @20 GHz | 0.0018 |

Example 2: Synthesis of Compound 2

Compound 2

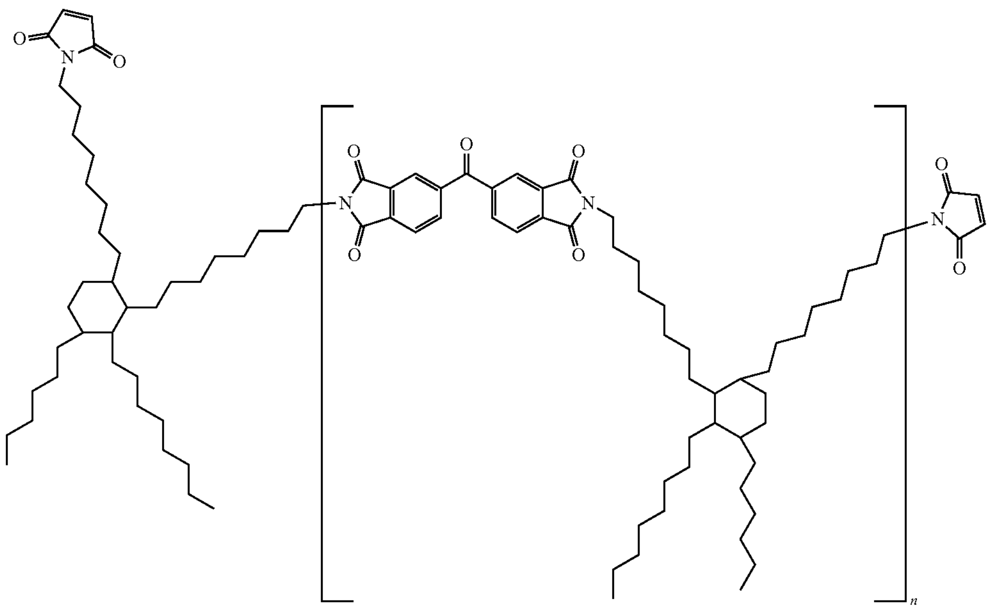

where n is 1-10

A 1 L reactor was charged with 219.6 g (400 mmol) of PRIAMINE™ 1075, followed by the addition of 300 g of NMP, 300 g of toluene and 30 g of methanesulfonic acid. The mixture was heated to reflux at 115° C. for 2 hours to complete the anhydride-terminated polyimide synthesis with the azeotropic removal of 7.2 mL of water. To the cooled (room temperature) solution was added 47.0 g (480 mmol) of maleic anhydride. The solution was refluxed for an additional 8 hours to complete the synthesis of the maleimide-terminated polyimide with the azeotropic removal of 7.2 mL of water. The hot solution was poured into a separatory funnel and washed three times with 300 g of 10% aqueous ethanol. The mixture in the separatory funnel was kept at 75° C. to aid in the separation of the layers. The organic layer was separated and dried by the addition of anhydrous magnesium sulphate. The dried solution was transferred to a 1 L rotary evaporator flask and the solvent was removed under vacuum at 80° C. Compound 2 (structure shown above) was obtained at approximately 95% yield as a of a light brown, thick resin.

Characterization of Product: FTIR $v_{max}$ 2923, 2854, 1708, 1675, 1441, 1395, 1364, 1298, 1246, 826, 724, 696. 1H NMR (CDCl3) d 7.90 (m, 3H), 3.96 (t, 2H), 3.57 (t, 2H), 1.63 (m, 5H), 1.26 (m, 58H), 0.89 (m, 3H). 13C NMR (CDCl3) d 194.2, 171.0, 140.0, 135.7, 135.2, 127.9, 123.5, 46.6, 41.9, 35.1, 32.5, 32.0, 29.7, 29.5, 27.8, 22.2, 21.8, 14.1.

Various physical properties of Compound 2 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 2.

TABLE 2

Properties of Compound 2

| Property | Value |
| --- | --- |
| Average Molecular Weight | 2,250 Da |
| Glass Transition Temperature ($T_g$) | 37.5° C. |
| Coefficient of Thermal Expansion (CTE) | 230 ppm/° C. |
| Dielectric Constant (Dk) @20 GHz | 2.45 |
| Dissipation Factor (Df) @20 GHz | 0.0020 |

Example 3: Synthesis of Compound 3

Compound 3

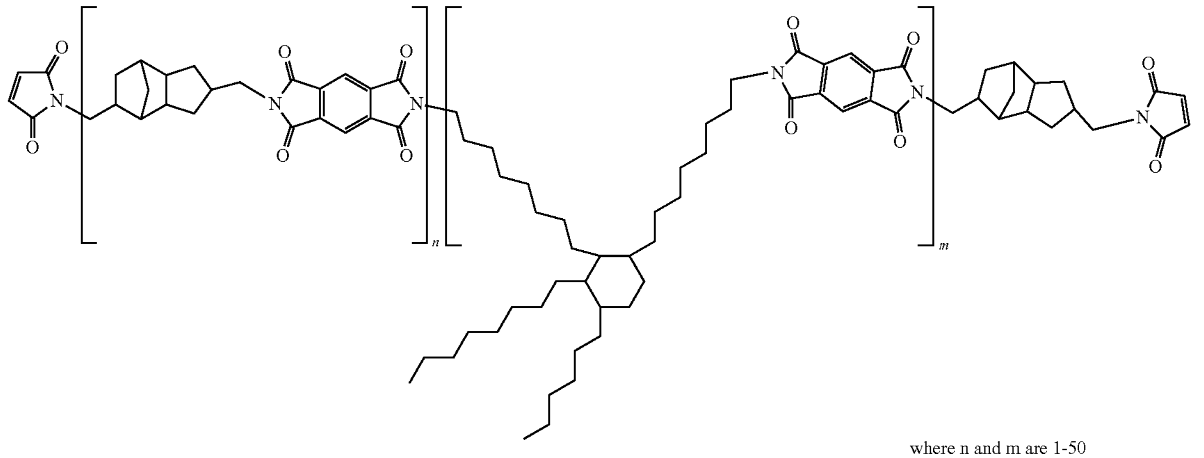

where n and m are 1-50

A 1 L reactor was charged with 58.2 g (300 mmol) of TCD-diamine, and 82.4 g (150 mmol) of PRIAMINE™ 1075, followed by the addition of 300 g of NMP, 300 g of toluene and 30 g of methanesulfonic acid. To the solution was added 89.4 g (410 mmol) of pyromellitic dianhydride. The mixture was heated to reflux at 115° C. for 2 hours to complete the anhydride-terminated polyimide synthesis with the azeotropic removal of 15 mL of water. To the cooled (room temperature) solution was added 9.4 g (96 mmol) of maleic anhydride. The solution was refluxed for an additional 8 hours to complete the synthesis of the maleimide-terminated polyimide with the azeotropic removal of 1.8 mL of water. The hot solution was poured into a separatory funnel and washed three times with 300 g of 10% aqueous ethanol. The mixture in the separatory funnel was kept at 75° C. to aid in the separation of the layers. After the three washes, the organic phase was added dropwise into a stirred isopropyl alcohol to precipitate the product. The precipitate was vacuum filtered using a Buchner funnel and dried in a recirculating oven at 50° C. overnight. After drying, Compound 3 (structure shown above) was obtained at approximately 80% yield as a slightly yellow powder.

Characterization of Product: FTIR $v_{max}$ 2922, 1713, 1602, 1502, 1388, 1348, 1246, 1175, 828, 726, 695. $^1H$ NMR (DMSO) d 8.16 (s, 1H), 7.0 (s, 1H), 3.66 (m, 1H), 3.54 (m, 2H), 3.32 (m, 1H), 2.13 (m, 2H), 1.26 (m, 26H), 0.90 (m, 1H). $^{13}C$ NMR (DMSO) d 171.3, 167.6, 135.8, 135.5, 125.2, 49.6, 46.5, 46.1, 44.4, 41.7, 40.0, 39.3, 35.74, 34.9, 31.8, 30.2, 29.9, 29.3, 25.5, 21.0, 18.5, 14.2.

Various physical properties of Compound 3 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 3.

TABLE 3

| Properties of Compound 3 | |
|---|---|
| Property | Value |
| Average Molecular Weight | 15,200 Da |
| Glass Transition Temperature ($T_g$) | 142.5° C. |
| Coefficient of Thermal Expansion (CTE) | 47 ppm/° C. |
| Dielectric Constant (Dk) @20 GHz | 2.55 |
| Dissipation Factor (Df) @20 GHz | 0.00305 |

Example 4. Synthesis of Compound 4

Compound 4

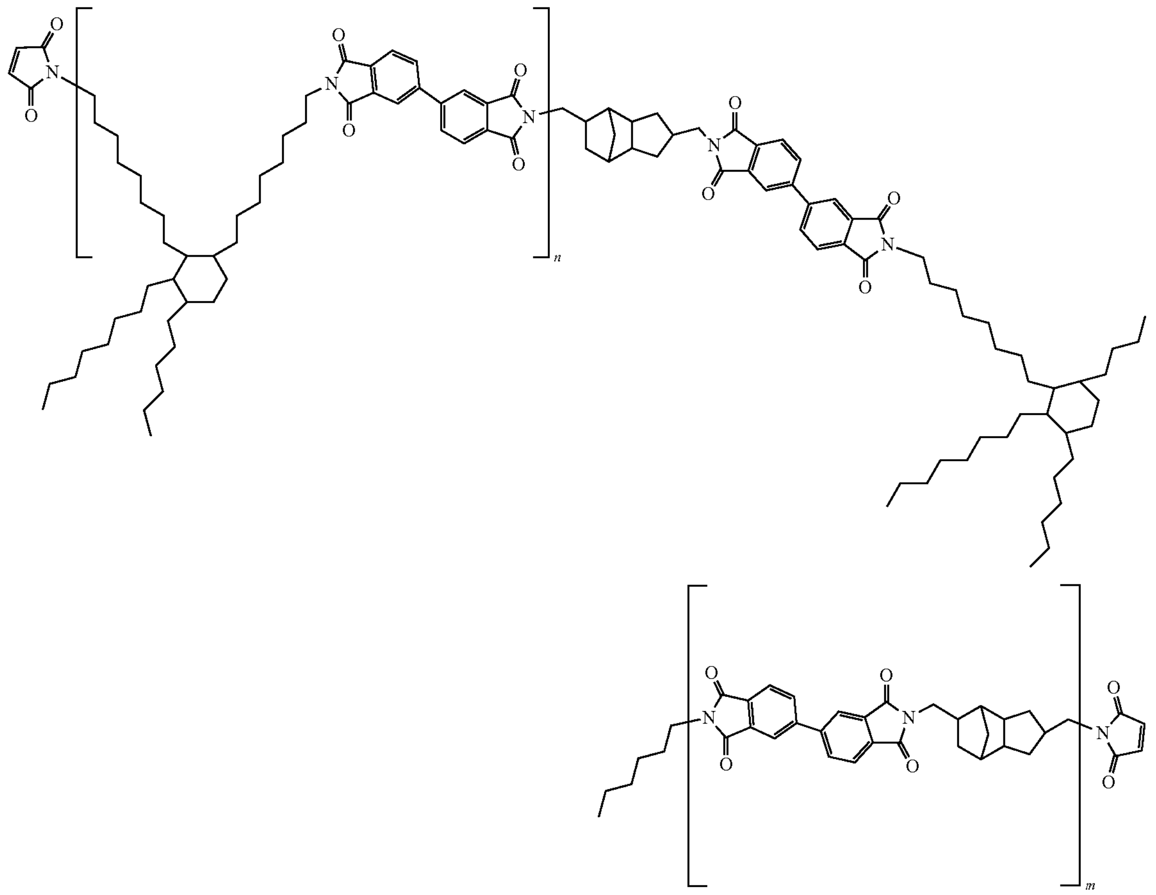

where n and m are 1-50

A 2 L reactor was charged with 58.2 g (300 mmol) of TCD-diamine, 164.7 g (300 mmol) of PRIAMINE™ 1075, followed by the addition of 500 g of NMP, 500 g of toluene and 50 g of methanesulfonic acid. To the solution was added 161.8 g (550 mmol) of biphenyl tetracarboxylic dianhydride. The mixture was heated to reflux at 115° C. for 2 hours to complete the anhydride-terminated polyimide synthesis with the azeotropic removal of 20 mL of water. To the cooled (room temperature) solution was added 11.8 g (120 mmol) of maleic anhydride. The solution was refluxed for an additional 8 hours to complete the synthesis of the maleimide-terminated polyimide with the azeotropic removal of 2 mL of water. The hot solution was poured into a separatory funnel and washed three times with 500 g of 10% aqueous ethanol. The mixture in the separatory funnel was kept at 75° C. to aid in the separation of the layers. After the three washes, the organic phase was added dropwise into stirred ethanol to precipitate the product. The precipitate was vacuum filtered using a Buchner funnel and dried in a recirculating oven at 50° C. overnight. After drying, Compound 4 (structure shown above) was obtained at approximately 87% yield as a slightly yellow powder.

Characterization of Product: FTIR $v_{max}$ 2923, 2852, 1704, 1599, 1389, 1367, 1245, 1040, 845, 741, 693. $^1H$ NMR (DMSO) d 8.36 (s, 3H), 7.96 (s, 3H), 7.26 (m, 2H), 7.18 (m, 1H), 4.35 (m, 1H), 3.42 (m, 3H), 2.49 (m, 2H), 2.30 (m, 1H), 1.91 (m, 7H), 1.18 (m, 70H), 1.07 (m, 24H), 0.86 (m, 6H). $^{13}C$ NMR (DMSO) d 171.1, 168.6, 145.2, 128.9, 128.0, 126.0, 62.0, 52.4, 48.5, 43.6, 43.0, 35.2, 31.8, 29.7, 27.0, 22.5, 21.1, 18.5, 14.1.

Various physical properties of Compound 4 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 4.

TABLE 4

Properties of Compound 4

| Property | Value |
|---|---|
| Average Molecular Weight | 15,200 Da |
| Glass Transition Temperature ($T_g$) | 142.5° C. |
| Coefficient of Thermal Expansion (CTE) | 47 ppm/° C. |
| Dielectric Constant (Dk) @20 GHz | 2.55 |
| Dissipation Factor (Df) @20 GHz | 0.00305 |

Example 5: Synthesis of Compound 5

Compound 5

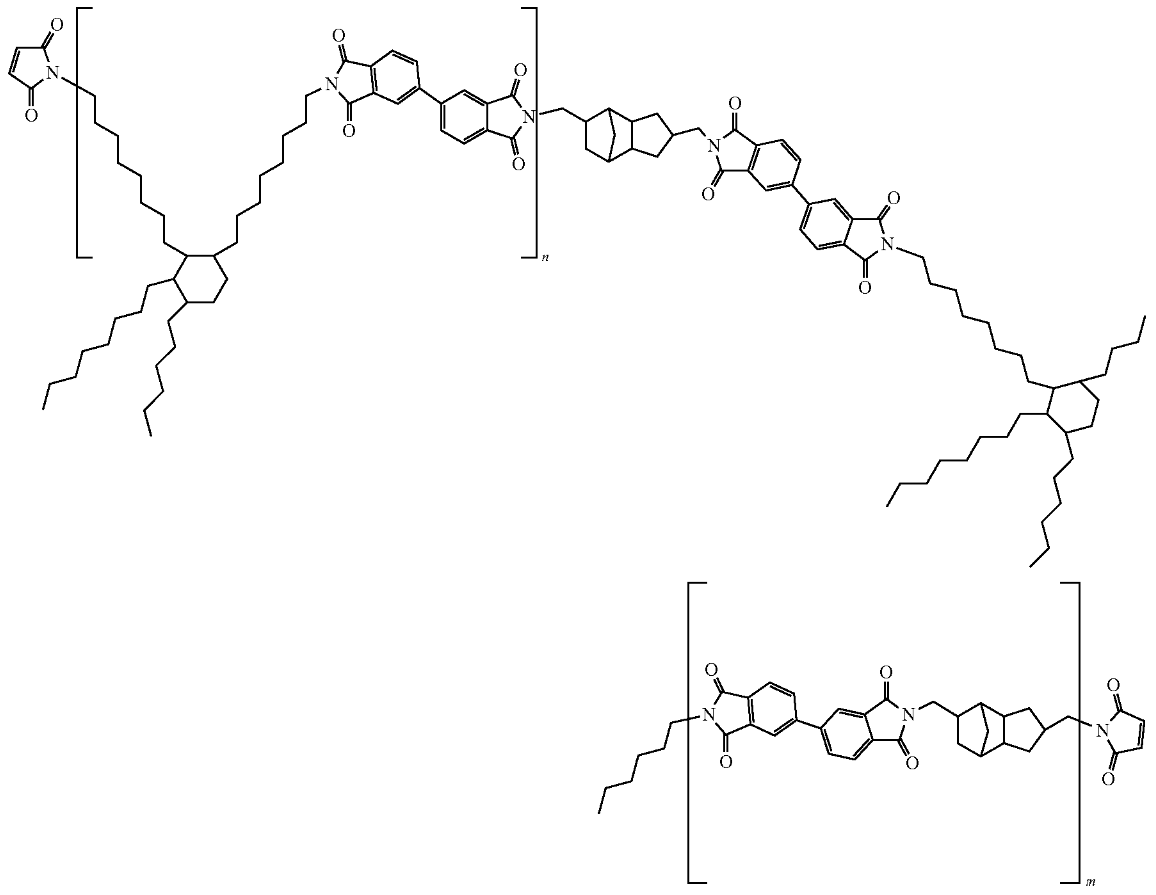

where n and m are 1-50

A 2 L reactor was charged with 58.2 g (300 mmol) of TCD-diamine, 164.7 g (300 mmol) of PRIAMINE™ 1075, followed by the addition of 500 g of NMP, 500 g of toluene and 50 g of methanesulfonic acid. To the solution was added 168.0 g (571 mmol) of biphenyl tetracarboxylic dianhydride. The mixture was heated to reflux at 115° C. for 2 hours to complete the anhydride-terminated polyimide synthesis with the azeotropic removal of 21 mL of water. To the cooled (room temperature) solution was added 6.9 g (70 mmol) of maleic anhydride. The solution was refluxed for an additional 8 hours to complete the synthesis of the maleimide-terminated polyimide with the azeotropic removal of 1 mL of water. The hot solution was poured into a separatory funnel and washed three times with 500 g of 10% aqueous ethanol. The mixture in the separatory funnel was kept at 75° C. to aid in the separation of the layers. After the three washes, the organic phase was added dropwise into a stirred ethanol to precipitate the product. The precipitate was vacuum filtered using a Buchner funnel and dried in a recirculating oven at 50° C. overnight. After drying, Compound 5 (structure shown above) was obtained at approximately 92% yield as a slightly yellow powder.

Characterization of Product: FTIR $v_{max}$ 2922, 1704, 1619, 1435, 1388, 1342, 846, 739, 693. $^{1}H$ NMR (DMSO) d 8.36 (s, 2H), 7.96 (s, 2H), 7.26 (m, 2H), 7.18 (m, 1H), 4.35 (m, 3H), 3.42 (m, 3H), 2.49 (m, 2H), 2.30 (m, 1H), 1.91 (m, 7H), 1.24 (m, 8H), 1.07 (m, 20H), 0.86 (m, 3H). $^{13}C$ NMR (DMSO) d 171.0, 168.2, 145.1, 128.9, 128.2, 126.0, 61.9, 52.3, 48.5, 43.6, 43.2, 35.5, 31.8, 29.6, 27.0, 22.7, 21.0, 18.5, 14.2.

Various physical properties of Compound 5 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 5.

TABLE 5

Properties of Compound 5

| Property | Value |
|---|---|
| Average Molecular Weight | 42,200 Da |
| Glass Transition Temperature ($T_g$) | 112.5° C. |
| Coefficient of Thermal Expansion (CTE) | 77 ppm/° C. |
| Dielectric Constant (Dk) @20 GHz | 2.50 |
| Dissipation Factor (Df) @20 GHz | 0.00285 |

Example 6: Synthesis of Compound 6

Compound 6

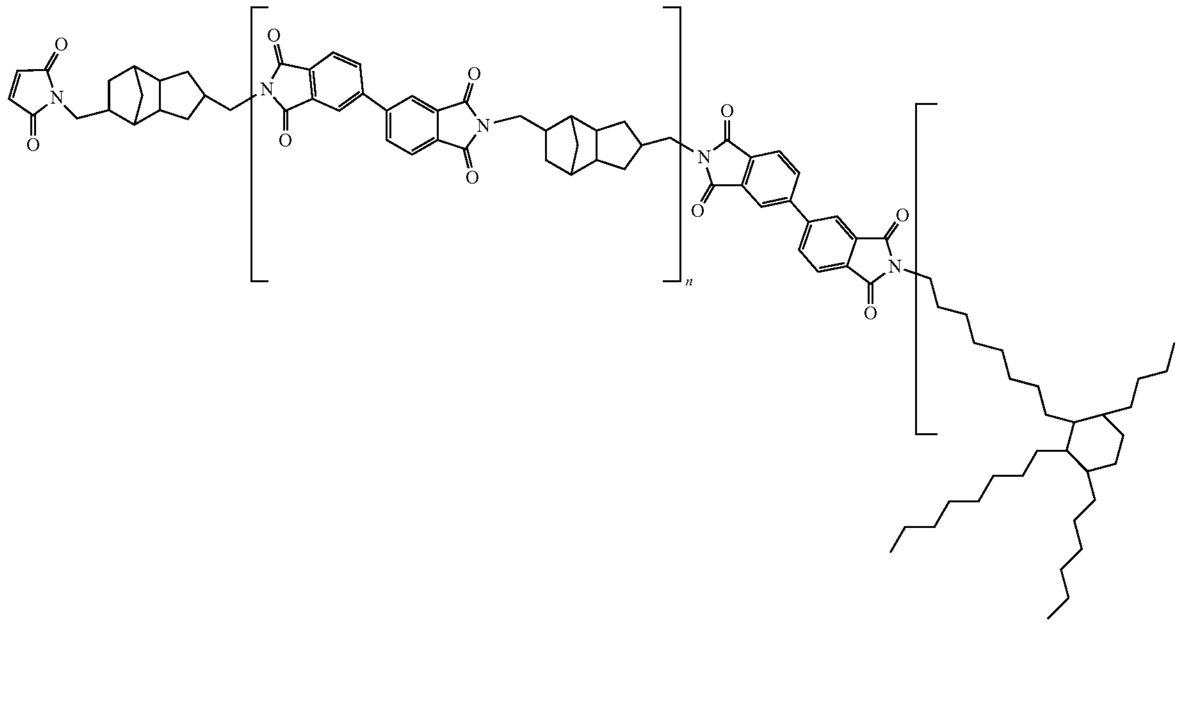

-continued

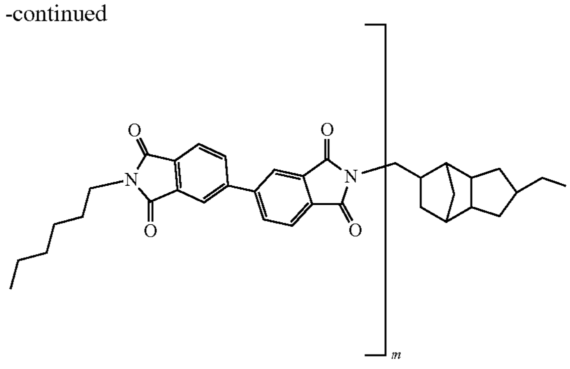

where n and m are 1-50

A 1 L reactor was charged with 58.2 g (300 mmol) of TCD-diamine, 54.9 g (100 mmol) of PRIAMINE™ 1075, followed by the addition of 300 g of NMP, 300 g of toluene and 30 g of methanesulfonic acid. To the solution was added 112.1 g (381 mmol) of biphenyl tetracarboxylic dianhydride. The mixture was heated to reflux at 115° C. for 2 hours to complete the anhydride-terminated polyimide synthesis with the azeotropic removal of 21 mL of water. To the cooled (room temperature) solution was added 6.9 g (70 mmol) of maleic anhydride. The solution was refluxed for an additional 8 hours to complete the synthesis of the maleimide-terminated polyimide with the azeotropic removal of 1 mL of water. The hot solution was poured into a separatory funnel and washed three times with 300 g of 10% aqueous ethanol. The mixture in the separatory funnel was kept at 75° C. to aid in the separation of the layers. After the three washes, the organic phase was added dropwise into a stirred ethanol to precipitate the product. The precipitate was vacuum filtered using a Buchner funnel and dried in a recirculating oven at 50° C. overnight. After drying, Compound 6 (structure shown above) was obtained at approximately 89% yield as a slightly yellow powder.

Characterization of Product. FTIR $v_{max}$ 2946, 1704, 1613, 1544, 1506, 1393, 839, 742, 695, 677. $^1$H NMR (DMSO) d 8.26 (s, 1H), 7.98 (s, 1H), 7.26 (m, 1H), 7.17 (m, 2H), 7.0 (m, 1H), 3.30 (m, 32H), 2.69 (s, 4H), 2.29 (s, 4H), 2.18 (t, 3H), 1.91 (m, 6H), 1.46 (m, 6H), 1.23 (m, 12H), 0.86 (m 3H). $^{13}$C NMR (DMSO) d 171.0, 166.9, 134.4, 128.9, 128.2, 125.3, 48.4, 30.1, 29.0, 21.0, 17.2.

Various physical properties of Compound 6 were measured as described above in MATERIALS AND METHODS. Thin films were analyzed to determine $T_g$ (TMA), CTE (TMA), Dk and Df. The compound in tetrahydrofuran solution was used to determine average Molecular Weight (Daltons). The results are summarized below in Table 6.

TABLE 6

Properties of Compound 6

| Property | Value |
|---|---|
| Average Molecular Weight | 35,100 Da |
| Glass Transition Temperature ($T_g$) | 142.5° C. |
| Coefficient of Thermal Expansion (CTE) | 47 ppm/° C. |
| Dielectric Constant (Dk) @20 GHz | 2.55 |
| Dissipation Factor (Df) @20 GHz | 0.00305 |

Example 7. RDL Formulations

Twenty samples (1-20) were prepared according to the formulations given in Table 7 ("Compositions"). The samples contained various combinations of Compounds 1-6, one or more reactive diluent: SR-833S (S8), SR-454 (S4), and/or Tris(2-acryloxyethyl)isocyanurate (TA). Each sample also contained initiators (2% IRGACURE® 819 and 1% DCP), and coupling agents (1% KBM-303 and 1% KBM-573).

Physical Properties of Film Formulations. Thin films were prepared from compounds or compositions by pouring a solution of approximately 35% (w/v) solids in anisole into square aluminum molds (12×12×0.2 cm) that had been treated with a mold release agent. The filled molds were placed in a vacuum chamber for 5 minutes to remove dissolved gasses. The molds were then placed in an oven for about 5 hours at 100° C. to evaporate the solvent, leaving an uncured film. The molds were placed in a UV chamber and UV-Curing was conducted using an Electro-lite ELC-4001 UV flood system (Electro-Lite Corporation; Bethel, CT), equipped with a UV-A high pressure mercury vapor lamp, for 1 minute. Furthermore, the samples were covered with an i-line bandpass filter (365 n) from Asahi Spectra USA, Inc. (Torrance, CA). The molds were then transferred to an oven at 175° C. for 30 minutes to fully cure the film. Once cooled, the 200-to-300-micron thick films were removed from the mold. Specimens were used to obtain the $T_g$, CTE, Dk, Df; dogbone specimens were used to determine the tensile strength (TS) and % elongation (% E) as described above in MATERIALS AND METHODS. The results are summarized in Table 7, below.

Photolithography. Aliquots of the formulations give in Table 7 were placed on top of a silicon wafer and spin-coated at 1,100 rpm for 10 seconds to form a film. The spin-coated films were dried for 10 minutes in an oven at ~100° C. A photomask was placed on the spin-coated wafer and exposed to 500 mJ/cm$^2$ I-line (365 nm) using an I-line filter. The wafers were then placed in a solvent bath for 1 minute to develop. Various combinations of solvents one or more of solvents cyclopentanone (CP), cyclohexanone (CH), ethanol (E), and propylene glycol monomethyl ether acetate (PG-MEA) were used for development as indicated in Table 7, "Development Solvent(s)".

In successful photolithography, the exposed (cured) areas remain intact on the substrate, while the unexposed (masked) areas wash away in the development solvent bath. Following development, the wafers were placed in an oven at 175° C. for 30 minutes to dry and fully adhere to the wafers. The films were analyzed using a Dektak surface profiler (Bruker Corp.; Ettlingen, DE) and showed very well-developed surface at about 5-10 μm thickness.

TABLE 7

RDL Formulation Compositions, Properties and Development Solvents

| | Composition (Weight Percent) | | | | | | | | | Properties | | | | | | Development Solvent(s) | | | |
|---|---|---|---|---|---|---|---|---|---|---|---|---|---|---|---|---|---|---|---|
| No. | 1 | 2 | 3 | 4 | 5 | 6 | S8 | S4 | TA | $T_g$ | CTE | TS | % E | Dk | Df | CP | CH | E | PGMEA |
| 1 | 22 | | | | 53 | | 17 | 3 | | 92 | 120 | 29 | 24 | 2.45 | 0.0062 | 100 or | 100 | | |
| 2 | 23 | | | | | 52 | 17 | 3 | | 110 | 25 | 30 | 25 | 2.55 | 0.0041 | | 85 | 15 | |
| 3 | 20 | | | | | 55 | 15 | 5 | | 115 | 38 | 32 | 17 | 2.4 | 0.0035 | 100 or | 100 | | |
| 4 | 25 | | | | | 47 | 20 | 3 | | 104 | 100 | 33 | 20 | 2.45 | 0.0045 | 100 or | 100 | | |
| 5 | 17 | | | 28 | | 30 | 15 | 5 | | 86 | 111 | 33 | 23 | 2.51 | 0.0047 | 100 or | 100 | | |
| 6 | 15 | | | 55 | | | 25 | 3 | | 92 | 70 | 36 | 17 | 2.5 | 0.0039 | 100 or | 100 | | |
| 7 | 23 | | | | | 52 | 20 | | | 121 | 45 | 40 | 23 | 2.58 | 0.0033 | | 60 | | 40 |
| 8 | 15 | | | | 55 | | 25 | | | 100 | 17 | 35 | 40 | 2.55 | 0.0035 | 100 or | 100 | | |
| 9 | 19 | | | 50 | | | 25 | | 1 | 81 | 86 | 32 | 26 | 2.55 | 0.0054 | | 80 | | 20 |
| 10 | 15 | | | 60 | | | 18 | 3 | | 93 | 78 | 25 | 10 | 2.48 | 0.0037 | | 80 | | 20 |
| 11 | 25 | | 45 | | | | 22 | 3 | | 91 | 85 | 22 | 17 | 2.45 | 0.004 | | 80 | | 20 |
| 12 | 23 | | 45 | | | | 27 | | | 103 | 96 | 32 | 16 | 2.52 | 0.0048 | | 80 | | 20 |
| 13 | 15 | | | 50 | | | 30 | | | 98 | 59 | 39 | 15 | 2.55 | 0.0051 | 100 or | 100 | | |
| 14 | | | | 70 | | | 20 | 5 | | 98 | 76 | 38 | 23 | 2.45 | 0.005 | | 80 | | 20 |
| 15 | 15 | | | | | 60 | 18 | 2 | | 99 | 62 | 32 | 20 | 2.42 | 0.0038 | | 80 | | 20 |
| 16 | | | | 75 | | | 20 | | | 122 | 52 | 42 | 10 | 2.65 | 0.0065 | | 80 | | 20 |
| 17 | 23 | | | 47 | | | 25 | | | 86 | 78 | 25 | 53 | 2.71 | 0.0053 | | 80 | | 20 |
| 18 | 25 | | | 45 | | | 25 | | | 101 | 68 | 38 | 40 | 2.42 | 0.0038 | | 80 | | 20 |
| 19 | 30 | 50 | | | | | 12 | | 3 | 65 | 110 | 15 | 55 | 2.52 | 0.0025 | | 85 | 15 | |
| 20 | | | | | 75 | | | 20 | | 120 | 58 | 39 | 10 | 2.65 | 0.0065 | 100 or | 100 | | |

Conventional passivation and RDL polymer methods apply an acrylated polyamic solution to a silicon wafer or chip, and use photolithography to develop the sample. At this stage, the film has very poor properties since it is a cross-linked polyamic acid polymer. The ultimate properties are obtained by oven curing the sample at 200° C. and above for several hours. After which very high $T_g$ (~200° C.) may be obtained along with tensile strength of >80 MPa and percent elongation >50%. However, lower temperature and faster curing polymers are advantageous where mass production of high-performance passivation and RDL layers are needed.

Initial experiments (not shown) were performed by UV-curing at low temperature (i.e., room temperature) individual high $T_g$ polymers or oligomers, including Compounds 3-6, gave unsatisfactory results. The results indicated that complete UV-curing does not occur with Compounds 3-6 at low temperature. Specifically, these initial single-polyimide formulations showed insufficient UV-curing when applied to silicon wafers and exposed to UV (>3000 mJ/cm$^2$) for 2 minutes. Such films washed off the substrate within a few seconds of exposure to developing solution. Without wishing to be bound by theory, chemical reactions are most efficient in solution or with gaseous reagents, which promote the state of motion that the facilitates interactions between reactive groups needed to ensure polymerization and cross-linking. Heat further accelerates the processes. Reactions of glassy and/or high melting temperature films, immobilized on a substrate, are thus expected to be less efficient than reactions in solution. In this case, however, UV-curing reactions may have been hindered or slowed down at room temperature such that substantially no polymerization or cross-linking was observed.

It was hypothesized that the successful use of UV initiation, without additional heating, may require the inclusion of reactants with lower melting temperatures and/or the addition of reactive diluents that can soften and solvate reactants in film formulations, thereby promoting curing. Optimal properties might be obtained by UV-curing, followed by a short duration (e.g., seconds or minutes instead of hours) at a moderately higher temperature (above room temperature, but below the 200° C. conventional oven cure).

The results obtained with formulations listed in Table 7 confirmed the hypothesis that formulations that include a combination of relatively high average molecular weight polyimides (Compounds 3-6), along with smaller, flexible polyimide oligomers (Compounds 1 and 2) can be UV-cured and are photoimaged. Each of the compositions cured satisfactorily and supported patterning.

Also, added are acrylic monomers (di and tri-functionalized) to aid in the UV curing. Low viscosity acrylics, such as tricyclodecane dimethanol diacrylate (SR-833S) and ethoxylated trimethylolpropane triacrylate (SR-454) proved to be the most useful. These two monomers have viscosity of under 200 centipoise and $T_g$ of approximately 180° C. and 120° C., respectively. Tris(2-acryloxyethyl)isocyanurate has an even high $T_g$ of approximately 270° C. However, this substance is a waxy solid and did not improve UV curing as much as SR-833S and SR-454.

Several compositions with $T_g$ of close to 100° C. and above were obtained. Of these, the material that have high % elongation is very important. One of the industry requirements is to have flexible material that will not crack or shatter at very cold temperatures let's say if your cell phone was dropped. Therefore, close to 50% elongation may be necessary to pass this type of test. Several of the compositions including 8, 17, 18 and 19 are good enough to meet the requirements.

Since RDL materials are used in latest high frequency electronics the users of these material would like to have better Dk and Df than the traditional RDL materials that are used in industry, this means Dk of Less than 2.7 and Df of less than 0.005. Based on the results in Table 7 it is safe to say that we meet and beat the expectations for Dk and Df.

Composition No. 8 with a $T_g$ of 100° C. and a CTE of 17 ppm had good tensile strength and 40% elongation. This material also had a Df @ 20 GHz of 0.0035. A solution of this material was spin-coated onto a silicon wafer and UV-cured (500 mJ/cm$^2$) and developed in 85% cyclopentanone and 15% ethanol solution. Image 1 is a photograph of the developed material which shows a 5 μm thick film with 10 μm vias that have been developed very well.

Figure 7A:
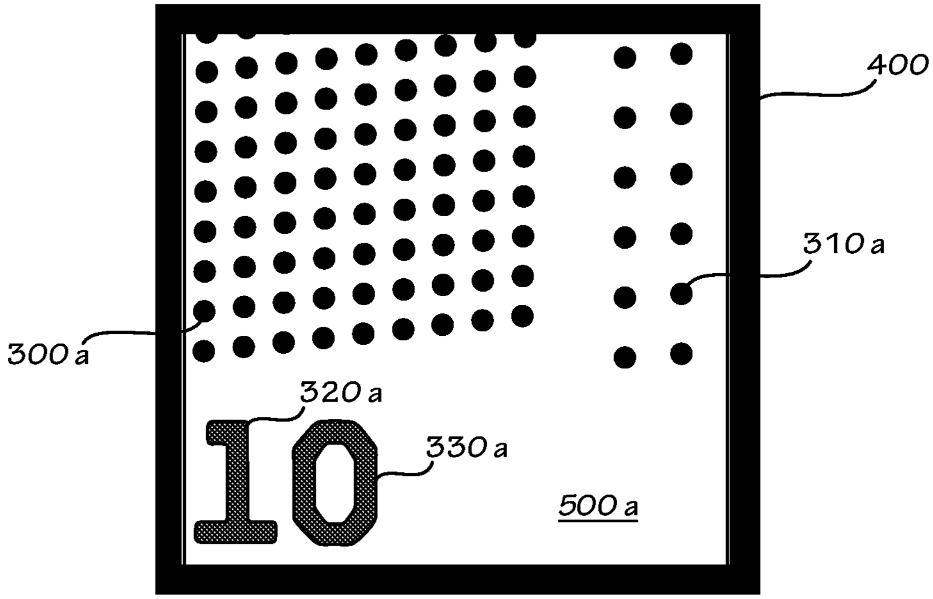
FIG. 7A is an illustration of a photomask described herein, having a pattern of opaque characters and shapes (black) on a UV-transparent ground (white) within an opaque frame (black).
Figure 7B:
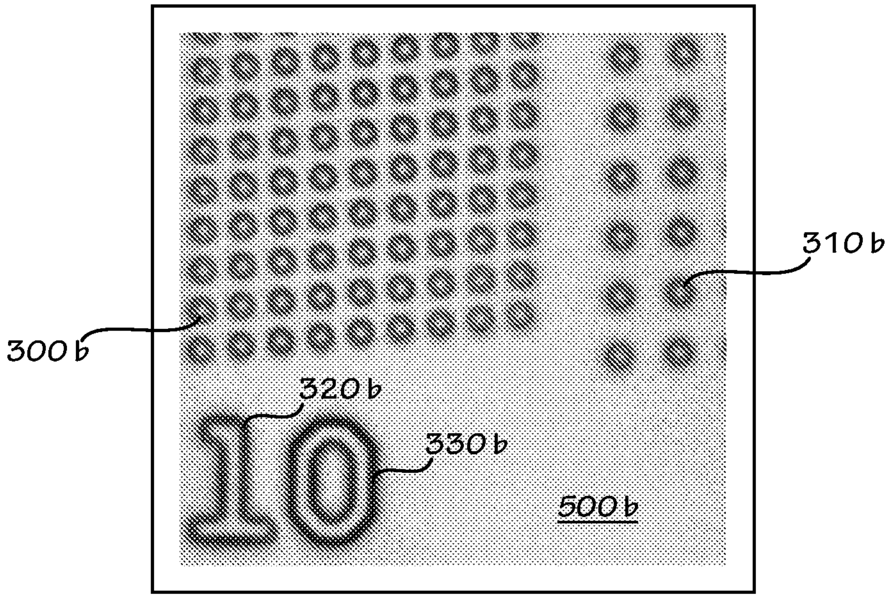
FIG. 7B is a photomicrograph of the top of a UV-cured and developed 5 μm-thick polyimide film on a silicon wafer with 10 μm vias generated using the photomask illustrated in FIG. 7A.

FIGS. 7A and B illustrate the high resolution, detailed photolithography achieved with Formulation 8. FIG. 7A is an illustration of a photomask, with UV-opaque areas (shown in black), including frame 400*a*, 10 μm filled circles 300*a* and 310*a* (which form vias), and the numerals “1” (320*a*) and “0” (330*a*) on a transparent ground 500 (blank white spaces). FIG. 7B is a photomicrograph of a 5 μm thick film prepared using the photomask shown in FIG. 7A.

The films were prepared by spin-coating Formulation 8 onto an 8" silicon wafer at 1,000 rpms for 10 seconds, followed by drying on a 100° C. hot plate for about 3 minutes. The mask in FIG. 7A was placed on the film and UV-irradiated with 300 mJ/cm$^2$ (i-line, 365 nm) to selectively cure unmasked areas of the film and thereby form a pattern. The wafer-bound film was then exposed to developing solvent (cyclopentanone) to remove unexposed (uncured) areas and leave behind the UV-cured pattern detail.

Each of the vias (300*b*, 310*b*) and numerals (320*b*, 330*b*) and were discrete voids in the film, having sharp borders without bleeding between mask characters; the unmasked areas cured to a uniform, 5 μm thick film. The “fuzziness” and darkness of the via and character borders is a 3-D visual artifact, representing sloping contour areas (e.g., via walls), and reflecting the fact that the film was 5 μm thick while the vias themselves had a diameter of 10 μm—only twice the film was thickness.

What is claimed is:

1. A passivating formulation comprising a mixture of at least one first curable, functionalized polyimide and at least one second curable, functionalized polyimide which said polyimides are the products of a condensation reaction of a diamine with an anhydride and are selected from the group consisting of Compound 1

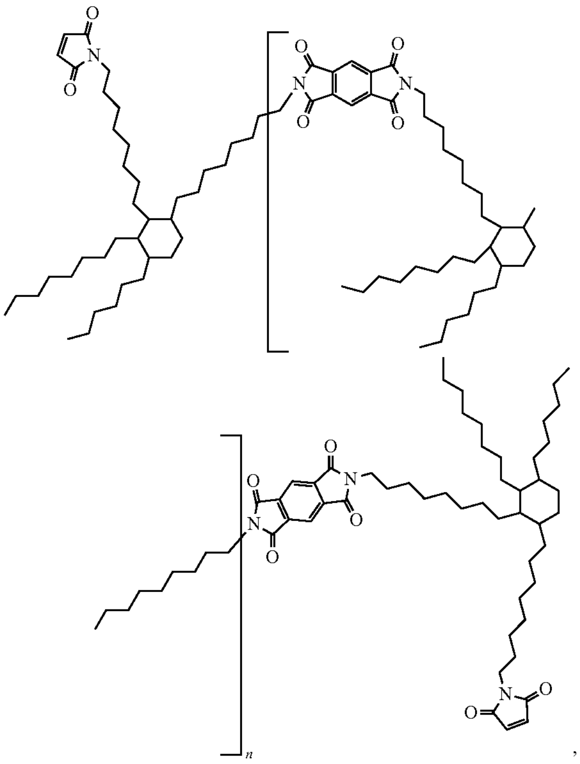

,

-continued

Compound 2

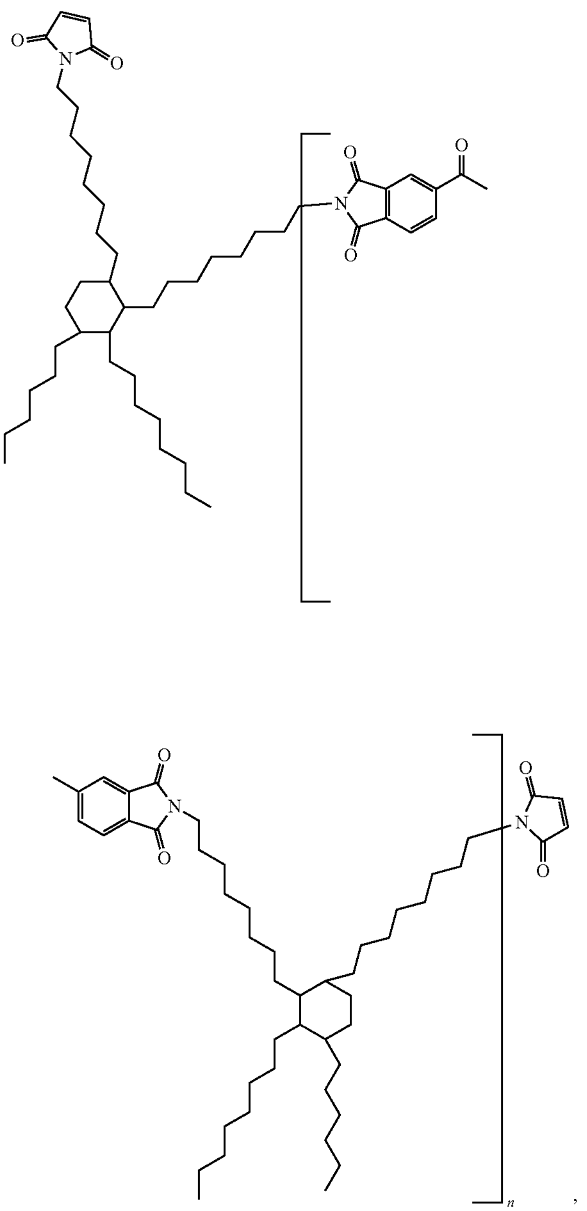

,

Compound 3

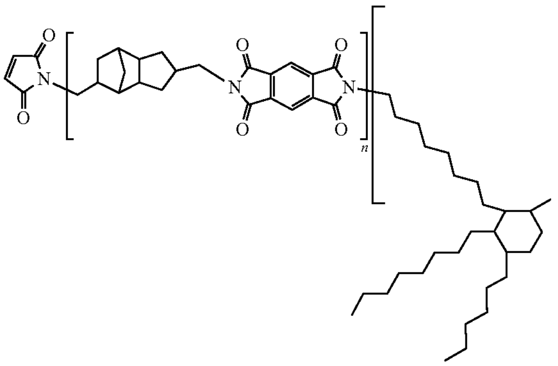

-continued

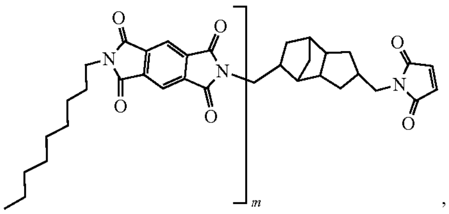

,

-continued

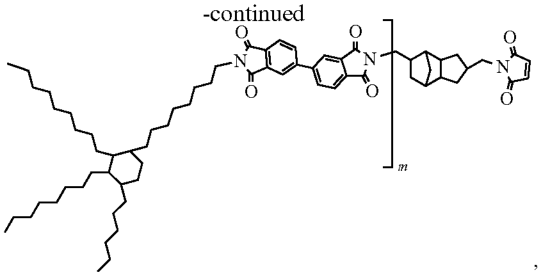

,

Compound 4

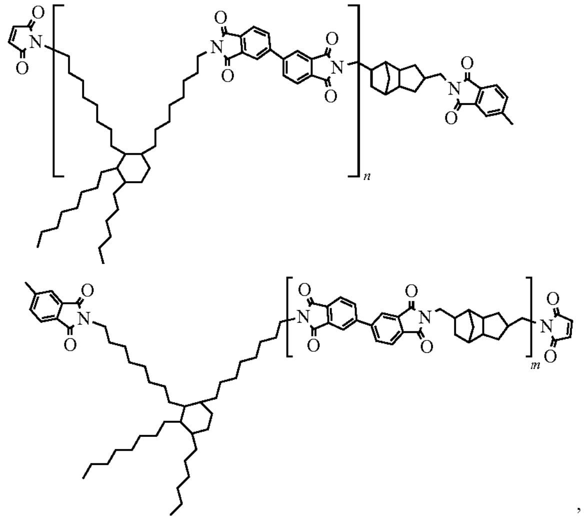

,

Compound 5

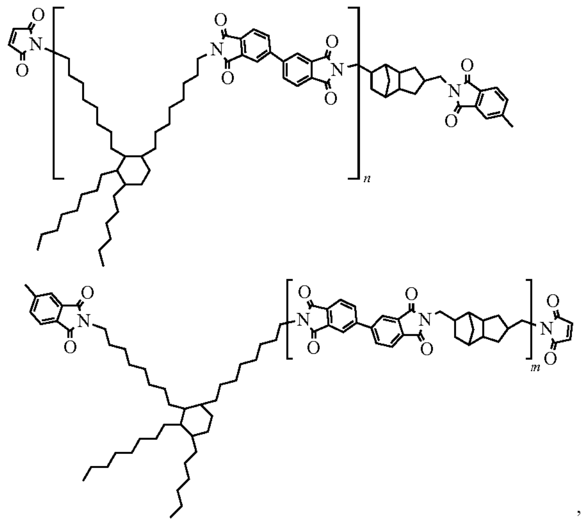

,

Compound 6

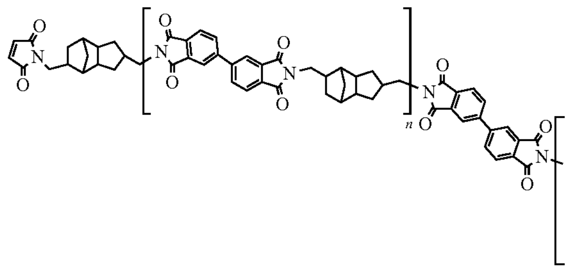

wherein in each of Compounds 1 and 2 n is an integer having the value 1 to 10, and in each of Compounds 3-6, each of n and m is an integer independently having the value 1 to 50, with the further proviso that the at least one first curable, functionalized, flexible polyimide is selected from the group consisting of Compound 1, Compound 2, and combinations thereof, and the at least one second curable, functionalized polyimide is selected from the group consisting of Compound 3, Compound 4, Compound 5, Compound 6, and combinations thereof.

2. The passivating formulation of claim 1, wherein (a) the at least one first curable functionalized, flexible polyimide has an average molecular weight below 10,000 Da; and (b) the at least one second curable functionalized polyimide has an average molecular weight of at least about 10,000 Da.

3. The passivating formulation of claim 2, wherein the at least one first curable, functionalized, flexible polyimide has a Coefficient of Thermal Expansion (CTE) measured by TMA of at least about 100 ppm/° C., at least about 150 ppm/° C., or at least about 200 ppm/° C.

4. The passivating formulation of claim 2, wherein the at least one first curable, functionalized, flexible polyimide has an average molecular weight between about 2,000 Da and about 7,500 Da.

5. The passivating formulation of claim 2, wherein the at least one first curable, functionalized, flexible polyimide comprises about 15 wt % to about 80 wt % of the formulation.

6. The passivating formulation of claim 5, wherein the at least one first curable, functionalized, flexible polyimide comprises about 15 wt % to about 25 wt % of the formulation.

7. The passivating formulation of claim 2, wherein the at least one second curable functionalized polyimide has a glass transition temperature ($T_g$) measured by TMA of at least about 100° C., at least about 120° C., at least about 130° C., at least about 140° C., at least about 150° C.; or at least about 150° C.

8. The passivating formulation of claim 2, wherein the formulation comprises:

a) the at least one second curable, functionalized polyimide; and b) an effective amount of the at least one first curable, functionalized, flexible polyimide, wherein the effective amount is sufficient to effect UV-curing of the formulation.

9. The passivating formulation of claim 2, wherein a cured aliquot of the passivating formulation has a Tg measured by TMA of at least about 90° C., at least about 100° C., at least about 110° C., or at least about 120° C.

10. The passivating formulation of claim 1, further comprising:

a) at least one reactive diluent or co-curing agent;
b) at least one adhesion promoter;
c) at least one coupling agent;
d) at least one UV initiator;
e) at least one solvent, or
f) any combination thereof.

11. The passivating formulation of claim 10, wherein the formulation comprises:

a) the at least one first curable, functionalized polyimide and the at least one second curable functionalized polyimide;
b) at least one reactive diluent;
c) at least one coupling agent, adhesion promoter or a combination thereof, and
d) at least one curing initiator.

12. The passivating formulation of claim 11, wherein the at least one first curable, functionalized polyimide and the at least one second curable functionalized polyimide comprise about 65 wt % to about 80 wt % of the composition.

13. The passivating formulation of claim 11, wherein the curing initiator comprises a UV initiator.

14. The passivating formulation of claim 11, wherein the at least one reactive diluent is selected from the group consisting of acrylates, methacrylates, acrylamides, methacrylamides, maleimides, vinyl ethers, vinyl esters, styrenic compounds, allyl functional compounds, epoxies, epoxy curatives, olefins, ethoxylated trimethylolpropane triacrylate, tricyclodecane dimethanol diacrylate, tris(2-acryloxyethyl)isocyanurate, ethoxylated trimethylolpropane triacrylate, tricyclodecane dimethanol diacrylate, and combinations thereof.

15. The passivating formulation of claim 11, wherein the at least one reactive diluent comprises about 10 wt % to about 30 wt % of the formulation.

16. The passivating formulation of claim 11, wherein the at least one reactive diluent has a $T_g$ measured by TMA greater than about 100° C., greater than about 120° C., greater than about 150° C., greater than about 180° C. or greater than about 200° C.

17. The passivating formulation of claim 11, wherein the at least one coupling agent comprises about 2 wt % of the formulation.

18. The passivating formulation of claim 11, wherein the at least one coupling agent comprises a silane coupling agent selected from the group consisting of epoxy functionalized silane coupling agents, amino functionalized silane coupling agents and combinations thereof or from the group consisting of 2-(3,4 epoxycyclohexyl) ethyltrimethoxysilane, N-phenyl-3-aminopropyltrimethoxysilane, and combinations thereof.

* * * * *